(12) United States Patent
Koezuka et al.

(10) Patent No.: US 10,749,015 B2
(45) Date of Patent: Aug. 18, 2020

(54) SEMICONDUCTOR DEVICE AND METHOD FOR MANUFACTURING THE SAME

(71) Applicant: Semiconductor Energy Laboratory Co., Ltd., Atsuhgi-shi, Kanagawa-ken (JP)

(72) Inventors: Junichi Koezuka, Tochigi (JP); Yukinori Shima, Gunma (JP); Hajime Tokunaga, Kanagawa (JP); Toshinari Sasaki, Tokyo (JP); Keisuke Murayama, Kanagawa (JP); Daisuke Matsubayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/429,176

(22) Filed: Jun. 3, 2019

(65) Prior Publication Data

US 2019/0288093 A1 Sep. 19, 2019

Related U.S. Application Data

(60) Continuation of application No. 15/150,587, filed on May 10, 2016, now Pat. No. 10,361,291, which is a
(Continued)

(30) Foreign Application Priority Data

Oct. 24, 2012 (JP) .................................. 2012-234602
Oct. 24, 2012 (JP) .................................. 2012-234606
(Continued)

(51) Int. Cl.
*H01L 29/66* (2006.01)
*H01L 21/02* (2006.01)
(Continued)

(52) U.S. Cl.
CPC ...... *H01L 29/66969* (2013.01); *H01L 21/022* (2013.01); *H01L 21/02263* (2013.01);
(Continued)

(58) Field of Classification Search
CPC ......... H01L 21/02164; H01L 21/02472; H01L 29/66969; H01L 29/513; H01L 29/78609; H01L 29/7869; H01L 27/1225
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 101652842 A 2/2010
EP 1737044 A 12/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Dale E Page
*Assistant Examiner* — Quovaunda Jefferson
(74) *Attorney, Agent, or Firm* — Fish & Richardson P.C.

(57) ABSTRACT

To reduce defects in an oxide semiconductor film in a semiconductor device. To improve the electrical characteristics and the reliability of a semiconductor device including an oxide semiconductor film. In a semiconductor device including a transistor including a gate electrode formed over a substrate, a gate insulating film covering the gate electrode, a multilayer film overlapping with the gate electrode
(Continued)

with the gate insulating film provided therebetween, and a pair of electrodes in contact with the multilayer film, a first oxide insulating film covering the transistor, and a second oxide insulating film formed over the first oxide insulating film, the multilayer film includes an oxide semiconductor film and an oxide film containing In or Ga, the first oxide insulating film is an oxide insulating film through which oxygen is permeated, and the second oxide insulating film is an oxide insulating film containing more oxygen than that in the stoichiometric composition.

14 Claims, 54 Drawing Sheets

Related U.S. Application Data division of application No. 14/060,925, filed on Oct. 23, 2013, now Pat. No. 9,349,869.

(30) Foreign Application Priority Data

Dec. 28, 2012 (JP) ................................ 2012-286826
Mar. 14, 2013 (JP) ................................ 2013-051659

(51) Int. Cl.
*H01L 29/51* (2006.01)
*H01L 29/786* (2006.01)
*H01L 27/12* (2006.01)

(52) U.S. Cl.
CPC ........ *H01L 27/1225* (2013.01); *H01L 29/513* (2013.01); *H01L 29/7869* (2013.01); *H01L 29/78609* (2013.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,372,761 B2 | 2/2013 | Kabe et al. |
| 8,426,868 B2 | 4/2013 | Akimoto et al. |
| 8,440,510 B2 | 5/2013 | Yamazaki |
| 8,629,438 B2 | 1/2014 | Yamazaki |
| 8,692,252 B2 | 4/2014 | Takata et al. |
| 8,796,683 B2 | 8/2014 | Yamazaki |
| 8,878,173 B2 | 11/2014 | Yamazaki |
| 8,895,375 B2 | 11/2014 | Takemura |
| 8,906,737 B2 | 12/2014 | Ishizuka et al. |
| 8,912,537 B2 | 12/2014 | Wakana et al. |
| 9,048,324 B2 * | 6/2015 | Miyamoto ............ H01L 29/495 |
| 9,142,648 B2 | 9/2015 | Yamazaki |
| 9,166,061 B2 | 10/2015 | Yamazaki |
| 9,252,103 B2 | 2/2016 | Ishizuka et al. |
| 9,412,874 B2 | 8/2016 | Miyamoto et al. |
| 9,449,991 B2 | 9/2016 | Yamazaki |
| 9,559,213 B2 | 1/2017 | Yamazaki |
| 9,601,602 B2 | 3/2017 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0094611 A1 | 5/2003 | Hayakawa |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishilh |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042138 A1 | 2/2008 | Park et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0026509 A1 | 1/2009 | Hayashi et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |

(56) References Cited

U.S. PATENT DOCUMENTS

| | | | |
|---|---|---|---|
| 2010/0109002 | A1 | 5/2010 | Itagaki et al. |
| 2010/0136797 | A1 | 6/2010 | Kabe et al. |
| 2011/0284848 | A1 | 11/2011 | Yamazaki |
| 2011/0309411 | A1 | 12/2011 | Takemura |
| 2012/0032163 | A1 | 2/2012 | Yamazaki |
| 2012/0146713 | A1 | 6/2012 | Kim et al. |
| 2012/0261657 | A1 | 10/2012 | Takahashi et al. |
| 2013/0277676 | A1* | 10/2013 | Yamazaki ......... H01L 29/78693 257/57 |
| 2014/0110707 | A1 | 4/2014 | Koezuka et al. |
| 2014/0110708 | A1 | 4/2014 | Koezuka et al. |
| 2015/0072471 | A1 | 3/2015 | Takemura |
| 2015/0108467 | A1 | 4/2015 | Moriguchi et al. |
| 2016/0315178 | A1 | 10/2016 | Miyamoto et al. |
| 2017/0179162 | A1 | 6/2017 | Moriguchi et al. |

FOREIGN PATENT DOCUMENTS

| | | | |
|---|---|---|---|
| EP | 2226847 | A | 9/2010 |
| EP | 2657974 | A | 10/2013 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2007-096055 | A | 4/2007 |
| JP | 2007-123861 | A | 5/2007 |
| JP | 2011-124360 | A | 6/2011 |
| JP | 2011-258939 | A | 12/2011 |
| JP | 2012-009843 | A | 1/2012 |
| JP | 2012-015496 | A | 1/2012 |
| JP | 2012-023356 | A | 2/2012 |
| JP | 2012-033908 | A | 2/2012 |
| JP | 2012-059860 | A | 3/2012 |
| KR | 2012-0022614 | A | 3/2012 |
| WO | WO-2004/114391 | | 12/2004 |
| WO | WO-2011/132769 | | 10/2011 |
| WO | WO-2011/142467 | | 11/2011 |
| WO | WO-2011/158704 | | 12/2011 |
| WO | WO-2012/002292 | | 1/2012 |
| WO | WO-2012/063614 | | 5/2012 |
| WO | WO-2012/086513 | | 6/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for The Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of The Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05 : Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198- 200, pp. 165-169.
Hosono.H, "68.3:Invited Paper:Transparent Amorphous Oxide Semiconductors for High Performance TFT", SID Digest '07 : SID International Sympoium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in The In2O3 and Sc2O3—A2O3—Bo Systems [A; Fe, Ga, or Al; B: Mg, Mn, Fe, Ni, Cu, or Zn] at Temperatures Over 1000 ° C.", Journal of Solid State Chemistry, 1985, vol. 60, pp. 382-384.

Kimizuka.N et al., "Syntheses and Single-Crystal Data of Homologous Compounds, In2O3(ZnO)m (m =3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 5, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLDES", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passication Layer", SID Digest '09 : SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TDTs", IDW '09 : Proceedings of The 16th International Display Workshops, 2009, pp. 689-692.

Son.K et al., "42.4L: Late-News Paper: 4 Inch QVGA AMOLED Driven by the Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IgZo Transparent Amorphous Oxide Semiconductor", IDW '08 : Proceedings of The 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of The 19th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Chinese Office Action (Application No. 201310511688.5) dated Jul. 19, 2017.

* cited by examiner

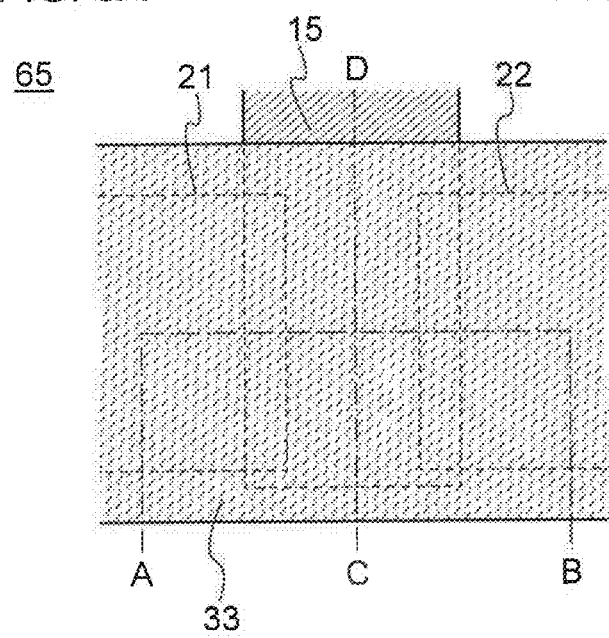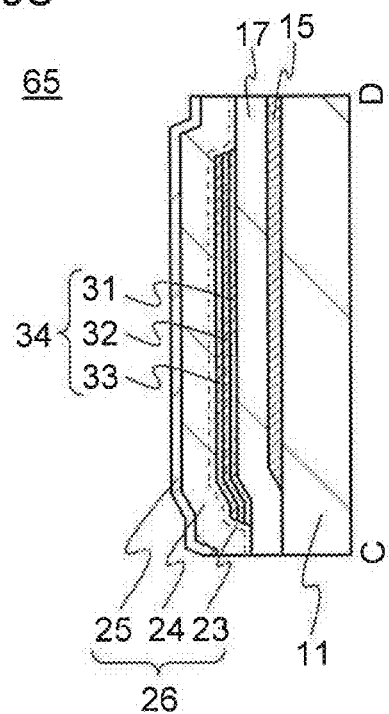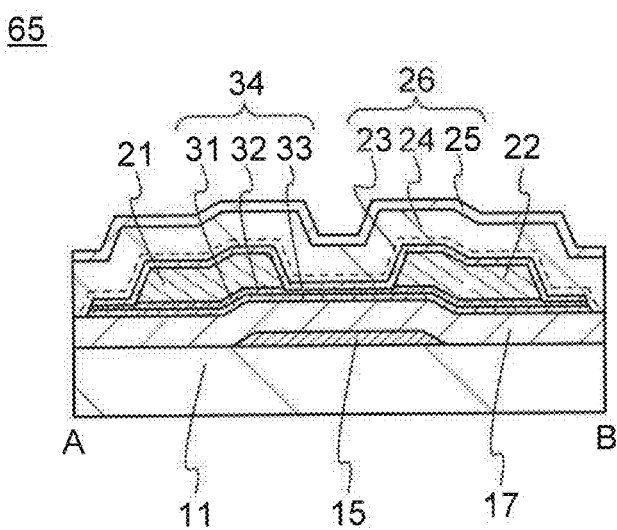

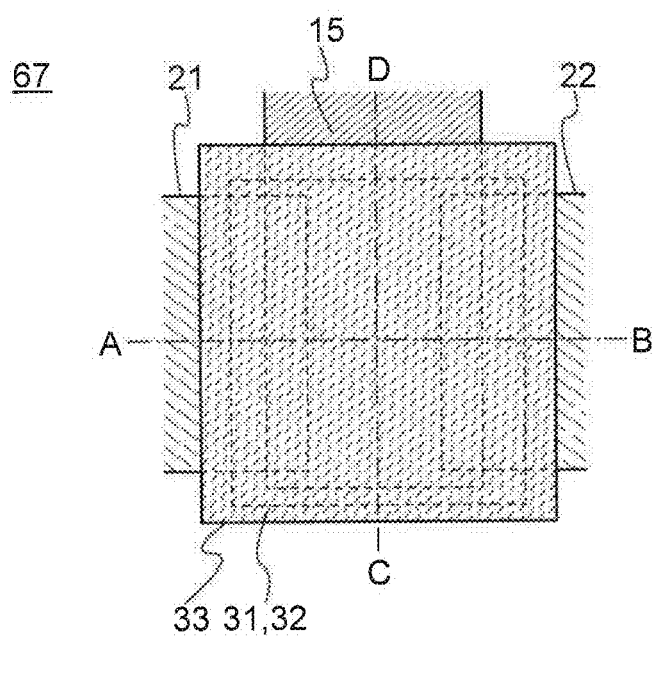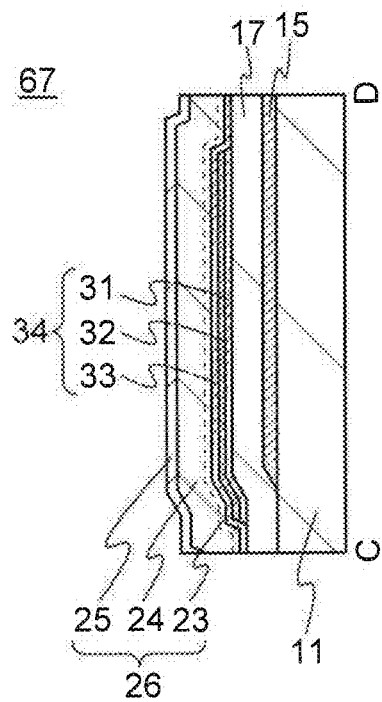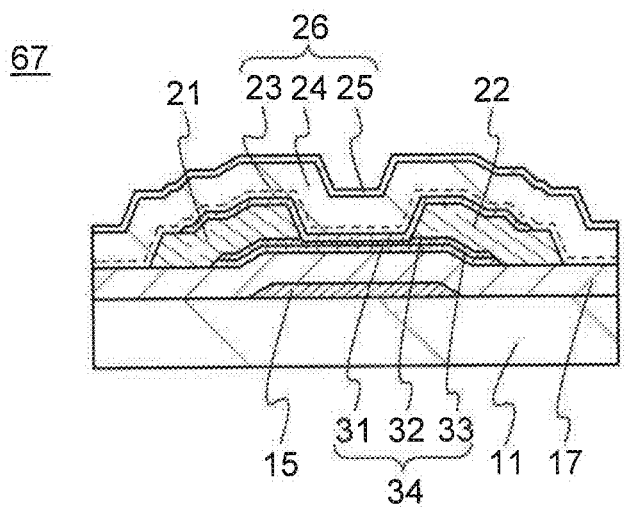

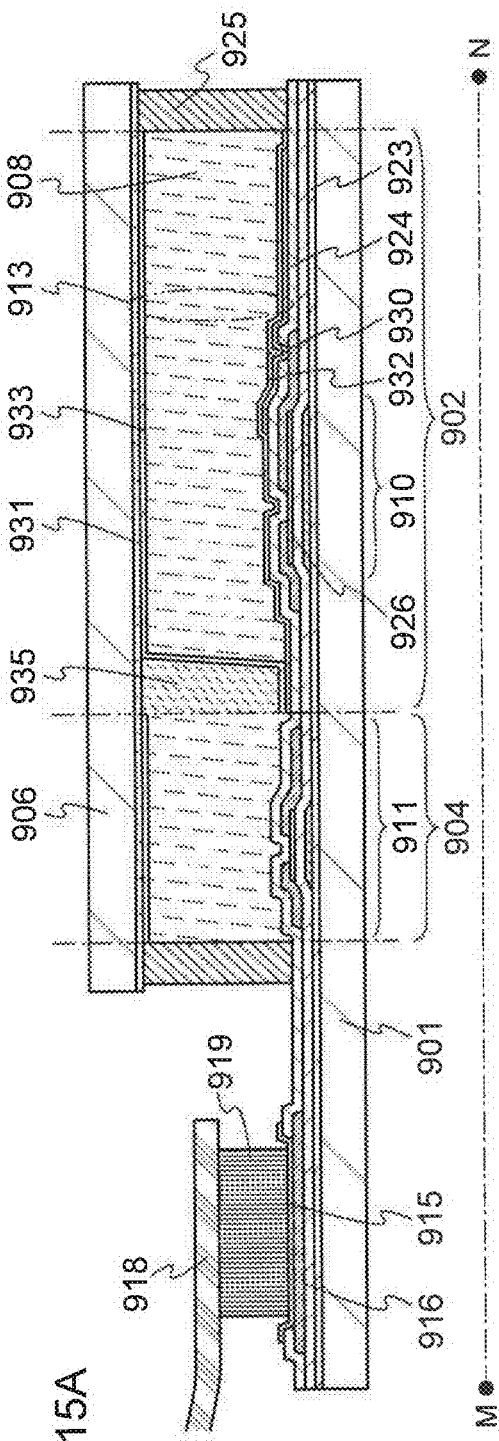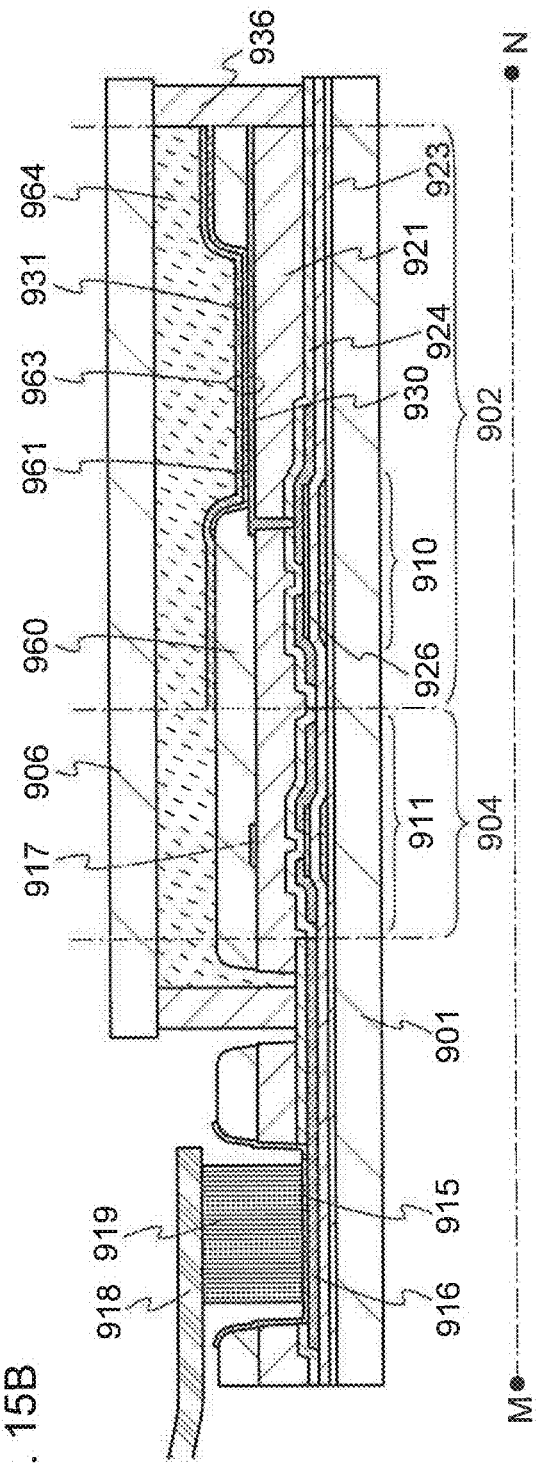

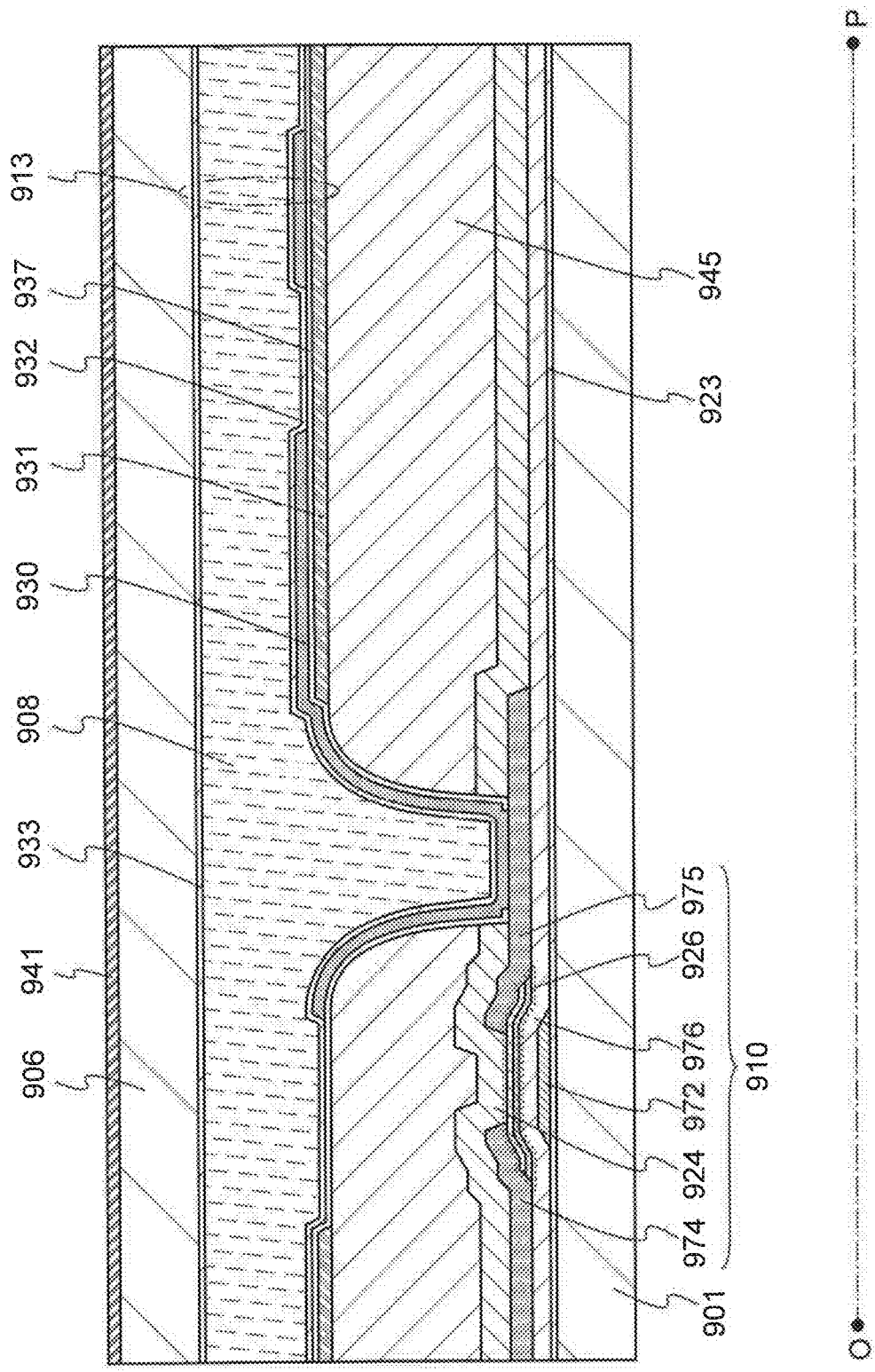

SEMICONDUCTOR DEVICE AND METHOD FOR MANUFACTURING THE SAME

CROSS-REFERENCE TO RELATED APPLICATIONS

This application is a continuation of U.S. application Ser. No. 15/150,587, filed May 10, 2016, now allowed, which is a divisional of U.S. application Ser. No. 14/060,925, filed Oct. 23, 2013, now U.S. Pat. No. 9,349,869, which claims the benefit of foreign priority applications filed in Japan as Serial No. 2012-234602, on Oct. 24, 2012, Serial No. 2012-234606, on Oct. 24, 2012, Serial No. 2012-286826, on Dec. 28, 2012 and Serial No. 2013-051659, on Mar. 14, 2013, all of which are incorporated by reference.

BACKGROUND OF THE INVENTION

1. Field of the Invention

The present invention relates to an object, a method, or a manufacturing method. Further, the present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to, for example, a semiconductor device including an oxide semiconductor, a display device including an oxide semiconductor, or a light-emitting device including an oxide semiconductor. In particular, the present invention relates to, for example, a semiconductor device including a transistor and a method for manufacturing the semiconductor device.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

REFERENCE

Patent Documents

[Patent Document 1] Japanese Published Patent Application No. 2007-123861
[Patent Document 2] Japanese Published Patent Application No. 2007-96055

SUMMARY OF THE INVENTION

In a transistor using an oxide semiconductor film, a large number of oxygen vacancies in the oxide semiconductor film cause poor electrical characteristics of the transistor and cause an increase in the amount of change in electrical characteristics of the transistor, typically the threshold voltage due to a change over time or a stress test (e.g., a bias-temperature (BT) stress test).

Thus, an object of one embodiment of the present invention is to reduce defects in an oxide semiconductor film of a semiconductor device or the like including the oxide semiconductor film. Another object of one embodiment of the present invention is to improve electrical characteristics of a semiconductor device or the like including an oxide semiconductor film. Another object of one embodiment of the present invention is to improve reliability of a semiconductor device or the like including an oxide semiconductor film. Another object of one embodiment of the present invention is to provide a semiconductor device or the like with low off-state current. Another object of one embodiment of the present invention is to provide a semiconductor device or the like with low power consumption. Another object of one embodiment of the present invention is to provide a display device or the like capable of causing less eyestrain. Another object of one embodiment of the present invention is to provide a semiconductor device or the like including a transparent semiconductor film. Another object of one embodiment of the present invention is to provide a novel semiconductor device or the like. Another object of one embodiment of the present invention is to provide a semiconductor device or the like having excellent characteristics. Note that the descriptions of these objects do not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

One embodiment of the present invention is a semiconductor device including a transistor including a gate electrode formed over a substrate, a gate insulating film covering the gate electrode, a multilayer film overlapping with the gate electrode with the gate insulating film provided therebetween, and a pair of electrodes in contact with the multilayer film, a first oxide insulating film covering the transistor, and a second oxide insulating film formed over the first oxide insulating film. In the semiconductor device, the multilayer film includes an oxide semiconductor film and an oxide film containing In or Ga, the first oxide insulating film is an oxide insulating film through which oxygen is permeated, the second oxide insulating film is an oxide insulating film containing more oxygen than that in the stoichiometric composition, and the transistor has characteristics in which, by a bias-temperature stress test, threshold voltage does not change or changes in a positive direction or a negative direction and the amount of the change in a negative direction or a positive direction is less than or equal to 1.0 V, preferably less than or equal to 0.5 V.

Note that the oxide semiconductor film preferably contains In or Ga.

Further, the energy of the conduction band bottom of the oxide film containing In or Ga is closer to the vacuum level than the energy of the conduction band bottom of the oxide semiconductor film is. Furthermore, the difference between the energy of the conduction band bottom of the oxide film containing In or Ga and the energy of the conduction band bottom of the oxide semiconductor film is preferably greater than or equal to 0.05 eV and less than or equal to 2 eV. Note that an energy difference between the vacuum level and the conduction band bottom is also referred to as an electron affinity. Thus, it is preferable that the electron affinity of the oxide film containing In or Ga be less than the electron affinity of the oxide semiconductor film and the difference be greater than or equal to 0.05 eV and less than or equal to 2 eV.

Further, it is preferable that each of the oxide semiconductor film and the oxide film containing In or Ga be an In-M-Zn oxide (M represents Al, Ti, Ga, Y, Zr, La, Ce, Nd, or Hf) film and the proportion of M atoms in the oxide film containing In or Ga be higher than that in the oxide semiconductor film.

Further, it is preferable that, in the multilayer film, an absorption coefficient derived from a constant photocurrent method (CPM) be lower than $1 \times 10^{-3}$/cm.

Further, it is preferable that the silicon concentration and the carbon concentration between the oxide semiconductor film and the oxide film containing In or Ga be lower than $2 \times 10^{18}$ atoms/cm$^3$.

Another embodiment of the present invention is a method for manufacturing a semiconductor device, including the steps of forming a gate electrode and a gate insulating film, forming, over the gate insulating film, a multilayer film including an oxide semiconductor film and an oxide film containing In or Ga, forming a pair of electrodes in contact with the multilayer film, forming a first oxide insulating film over the multilayer film and the pair of electrodes, and forming a second oxide insulating film over the first oxide insulating film. In the method, a substrate placed in a treatment chamber which is vacuum-evacuated is held at a temperature higher than or equal to 180° C. and lower than or equal to 400° C., pressure in the treatment chamber is set to be greater than or equal to 20 Pa and less than or equal to 250 Pa with introduction of a source gas into the treatment chamber, and a high-frequency power is supplied to an electrode provided in the treatment chamber to form the first oxide insulating film. In addition, the substrate placed in a treatment chamber which is vacuum-evacuated is held at a temperature higher than or equal to 180° C. and lower than or equal to 260° C., pressure in the treatment chamber is set to be greater than or equal to 100 Pa and less than or equal to 250 Pa with introduction of a source gas into the treatment chamber, and a high-frequency power higher than or equal to 0.17 W/cm$^2$ and lower than or equal to 0.5 W/cm$^2$ is supplied to the electrode provided in the treatment chamber to form the second oxide insulating film.

In accordance with one embodiment of the present invention, defects in an oxide semiconductor film of a semiconductor device including the oxide semiconductor film can be reduced. Further, in accordance with one embodiment of the present invention, the electrical characteristics of a semiconductor device including an oxide semiconductor film can be improved. Further, in accordance with one embodiment of the present invention, reliability of a semiconductor device or the like including an oxide semiconductor film can be improved. Further, in accordance with one embodiment of the present invention, a semiconductor device or the like with low off-state current can be provided. Further, in accordance with one embodiment of the present invention, a semiconductor device or the like with low power consumption can be provided. Further, in accordance with one embodiment of the present invention, a display device or the like capable of causing less eyestrain can be provided. Further, in accordance with one embodiment of the present invention, a semiconductor device or the like including a transparent semiconductor film can be provided. Further, in accordance with one embodiment of the present invention, a novel semiconductor device or the like can be provided. Further, in accordance with one embodiment of the present invention, a semiconductor device or the like having excellent characteristics can be provided.

BRIEF DESCRIPTION OF THE DRAWINGS

FIGS. 8A to 8C are a top view and cross-sectional views illustrating one embodiment of a transistor.

FIGS. 12A to 12C are a top view and cross-sectional views illustrating one embodiment of a transistor.

FIGS. 15A and 15B are cross-sectional views each illustrating one embodiment of a semiconductor device.

FIG. 17 is a cross-sectional view illustrating one embodiment of a semiconductor device.

DETAILED DESCRIPTION OF THE INVENTION

Figure 1A:
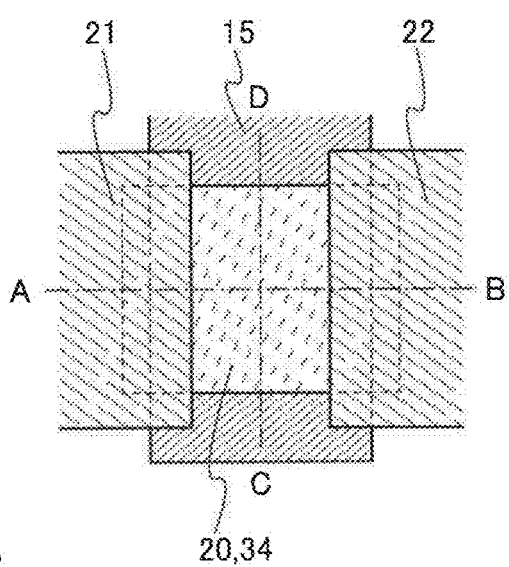
FIGS. 1A to 1D are a top view and cross-sectional views illustrating one embodiment of a transistor, and a graph illustrating Vg-Id characteristics of the transistor.

Embodiments of the present invention will be described in detail below with reference to the accompanying drawings. Note that the present invention is not limited to the following description and it is easily understood by those skilled in the art that the mode and details can be variously changed without departing from the scope and spirit of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each structure is exaggerated for clarity in some cases and thus the actual scale is not necessarily limited to the illustrated scale.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a potential difference between two points, and a potential refers to electrostatic energy (electric potential energy) of unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed after the etching step.

Embodiment 1

In this embodiment, a semiconductor device which is one embodiment of the present invention and a manufacturing method thereof are described with reference to drawings.

In a transistor including an oxide semiconductor film, oxygen vacancies are given as an example of a defect which leads to poor electrical characteristics of the transistor. For example, the threshold voltage of a transistor including an oxide semiconductor film which contains oxygen vacancies in the film easily shifts in the negative direction, and such a transistor tends to have normally-on characteristics. This is because electric charges are generated owing to oxygen vacancies in the oxide semiconductor film and the resistance is thus reduced. The transistor having normally-on characteristics causes various problems in that malfunction is likely to be caused when in operation and that power consumption is increased when not in operation, for example. Further, there is a problem in that the amount of change in electrical characteristics, typically in threshold voltage, of the transistor is increased by change over time or a stress test.

One of the factors in generating oxygen vacancies is damage caused in a manufacturing process of a transistor. For example, when an insulating film or the like is formed over an oxide semiconductor film by a plasma CVD method, the oxide semiconductor film might be damaged depending on formation conditions thereof.

Further, not only oxygen vacancies but also impurities such as silicon or carbon which is a constituent element of the insulating film cause poor electrical characteristics of a transistor. Therefore, there is a problem in that mixing of the impurities into an oxide semiconductor film reduces the resistance of the oxide semiconductor film and the amount of change in electrical characteristics, typically in threshold voltage, of the transistor is increased by change over time or a stress test.

Thus, an object of this embodiment is to reduce oxygen vacancies in an oxide semiconductor film having a channel region and the concentration of impurities in the oxide semiconductor film, in a semiconductor device including a transistor having the oxide semiconductor film.

Figure 1C:
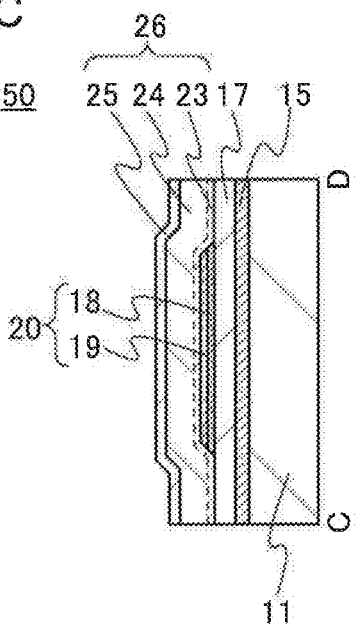
Figure 1B:
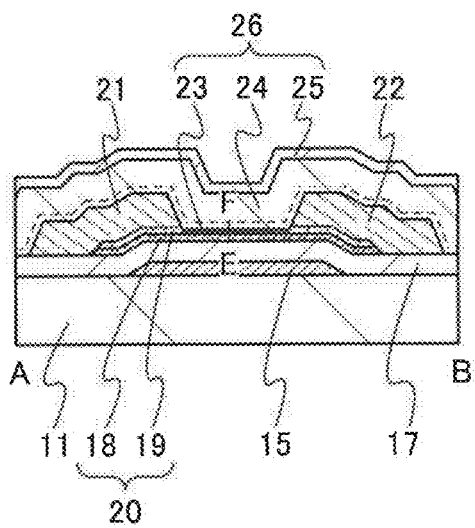

A top view and cross-sectional views of a transistor 50 included in a semiconductor device are shown in FIGS. 1A to 1C. FIG. 1A is a top view of the transistor 50, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, a gate insulating film 17, an oxide insulating film 23, an oxide insulating film 24, a nitride insulating film 25, and the like are omitted for simplicity.

The transistor 50 shown in FIGS. 1B and 1C includes a gate electrode 15 provided over the substrate 11. Further, the gate insulating film 17 is formed over the substrate 11 and the gate electrode 15, and a multilayer film 20 overlapping with the gate electrode 15 with the gate insulating film 17 provided therebetween, and a pair of electrodes 21 and 22 in contact with the multilayer film 20 are included. Furthermore, a protective film 26 including the oxide insulating film 23, the oxide insulating film 24, and the nitride insulating film 25 is formed over the gate insulating film 17, the multilayer film 20, and the pair of electrodes 21 and 22.

In the transistor 50 described in this embodiment, the multilayer film 20 includes an oxide semiconductor film 18 and an oxide film 19 containing In or Ga. Further, part of the oxide semiconductor film 18 serves as a channel region. Furthermore, the oxide insulating film 23 is formed in contact with the multilayer film 20, and the oxide insulating film 24 is formed in contact with the oxide insulating film 23. That is, the oxide film 19 containing In or Ga is provided between the oxide semiconductor film 18 and the oxide insulating film 23.

The oxide semiconductor film 18 is typically In—Ga oxide film, In—Zn oxide film, or In-M-Zn oxide film (M represents Al, Ti, Ga, Y, Zr, La, Ce, Nd, or Hf).

Note that when the oxide semiconductor film 18 is In-M-Zn oxide film, the atomic ratio of In to M is preferably as follows: the proportion of In atoms be higher than or equal to 25 atomic % and the proportion of M atoms be lower than 75 atomic %, and it is further preferably as follows: the proportion of In atoms be higher than or equal to 34 atomic % and the proportion of M atoms be lower than 66 atomic %.

The energy gap of the oxide semiconductor film 18 is 2 eV or more, preferably 2.5 eV or more, more preferably 3 eV or more. With the use of an oxide semiconductor having such a wide energy gap, the off-state current of the transistor 50 can be reduced.

The thickness of the oxide semiconductor film 18 is greater than or equal to 3 nm and less than or equal to 200 nm, preferably greater than or equal to 3 nm and less than or equal to 100 nm, more preferably greater than or equal to 3 nm and less than or equal to 50 nm.

The oxide film 19 containing In or Ga is typically In—Ga oxide film, In—Zn oxide film, or In-M-Zn oxide film (M represents Al, Ti, Ga, Y, Zr, La, Ce, Nd, or Hf). The energy at the conduction band bottom thereof is closer to a vacuum level than that of the oxide semiconductor film 18 is, and typically, the difference between the energy at the conduction band bottom of the oxide film 19 containing In or Ga and the energy at the conduction band bottom of the oxide semiconductor film 18 is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 19 containing In or Ga and the electron affinity of the oxide semiconductor film 18 is any one of 0.05 eV or more, 0.07 eV or more, 0.1 eV or more, and 0.15 eV or more, and any one of 2 eV or less, 1 eV or less, 0.5 eV or less, and 0.4 eV or less.

When the oxide film 19 containing In or Ga is In-M-Zn oxide film, the atomic ratio of In to M is preferably as follows: the proportion of In atoms be lower than 50 atomic % and the proportion of M atoms be higher than or equal to 50 atomic %, and it is further preferably as follows: the proportion of In atoms be lower than 25 atomic % and the proportion of M atoms be higher than or equal to 75 atomic %.

Further, in the case where each of the oxide semiconductor film 18 and the oxide film 19 containing In or Ga is In-M-Zn oxide film (M represents Al, Ti, Ga, Y, Zr, La, Ce, Nd, or Hf), the proportion of M atoms (M represents Al, Ti, Ga, Y, Zr, La, Ce, Nd, or Hf) in the oxide film 19 containing In or Ga is higher than that in the oxide semiconductor film 18. Typically, the proportion of M in each of the films is 1.5 or more times, preferably twice or more, more preferably three or more times as high as that in the oxide semiconductor film 18.

Furthermore, in the case where each of the oxide semiconductor film 18 and the oxide film 19 containing In or Ga is In-M-Zn-based oxide film (M represents Al, Ti, Ga, Y, Zr, La, Ce, Nd, or Hf), when In:M:Zn=$x_1$:$y_1$:$z_1$ [atomic ratio] is satisfied in the oxide film 19 containing In or Ga and In:M:Zn=$x_2$:$y_2$:$z_2$ [atomic ratio] is satisfied in the oxide semiconductor film 18, $y_1/x_1$ is higher than $y_2/x_2$. It is preferable that $y_1/x_1$ be 1.5 or more times as high as $y_2/x_2$. It is further preferable that $y_1/x_1$ be twice or more as high as $y_2/x_2$. It is still further preferable that $y_1/x_1$ be three or more times as high as $y_2/x_2$. In this case, it is preferable that in the oxide semiconductor film, $y_2$ be higher than or equal to $x_2$ because a transistor including the oxide semiconductor film can have stable electric characteristics. However, when $y_2$ is larger than or equal to three or more times $x_2$, the field-effect mobility of the transistor including the oxide semiconductor film is reduced. Thus, it is preferable that $y_2$ be lower than three times $x_2$.

In the case where the oxide semiconductor film 18 is In-M-Zn oxide film (M represents Al, Ti, Ga, Y, Zr, La, Ce, Nd, or Hf), it is preferable that the atomic ratio of metal elements of a sputtering target used for forming a film of the In-M-Zn oxide film satisfy In≥M and Zn≥M. As the atomic ratio of metal elements of such a sputtering target, In:M:Zn=1:1:1 and In:M:Zn=3:1:2 are preferable. Further, in the case where the oxide film 19 containing In or Ga is In-M-Zn oxide film (M represents Al, Ti, Ga, Y, Zr, La, Ce, Nd, or Hf), the atomic ratio of metal elements of a sputtering target used for forming a film of the In-M-Zn oxide film preferably satisfies M>In and Zn>0.5×M, and more preferably, Zn also satisfies Zn>M. As the atomic ratio of metal elements of such a sputtering target, In:Ga:Zn=1:3:2, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:6:4, In:Ga:Zn=1:6:5, In:Ga:Zn=1:6:6, In:Ga:Zn=1:6:7, In:Ga:Zn=1:6:8, In:Ga:Zn=1:6:9, and In:Ga:Zn=1:6:10 are preferable. Note that the proportion of each metal element in the atomic ratio of each of the oxide semiconductor film 18 and the oxide film 19 containing In or Ga formed using the above-described sputtering target varies within a range of ±20% as an error.

An oxide semiconductor film with low carrier density is used for the oxide semiconductor film 18 and the oxide film 19 containing In or Ga. For example, an oxide semiconductor film whose carrier density is $1\times10^{17}/cm^3$ or lower, preferably $1\times10^{15}/cm^3$ or lower, more preferably $1\times10^{13}/cm^3$ or lower, much more preferably $1\times10^{11}/cm^3$ or lower is used for the oxide semiconductor film 18 and the oxide film 19 containing In or Ga.

Note that, without limitation to those described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 18 be set to be appropriate.

The oxide film 19 containing In or Ga also serves as a film which relieves damage to the oxide semiconductor film 18 at the time of forming the oxide insulating film 24 later.

The thickness of the oxide film 19 containing In or Ga is greater than or equal to 3 nm and less than or equal to 100 nm, preferably greater than or equal to 3 nm and less than or equal to 50 nm.

When silicon or carbon, which is one of elements belonging to Group 14, is contained in the oxide semiconductor film 18, the number of oxygen vacancies is increased, and the oxide semiconductor film 18 becomes an n-type film. Thus, the concentration of silicon or carbon in the oxide semiconductor film 18 or the concentration of silicon or carbon in the vicinity of an interface between the oxide film 19 containing In or Ga and the oxide semiconductor film 18 is adjusted to be lower than or equal to $2\times10^{18}$ atoms/cm$^3$, preferably lower than or equal to $2\times10^{17}$ atoms/cm$^3$.

Further, the crystal structure of each of the oxide semiconductor film 18 and the oxide film 19 containing In or Ga may be an amorphous structure, a single-crystal structure, a polycrystalline structure, or a c-axis aligned crystalline oxide semiconductor (CAAC-OS) which is described later. Note that when the crystal structure of at least the oxide semiconductor film 18 is CAAC-OS, the amount of change in electrical characteristics due to irradiation with visible light or ultraviolet light can be further reduced.

Furthermore, in the transistor 50 described in this embodiment, the oxide insulating film 23 is formed in contact with the multilayer film 20, and the oxide insulating film 24 in contact with the oxide insulating film 23 is formed.

The oxide insulating film 23 is an oxide insulating film through which oxygen is permeated. Note that the oxide insulating film 23 also serves as a film which relieves damage to the multilayer film 20 at the time of forming the oxide insulating film 24 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23. Note that in this specification, a "silicon oxynitride film" refers to a film that includes more oxygen than nitrogen, and a "silicon nitride oxide film" refers to a film that includes more nitrogen than oxygen.

Further, it is preferable that the number of defects in the oxide insulating film 23 be small, typically the spin density of a signal which appears at g=2.001 due to a dangling bond of silicon, be lower than or equal to $3\times10^{17}$ spins/cm$^3$ by ESR measurement. This is because if the density of defects in the oxide insulating film 23 is high, oxygen is bonded to the defects and the amount of oxygen that passes through the oxide insulating film 23 is decreased.

Further, it is preferable that the number of defects at the interface between the oxide insulating film 23 and the multilayer film 20 be small, typically the spin density of a signal which appears at g=1.93 due to a defect in the multilayer film 20 be lower than or equal to $1\times10^{17}$ spins/cm$^3$, more preferably lower than or equal to the lower limit of detection by ESR measurement.

Note that in the oxide insulating film 23, all oxygen entering the oxide insulating film 23 from the outside does not move to the outside of the oxide insulating film 23 and some oxygen remains in the oxide insulating film 23. Further, movement of oxygen occurs in the oxide insulating film 23 in some cases in such a manner that oxygen enters the oxide insulating film 23 and oxygen contained in the oxide insulating film 23 is moved to the outside of the oxide insulating film 23.

When the oxide insulating film through which oxygen is permeated is formed as the oxide insulating film 23, oxygen released from the oxide insulating film 24 provided over the oxide insulating film 23 can be moved to the oxide semiconductor film 18 through the oxide insulating film 23.

The oxide insulating film 24 is formed in contact with the oxide insulating film 23. The oxide insulating film 24 is an oxide insulating film containing more oxygen than that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 24.

Further, it is preferable that the number of defects in the oxide insulating film 24 be small, typically the spin density of a signal which appears at g=2.001 due to a dangling bond of silicon, be lower than $1.5\times10^{18}$ spins/cm$^3$, more preferably lower than or equal to $1\times10^{18}$ spins/cm$^3$ by ESR measurement. Note that the oxide insulating film 24 is provided more apart from the multilayer film 20 than the oxide insulating film 23 is; thus, the oxide insulating film 24 may have higher defect density than the oxide insulating film 23.

Here, the band structure along dashed-dotted line E-F in the vicinity of the multilayer film 20 of FIG. 1B is described with reference to FIG. 2A, and the flow of carrier in the transistor 50 is described with reference to FIGS. 2B and 2C.

Figure 2A:
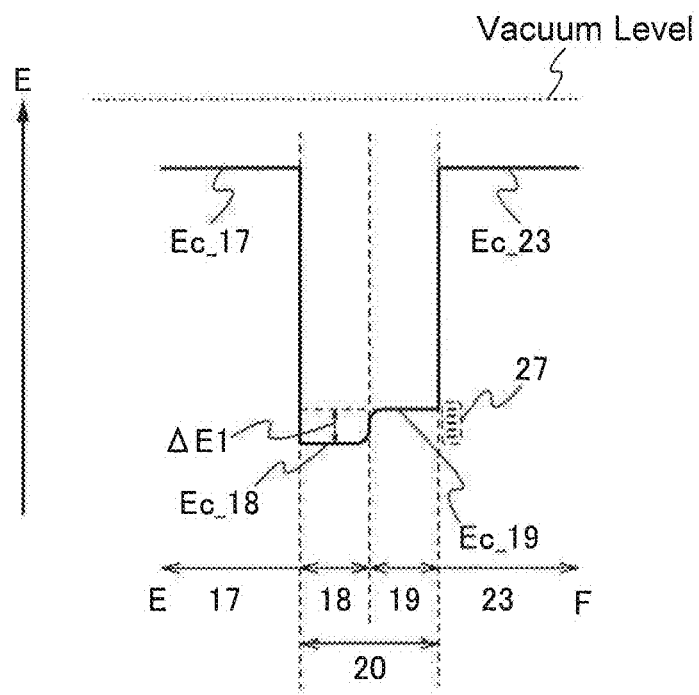
FIGS. 2A to 2C are diagrams illustrating the band structure of a transistor.
Figure 2B:
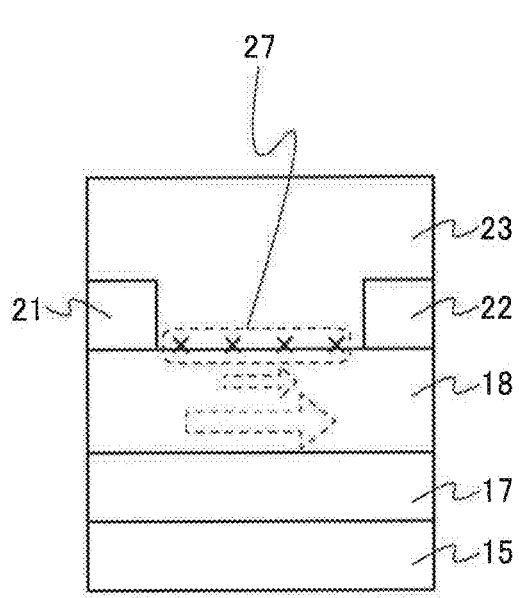

In the band structure shown in FIG. 2A, for example, In—Ga—Zn oxide (the atomic ratio of a sputtering target used for film formation is In:Ga:Zn=1:1:1) with an energy gap of 3.15 eV is used for the oxide semiconductor film 18.

In—Ga—Zn oxide (the atomic ratio of a sputtering target used for film formation is In:Ga:Zn=1:3:2) with an energy gap of 3.5 eV is used for the oxide film 19 containing In or Ga. Note that the energy gap can be measured using a spectroscopic ellipsometer.

The energy difference between the vacuum level and the valence band top (also referred to as ionization potential) of the oxide semiconductor film 18 and the energy difference therebetween of the oxide film 19 containing In or Ga are 7.9 eV and 8.0 eV, respectively. Note that the energy difference between the vacuum level and the valence band top can be measured using an ultraviolet photoelectron spectroscopy (UPS) device (VersaProbe manufactured by ULVAC-PHI, Inc.).

The energy difference between the vacuum level and the conduction band bottom (also referred to as electron affinity) of the oxide semiconductor film 18 and the energy difference therebetween of the oxide film 19 containing In or Ga are 4.7 eV and 4.5 eV, respectively.

Further, the conduction band bottom of the oxide semiconductor film 18 is denoted by Ec_18, and the conduction band bottom of the oxide film 19 containing In or Ga is denoted by Ec_19. Further, the conduction band bottom of the gate insulating film 17 is denoted by Ec_17, and the conduction band bottom of the oxide insulating film 23 is denoted by Ec_23.

As shown in FIG. 2A, in the multilayer film 20, the conduction band bottom in the vicinity of the interface between the oxide semiconductor film 18 and the oxide film 19 containing In or Ga varies continuously. That is, there is no barrier in the vicinity of the interface between the oxide semiconductor film 18 and the oxide film 19 containing In or Ga, and the conduction band bottom smoothly varies. Such a shape is caused by mutual transfer of oxygen between the oxide semiconductor film 18 and the oxide film 19 containing In or Ga. Further, in the multilayer film 20, the energy of the conduction band bottom of the oxide semiconductor film 18 is the lowest, and this region serves as a channel region.

Now, a state where electrons serving as carrier flow in the transistor is described with reference to FIGS. 2B and 2C. Note that in FIGS. 2B and 2C, the number of electrons flowing in the oxide semiconductor film 18 is represented by a size of a dotted arrow.

In the vicinity of the interface between the oxide film 19 containing In or Ga and the oxide insulating film 23, trap states 27 are formed by an impurity and defects. Thus, for example, in the case where a channel region of the transistor is formed with a single layer of the oxide semiconductor film 18 as illustrated in FIG. 2B, in the oxide semiconductor film 18, electrons serving as carrier flow mainly in the gate insulating film 17 side, but a small number of electrons also flows on the oxide insulating film 23 side. As a result, part of electrons flowing on the oxide semiconductor film 18 is captured by the trap states 27.

Figure 2C:
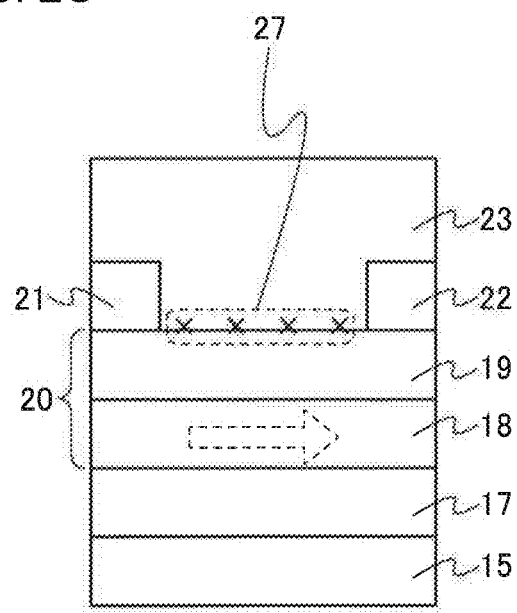

On the other hand, in the transistor 50 described in this embodiment, the oxide film 19 containing In or Ga is provided between the oxide semiconductor film 18 and the oxide insulating film 23 as illustrated in FIG. 2C; thus, there is a distance between the oxide semiconductor film 18 and the trap states 27. As a result, electrons flowing in the oxide semiconductor film 18 are less likely to be captured by the trap states 27. When the electrons are captured by the trap states, the electrons become negative fixed charges. As a result, a threshold voltage of the transistor fluctuates. However, by the distance between the oxide semiconductor film 18 and the trap states 27, capture of the electrons by the trap states 27 can be reduced, and accordingly a fluctuation of the threshold voltage can be reduced.

Note that when the energy difference ΔE1 of the conduction band bottom in the vicinity of the interface between the oxide semiconductor film 18 and the oxide film 19 containing In or Ga is small, carrier flowing in the oxide semiconductor film 18 transcends the conduction band bottom of the oxide film 19 containing In or Ga and is captured by the trap states 27. Thus, the energy difference ΔE1 between the conduction band bottom Ec_18 of the oxide semiconductor film 18 and the conduction band bottom Ec_19 of the oxide film 19 containing In or Ga is greater than or equal to 0.1 eV, preferably greater than or equal to 0.15 eV.

Further, the oxide insulating film 24 (see FIG. 1B) containing more oxygen than that in the stoichiometric composition is provided on the back channel side of the multilayer film 20 (a surface of the multilayer film 20, which is opposite to a surface facing the gate electrode 15) with the oxide insulating film 23 through which oxygen is permeated provided therebetween. Therefore, oxygen contained in the oxide insulating film 24 containing more oxygen than that in the stoichiometric composition is moved to the oxide semiconductor film 18 included in the multilayer film 20, whereby oxygen vacancies in the oxide semiconductor film 18 can be reduced.

From the above, oxygen vacancies in the multilayer film 20 can be reduced by providing the multilayer film 20 including the oxide semiconductor film 18 and the oxide film 19 containing In or Ga, and the oxide insulating film 24 containing more oxygen than that in the stoichiometric composition with the oxide insulating film 23 through which oxygen is permeated provided therebetween, over the multilayer film 20. Further, by providing the oxide film 19 containing In or Ga between the oxide semiconductor film 18 and the oxide insulating film 23, the concentration of silicon or carbon in the oxide semiconductor film 18 or in the vicinity of the interface between the oxide film 19 containing In or Ga and the oxide semiconductor film 18 can be reduced. Consequently, in the multilayer film 20, the absorption coefficient derived from a constant photocurrent method is lower than $1\times10^{-3}$/cm, preferably lower than $1\times10^{-4}$/cm. The absorption coefficient has a positive correlation with energy corresponding to the localized states due to oxygen vacancies and entry of impurities (calculated from a wavelength); thus, the density of localized states in the multilayer film 20 is extremely low.

Note that the absorption coefficient which is called an Urbach tail due to the band tail is removed from a curve of the absorption coefficient obtained by the CPM measurement, whereby the absorption coefficient due to the localized states can be calculated from the following formula. Note that the Urbach tail indicates a constant gradient region on a curve of the absorption coefficient obtained by the CPM measurement, and the gradient is called Urbach energy.

$$\int \frac{\alpha(E) - \alpha_u}{E} dE \qquad \text{[Formula 1]}$$

Here, $\alpha(E)$ indicates the absorption coefficient at each energy level and $\alpha^u$ indicates the absorption coefficient obtained by the Urbach tail.

Since the transistor 50 having such a structure includes very few defects in the multilayer film 20 including the oxide semiconductor film 18, the electrical characteristics of the transistor can be improved. Further, due to a BT stress test and a BT photostress test which are examples of a stress test, the threshold voltage does not change or changes in the negative direction or the positive direction and the amount of the change is less than or equal to 1.0 V, preferably less than or equal to 0.5 V, and thus, reliability is high.

Here, electrical characteristics of a transistor having a small amount of change in threshold voltage in a BT stress test and a BT photostress test are described with reference to FIG. 1D.

The BT stress test is one kind of accelerated test and can evaluate, in a short time, change in characteristics (i.e., change over time) of transistors, which is caused by long-term use. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

Next, a specific method of the BT stress test is described. First, initial characteristics of the transistor are measured. Next, the temperature of the substrate over which the transistor is formed (substrate temperature) is set at fixed temperature, the pair of electrodes serving as a source and a drain of the transistor are set at a same potential, and the gate electrode is supplied for a certain period with potential different from that of the pair of electrodes serving as a source and a drain. The substrate temperature may be determined as appropriate in accordance with the test purpose. Then, the substrate temperature is set at a temperature similar to that of a temperature when the initial characteristics are measured, and electrical characteristics of the transistor are measured again. As a result, a difference between the threshold voltage in the initial characteristics and the threshold voltage after the BT stress test can be obtained as the amount of change in the threshold voltage.

Note that the test in the case where the potential applied to the gate electrode is higher than the potential of the source and the drain is referred to as a positive BT stress test, and the test in the case where the potential applied to the gate electrode is lower than the potential of the source and the drain is referred to as a negative BT stress test. A BT stress test with light irradiation is referred to as a BT photostress test. The test in the case where light irradiation is performed and the potential applied to the gate electrode is higher than the potential of the source and the drain is referred to as a positive BT photostress test, and the test in the case where light irradiation is performed and the potential applied to the gate electrode is lower than the potential of the source and the drain is referred to as a negative BT photostress test.

The stress conditions for the BT stress test can be determined by setting the substrate temperature, the electric field intensity applied to the gate insulating film, and the time period of application of an electric field. The intensity of the electric field applied to the gate insulating film is determined in accordance with a value obtained by dividing a potential difference between the gate, and the source and the drain by the thickness of the gate insulating film. For example, in the case where the intensity of the electric field applied to a 100-nm-thick gate insulating film is to be 3 MV/cm, the potential difference between the gate electrode, and the source and the drain can be set to 30 V.

Figure 1D:
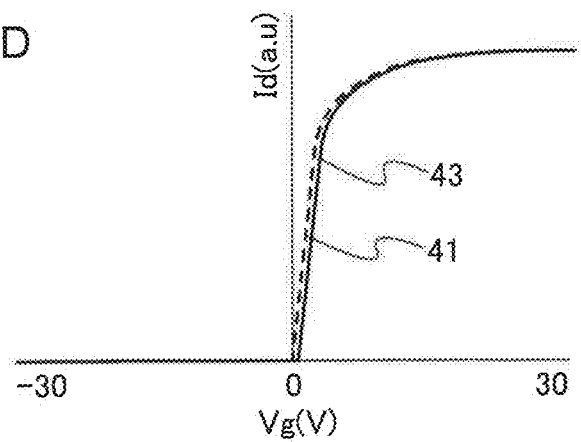

FIG. 1D shows electrical characteristics of the transistor, and the horizontal axis indicates the gate voltage (Vg) and the vertical axis indicates the drain current (Id). A dashed line 41 denotes the initial characteristics of the transistor, and a solid line 43 denotes the electrical characteristics of the transistor after the BT stress test. In the transistor described in this embodiment, the amount of change in threshold voltage in the dashed line 41 and the solid line 43 is 0 V or the amount of change in the negative direction or the positive direction is less than or equal to 1.0 V, preferably less than or equal to 0.5 V. Therefore, in the transistor described in this embodiment, the threshold voltage changes little after the BT stress test. As a result, it is apparent that the transistor 50 described in this embodiment has high reliability.

Note that a transistor including an oxide semiconductor film is an n-channel transistor; therefore, in this specification, a transistor which can be regarded as having no drain current flowing therein when a gate voltage is 0 V is defined as a transistor having normally-off characteristics. In contrast, a transistor which can be regarded as having a drain current flowing therein when a gate voltage is 0 V is defined as a transistor having normally-on characteristics.

Further, in this specification, in a curve (not shown) where the horizontal axis indicates the gate voltage (Vg [V]) and the vertical axis indicates the square root of drain current ($Id^{1/2}$ [A]), the threshold voltage (Vth) is defined as a gate voltage at a point of intersection of an extrapolated tangent line of $Id^{1/2}$ having the highest inclination with the Vg axis.

Other details of the transistor 50 are described below.

There is no particular limitation on a material and the like of the substrate 11 as long as the material has heat resistance high enough to withstand at least heat treatment performed later. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 11.

Alternatively, a flexible substrate may be used as the substrate 11, and the transistor 50 may be provided directly on the flexible substrate. Alternatively, a separation layer may be provided between the substrate 11 and the transistor 50. The separation layer can be used when part or the whole of a semiconductor device formed over the separation layer is completed and separated from the substrate 11 and transferred to another substrate. In such a case, the transistor 50 can be transferred to a substrate having low heat resistance or a flexible substrate as well.

The gate electrode 15 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. The gate electrode 15 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

Further, the gate electrode 15 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like may be provided between the gate electrode 15 and the gate insulating film 17. These films each have a work function higher than or equal to 5 eV, preferably higher than or equal to 5.5 eV, which is higher than the electron affinity of an oxide semiconductor; thus, the threshold voltage of a transistor including the oxide semiconductor can be shifted in the positive direction, and accordingly, a switching element having what is called normally-off characteristics can be obtained. For example, in the case of using an In—Ga—Zn-based oxynitride semiconductor film, an In—Ga—Zn-based oxynitride semiconductor film having a higher nitrogen concentration than at least the oxide semiconductor film 18, specifically, an In—Ga—Zn-based oxynitride semiconductor film having a nitrogen concentration of higher than or equal to 7 atomic % is used.

Figure 3:
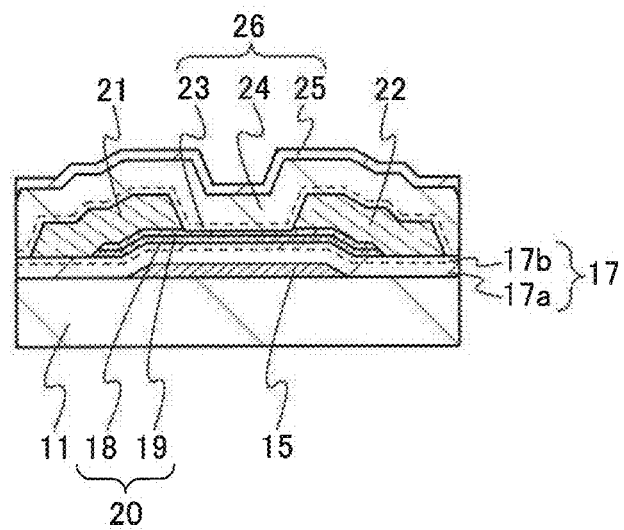
FIG. 3 is a cross-sectional view illustrating one embodiment of a transistor.

The gate insulating film 17 can be formed to have a single-layer structure or a stacked-layer structure using, for example, any of silicon oxide, silicon oxynitride, silicon nitride oxide, silicon nitride, aluminum oxide, hafnium oxide, gallium oxide, Ga—Zn-based metal oxide, and silicon nitride. Further, as shown in FIG. 3, the gate insulating film 17 can be formed to have a stacked-layer structure of a gate insulating film 17a and a gate insulating film 17b, and an oxide insulating film from which oxygen is released by heating may be used for the gate insulating film 17b in contact with the multilayer film 20. With the use of a film from which oxygen is released by heating as the gate insulating film 17b, density of interface states at the interface between the oxide semiconductor film 18 and the gate insulating film 17 can be reduced; accordingly, a transistor with less deterioration in electrical characteristics can be obtained. Further, it is possible to prevent outward diffusion of oxygen from the oxide semiconductor film 18 and entry of hydrogen, water, or the like into the oxide semiconductor film 18 from the outside by providing an insulating film having a blocking effect against oxygen, hydrogen, water, and the like as the gate insulating film 17a. The insulating film having a blocking effect against oxygen, hydrogen, water, and the like is formed using aluminum oxide, aluminum oxynitride, gallium oxide, gallium oxynitride, yttrium oxide, yttrium oxynitride, hafnium oxide, hafnium oxynitride, or the like.

The gate insulating film 17 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 17 may be greater than or equal to 5 nm and less than or equal to 400 nm, preferably greater than or equal to 10 nm and less than or equal to 300 nm, more preferably greater than or equal to 50 nm and less than or equal to 250 nm.

The pair of electrodes 21 and 22 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Further, it is possible to prevent outward diffusion of oxygen from the multilayer film 20 and entry of hydrogen, water, or the like into the multilayer film 20 from the outside by providing the nitride insulating film 25 having a blocking effect against oxygen, hydrogen, water, and the like over the oxide insulating film 24. The nitride insulating film is formed using silicon nitride, silicon nitride oxide, aluminum nitride, aluminum nitride oxide, or the like. Note that instead of the nitride insulating film having a blocking effect against oxygen, hydrogen, water, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Next, a method for manufacturing the transistor 50 shown in FIGS. 1A to 1D is described with reference to FIGS. 4A to 4D.

Figure 4A:
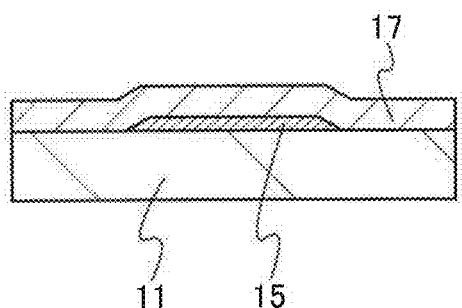
FIGS. 4A to 4D are cross-sectional views illustrating one embodiment of a method for manufacturing a transistor.

As shown in FIG. 4A, the gate electrode 15 is formed over the substrate 11, and the gate insulating film 17 is formed over the gate electrode 15.

Here, a glass substrate is used as the substrate 11.

A method for forming the gate electrode 15 is described below. First, a conductive film is formed by a sputtering method, a CVD method, an evaporation method, or the like, and a mask is formed over the conductive film by a photolithography process. Next, part of the conductive film is etched with the use of the mask to form the gate electrode 15. After that, the mask is removed.

Note that the gate electrode 15 may be formed by an electrolytic plating method, a printing method, an inkjet method, or the like instead of the above formation method.

Here, a 100-nm-thick tungsten film is formed by a sputtering method. Next, a mask is formed by a photolithography process, and the tungsten film is subjected to dry etching with the use of the mask to form the gate electrode 15.

The gate insulating film 17 is formed by a sputtering method, a CVD method, an evaporation method, or the like.

In the case where a silicon oxide film, a silicon oxynitride film, or a silicon nitride oxide film is formed as the gate insulating film 17, a deposition gas containing silicon and an oxidizing gas are preferred to be used as source gases. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

In the case where a silicon nitride film is formed as the gate insulating film 17, it is preferable to use a two-step formation method. First, a first silicon nitride film with few defects is formed by a plasma CVD method in which a mixed gas of silane, nitrogen, and ammonia is used as a source gas. Then, a second silicon nitride film which has a low hydrogen concentration and is capable of blocking hydrogen is formed by switching the source gas to a mixed gas of silane and nitrogen. With such a formation method, a silicon nitride film with few defects and a blocking property against hydrogen can be formed as the gate insulating film 17.

Moreover, in the case of forming a gallium oxide film as the gate insulating film 17, a metal organic chemical vapor deposition (MOCVD) method can be employed.

Figure 4B:
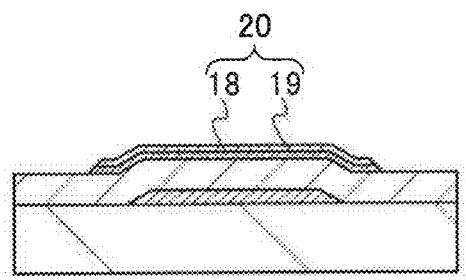

Next, as shown in FIG. 4B, the oxide semiconductor film 18 and the oxide film 19 containing In or Ga are formed over the gate insulating film 17.

Methods for forming the oxide semiconductor film 18 and the oxide film 19 containing In or Ga are described below. An oxide semiconductor film which is to be the oxide semiconductor film 18 and an oxide film containing In or Ga which is to be the oxide film 19 containing In or Ga are successively formed over the gate insulating film 17. Next, after a mask is formed over the oxide film containing In or Ga by a photolithography process, the oxide semiconductor film and the oxide film containing In or Ga are partly etched with the use of the mask; thus, as shown in FIG. 4B, the multilayer film 20 which is subjected to element isolation and includes the oxide semiconductor film 18 and the oxide film 19 containing In or Ga is formed over the gate insulating film 17 so as to overlap with part of the gate electrode 15. After that, the mask is removed.

The oxide semiconductor film which is to be the oxide semiconductor film 18 and the oxide film containing In or Ga which is to be the oxide film 19 containing In or Ga can be formed by a sputtering method, a coating method, a pulsed laser deposition method, a laser ablation method, or the like.

In the case where the oxide semiconductor film and the oxide film containing In or Ga are formed by a sputtering method, an RF power supply device, an AC power supply device, a DC power supply device, or the like can be used as appropriate as a power supply device for generating plasma.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Further, a target may be selected as appropriate in accordance with the composition of the oxide semiconductor film and the oxide film containing In or Ga to be formed.

Note that, for example, when a sputtering method is used to form the oxide semiconductor film and the oxide film containing In or Ga, the oxide semiconductor film and the oxide film containing In or Ga are formed while heating at a substrate temperature higher than or equal to 150° C. and lower than or equal to 500° C., preferably higher than or equal to 150° C. and lower than or equal to 450° C., more preferably higher than or equal to 200° C. and lower than or equal to 350° C., whereby a CAAC-OS film which is described later can be formed.

The oxide semiconductor film and the oxide film containing In or Ga are not simply stacked but formed to have a continuous energy band (to have a structure in which the energy at the bottom of the conduction band varies continuously across the films). In other words, a stacked-layer structure in which an impurity which forms a defect state such as a trap center or a recombination center or a barrier blocking the flow of carrier does not exist at the interface between the films is formed. If an impurity exists between the oxide semiconductor film and the oxide film containing In or Ga which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $1 \times 10^{-4}$ Pa to $5 \times 10^{-7}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In order to obtain a highly purified intrinsic oxide semiconductor film, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be prevented as much as possible.

Here, a 35-nm-thick In—Ga—Zn oxide film (the atomic ratio of a sputtering target used for film formation is In:Ga:Zn=1:1:1) is formed as the oxide semiconductor film by a sputtering method, and then, a 20-nm-thick In—Ga—Zn oxide film (the atomic ratio of a sputtering target used for film formation is In:Ga:Zn=1:3:2) is formed as the oxide film containing In or Ga by a sputtering method. Next, a mask is formed over the oxide film containing In or Ga, and the oxide semiconductor film and the oxide film containing In or Ga are partly and selectively etched to form the multilayer film 20 including the oxide semiconductor film 18 and the oxide film 19 containing In or Ga.

After that, heat treatment may be performed.

Figure 4C:
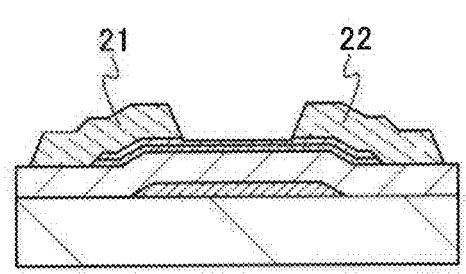

Next, as shown in FIG. 4C, the pair of electrodes 21 and 22 is formed.

A method for forming the pair of electrodes 21 and 22 is described below. First, a conductive film is formed by a sputtering method, a CVD method, an evaporation method, or the like. Then, a mask is formed over the conductive film by a photolithography process. Next, the conductive film is etched with the use of the mask to form the pair of electrodes 21 and 22. After that, the mask is removed.

Here, a 50-nm-thick tungsten film, a 400-nm-thick aluminum film, and a 100-nm-thick titanium film are sequentially stacked by a sputtering method. Next, a mask is formed over the titanium film by a photolithography process and the tungsten film, the aluminum film, and the titanium film are dry-etched with use of the mask to form the pair of electrodes 21 and 22.

Figure 4D:
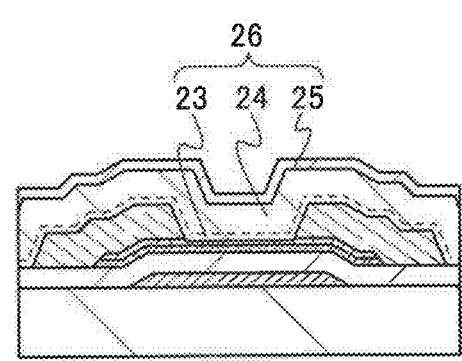

Next, as shown in FIG. 4D, the oxide insulating film 23 is formed over the multilayer film 20 and the pair of electrodes 21 and 22. Next, the oxide insulating film 24 is formed over the oxide insulating film 23.

Note that after the oxide insulating film 23 is formed, the oxide insulating film 24 is preferably formed in succession without exposure to the air. After the oxide insulating film 23 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 23 and the oxide insulating film 24 can be reduced and oxygen in the oxide insulating film 24 can be moved to the oxide semiconductor film 18; accordingly, the number of oxygen vacancies in the oxide semiconductor film 18 can be reduced.

As for the oxide insulating film 23, a silicon oxide film or a silicon oxynitride film can be formed as the oxide insulating film 23 under the following conditions: the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure is greater than or equal to 20 Pa and less than or equal to 250 Pa, preferably greater than or equal to 20 Pa and less than 100 Pa or preferably greater than or equal to 100 Pa and less than or equal to 250 Pa with introduction of source gases into the treatment chamber, and a high-frequency power is supplied to an electrode provided in the treatment chamber.

A deposition gas containing silicon and an oxidizing gas are preferably used as the source gases of the oxide insulating film 23. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film through which oxygen is permeated can be formed as the oxide insulating film 23. Further, by providing the oxide film 19 containing In or Ga and the oxide insulating film 23, damage to the oxide semiconductor film 18 can be reduced in a step of forming the oxide insulating film 24 which is formed later. Note that by setting the pressure in the treatment chamber to be greater than or equal to 100 Pa and less than or equal to 250 Pa, the amount of water contained in the oxide insulating film 23 is reduced; thus, variation in electrical characteristics of the transistor 50 can be reduced and change in threshold voltage can be inhibited. Further, by setting the pressure in the treatment chamber to be greater than or equal to 100 Pa and less than or equal to 250 Pa, damage to the multilayer film 20 including the oxide semiconductor film 18 can be reduced when the oxide insulating film 23 is formed, so that the number of oxygen vacancies contained in the oxide semiconductor film 18 can be reduced. In particular, when the film formation temperature of the oxide insulating film 23 or the oxide insulating film 24 which is formed later is set to be high, typically higher than 220° C., part of oxygen contained in the oxide semiconductor film 18 is released and oxygen vacancies are easily formed. Further, when the film formation conditions for reducing the number of defects in the oxide insulating film 24 which are formed later are used to increase reliability of the transistor, the amount of released oxygen is easily reduced. Thus, it is difficult to reduce oxygen vacancies in the oxide semiconductor film 18 in some cases. However, by setting the pressure in the treatment chamber to be greater than or equal to 100 Pa and less than or equal to 250 Pa to reduce damage to the oxide semiconductor film 18 at the time of forming the oxide insulating film 23, oxygen vacancies in the oxide semiconductor film 18 can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 23 can be reduced. Consequently, the amount of hydrogen entering the oxide semiconductor film 18 can be reduced; thus, the negative shift in the threshold voltage of the transistor can be inhibited.

Further, as the oxide insulating film 23, a silicon oxide film or a silicon oxynitride film can be formed under the following conditions: the substrate placed in the treatment chamber of the plasma CVD apparatus, which is vacuum-evacuated, is held at a temperature higher than or equal to 300° C. and lower than or equal to 400° C., preferably higher than or equal to 320° C. and lower than or equal to 370° C.; the pressure is greater than or equal to 20 Pa and less than or equal to 250 Pa with introduction of the source gases into the treatment chamber; and a high-frequency power is supplied to an electrode provided in the treatment chamber.

In the above film formation conditions, when the substrate temperature is set to the above-described temperature, the bonding strength of silicon and oxygen becomes high. Thus, as the oxide insulating film 23, a dense and hard oxide insulating film through which oxygen is permeated, typically, a silicon oxide film or a silicon oxynitride film of which etching using hydrofluoric acid of 0.5 wt % at 25° C. is performed at a rate of lower than or equal to 10 nm/min, preferably lower than or equal to 8 nm/min can be formed.

Here, as the oxide insulating film 23, a 50-nm-thick silicon oxynitride film is formed by a plasma CVD method in which silane with a flow rate of 30 sccm and dinitrogen monoxide with a flow rate of 4000 sccm are used as source gases, the pressure in the treatment chamber is 200 Pa, the substrate temperature is 220° C., and a high-frequency power of 150 W is supplied to parallel plate electrodes with the use of a 27.12 MHz high-frequency power source. Under such conditions, a silicon oxynitride film through which oxygen is permeated can be formed.

As the oxide insulating film 24, a silicon oxide film or a silicon oxynitride film is formed under the following conditions: the substrate placed in the treatment chamber of the plasma CVD apparatus, which is vacuum-evacuated, is held at a temperature higher than or equal to 180° C. and lower than or equal to 260° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of source gases into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to the electrode provided in the treatment chamber.

A deposition gas containing silicon and an oxidizing gas are preferably used as the source gases of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. However, in the case where the substrate temperature is the above-described temperature, the bonding strength between silicon and oxygen is low, and accordingly, part of oxygen is released by heating. Thus, it is possible to form an oxide insulating film which contains more oxygen than that in the stoichiometric composition and from which part of oxygen is released by heating. Further, the oxide insulating film 23 is provided over the multilayer film 20. Thus, during a step of forming the oxide insulating film 24, the oxide insulating film 23 serves as a protective film of the multilayer film 20. Further, the oxide film 19 containing In or Ga serves as a protective film of the oxide semiconductor film 18. Consequently, the oxide insulating film 24 can be formed using the high-frequency power having a high power density while damage to the oxide semiconductor film 18 is reduced.

Note that in the film formation conditions of the oxide insulating film 24, the flow rate of the deposition gas containing silicon relative to the oxidizing gas can be increased, whereby the number of defects in the oxide insulating film 24 can be reduced. Typically, it is possible to form an oxide insulating film in which the number of defects is small, i.e. the spin density of a signal which appears at g=2.001 due to a dangling bond of silicon, be lower than $6 \times 10^{17}$ spins/cm$^3$, preferably lower than or equal to $3 \times 10^{17}$ spins/cm$^3$, more preferably lower than or equal to $1.5 \times 10^{17}$ spins/cm$^3$ by ESR measurement. As a result, the reliability of the transistor can be improved.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gases, the pressure in the treatment chamber is 200 Pa, the substrate temperature is 220° C., and the high-frequency power of 1500 W is supplied to the parallel plate electrodes with the use of a 27.12 MHz high-frequency power source. Note that the plasma CVD apparatus is a parallel plate plasma CVD apparatus in which the electrode area is 6000 cm$^2$, and the power per unit area (power density) into which the supplied power is converted is 0.25 W/cm$^2$.

Next, heat treatment is performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). Note that the nitrogen, the oxygen, the ultra-dry air, or the rare gas preferably does not contain hydrogen, water, and the like.

By the heat treatment, part of oxygen contained in the oxide insulating film 24 can be moved to the oxide semiconductor film 18, so that the number of oxygen vacancies contained in the oxide semiconductor film 18 can be reduced.

Further, in the case where water, hydrogen, or the like is contained in the oxide insulating film 23 and the oxide insulating film 24, when the nitride insulating film 25 having a function of blocking water, hydrogen, and the like is formed later and heat treatment is performed, water, hydrogen, or the like contained in the oxide insulating film 23 and the oxide insulating film 24 are moved to the oxide semiconductor film 18, so that defects are generated in the oxide semiconductor film 18. However, by the heating, water, hydrogen, or the like contained in the oxide insulating film 23 and the oxide insulating film 24 can be released; thus, variation in electrical characteristics of the transistor 50 can be reduced, and change in threshold voltage can be inhibited.

Note that the oxide insulating film 24 can be formed over the oxide insulating film 23 while heating, whereby oxygen can be moved to the oxide semiconductor film 18 and oxygen vacancies contained in the oxide semiconductor film 18 can be reduced accordingly. Therefore, the heat treatment is not necessarily performed.

Here, the heat treatment is performed at 350° C. in an atmosphere of nitrogen and oxygen for one hour.

Further, when the pair of electrodes 21 and 22 is formed, the multilayer film 20 is damaged by etching of the conductive film, so that oxygen vacancies are generated on the back-channel side of the multilayer film 20. However, with the use of the oxide insulating film containing more oxygen than that in the stoichiometric composition as the oxide insulating film 24, the oxygen vacancies generated on the back channel side can be repaired by heat treatment. By this, defects contained in the multilayer film 20 can be reduced, and thus, the reliability of the transistor 50 can be improved.

Next, the nitride insulating film 25 is formed by a sputtering method, a CVD method, or the like.

Note that in the case where the nitride insulating film 25 is formed by a plasma CVD method, the substrate placed in the treatment chamber of the plasma CVD apparatus, which is vacuum-evacuated, is preferably set to be higher than or equal to 300° C. and lower than or equal to 400° C., more preferably, higher than or equal to 320° C. and lower than or equal to 370° C., so that a dense nitride insulating film can be formed.

In the case where a silicon nitride film is formed by the plasma CVD method as the nitride insulating film 25, a deposition gas containing silicon, nitrogen, and ammonia is preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which a bond between silicon and nitrogen is promoted and a bond between silicon and hydrogen is few can be formed. On the other hand, when the amount of ammonia with respect to nitrogen is large in the source gas, cleavage of a deposition gas containing silicon and cleavage of nitrogen are not promoted, so that a sparse silicon nitride film in which a bond between silicon and hydrogen remains and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

Here, in the treatment chamber of a plasma CVD apparatus, a 50-nm-thick silicon nitride film is formed by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

By the above-described steps, the protective film 26 including the oxide insulating film 23, the oxide insulating film 24, and the nitride insulating film 25 can be formed.

Next, heat treatment may be performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

By the above-described process, the transistor 50 can be manufactured.

The oxide insulating film containing more oxygen than that in the stoichiometric composition is formed to overlap with the oxide semiconductor film which serves as a channel region, and thus, oxygen in the oxide insulating film can be moved to the oxide semiconductor film. Consequently, the number of oxygen vacancies in the oxide semiconductor film can be reduced.

In particular, the oxide insulating film through which oxygen is permeated is formed between the oxide semiconductor film which serves as a channel region and the oxide insulating film containing more oxygen than that in the stoichiometric composition. Thus, damage to the oxide semiconductor film at the time of forming the oxide insulating film containing more oxygen than that in the stoichiometric composition can be reduced. Consequently, the number of oxygen vacancies in the oxide semiconductor film can be reduced.

Further, the oxide film containing In or Ga is formed over the oxide semiconductor film, whereby damage to the oxide semiconductor film at the time of forming the oxide insulating film containing more oxygen than that in the stoichiometric composition can be further reduced. In addition, by forming the oxide film containing In or Ga, mixing of a constituent element of an insulating film, e.g., the oxide insulating film, formed over the oxide semiconductor film to the oxide semiconductor film can be inhibited.

From the above, a semiconductor device including an oxide semiconductor film, in which the number of defects is reduced, can be obtained. Further, a semiconductor device including an oxide semiconductor film and having improved electrical characteristics can be obtained.

<Modification Example 1>

In the transistor 50 described in this embodiment, a base insulating film may be provided between the substrate 11 and the gate electrode 15 as necessary. As a material of the base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the base insulating film, it is possible to inhibit diffusion of impurities such as alkali metal, water, and hydrogen into the multilayer film 20 from the substrate 11.

The base insulating film can be formed by a sputtering method, a CVD method, or the like.

<Modification Example 2>

It is preferable to use, as the oxide semiconductor film 18 provided in the transistor 50 described in this embodiment, an oxide semiconductor film in which the impurity concentration is low and density of defect states is low, in which case a transistor with more excellent electrical characteristics can be manufactured. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor using the oxide semiconductor as a channel region rarely has electrical characteristics in which a threshold voltage is negative (also referred to as normally-on). A highly purified intrinsic or substantially highly purified intrinsic oxide semiconductor has a low density of defect states and accordingly has a low density of trap states. Thus, the transistor using the oxide semiconductor as the channel region has a small variation in electrical characteristics and high reliability. Charges trapped by the trap states in the oxide semiconductor take a long time to be released and may behave like fixed charges. Thus, the transistor which uses the oxide semiconductor having a high density of trap states as a channel region has unstable electrical characteristics in some cases. As examples of the impurities, hydrogen, nitrogen, alkali metal, alkaline earth metal, and the like are given.

Hydrogen contained in the oxide semiconductor reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible in the oxide semiconductor film 18. Specifically, the hydrogen concentration of the oxide semiconductor film 18, which is measured by secondary ion mass spectrometry (SIMS), is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, even more preferably lower than or equal to $5 \times 10^{18}$ atoms/cm$^3$, still more preferably lower than or equal to $1 \times 10^{18}$ atoms/cm$^3$, yet still more preferably lower than or equal to $5 \times 10^{17}$ atoms/cm$^3$, even further more preferably lower than or equal to $1 \times 10^{16}$ atoms/cm$^3$.

As a method for reducing the hydrogen concentration of the oxide semiconductor film 18, after the multilayer film 20 including the oxide semiconductor film 18 and the oxide film 19 containing In or Ga are formed in FIG. 4B, heat treatment is performed; thus, the hydrogen concentration of the oxide semiconductor film 18 can be reduced. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

Further, the concentration of alkali metal or alkaline earth metal of the oxide semiconductor film 18, which is measured by secondary ion mass spectrometry, is set to lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 18.

By providing a nitride insulating film in part of the gate insulating film 17, the concentration of alkali metal or alkaline earth metal of the oxide semiconductor film 18 can be reduced.

Further, when containing nitrogen, the oxide semiconductor film 18 easily has n-type conductivity by generation of electrons serving as carriers and an increase of carrier density. Thus, a transistor including an oxide semiconductor which contains nitrogen is likely to have normally-on characteristics. For this reason, nitrogen in the oxide semiconductor film is preferably reduced as much as possible; the concentration of nitrogen is preferably set to, for example, lower than or equal to $5 \times 10^{18}$ atoms/cm$^3$.

In this manner, when the oxide semiconductor film 18 highly purified by reducing impurities (such as hydrogen, nitrogen, alkali metal, and alkaline earth metal) as much as possible is included, it is possible to inhibit making the transistor have normally-on characteristics, so that the off-state current of the transistor can be significantly reduced. Accordingly, a semiconductor device having favorable electrical characteristics can be manufactured. Further, a semiconductor device with improved reliability can be manufactured.

Various experiments can prove the low off-state current of a transistor including a highly purified oxide semiconductor film. For example, even when an element has a channel width of $1 \times 10^6$ μm and a channel length L of 10 μm, off-state current can be less than or equal to the measurement limit of a semiconductor parameter analyzer, i.e., less than or equal to $1 \times 10^{-13}$ A, at a voltage (drain voltage) between the source electrode and the drain electrode of from 1 V to 10 V. In that case, it can be found that a value obtained by dividing the off-state current by the channel width of the transistor is less than or equal to 100 zA/μm. In addition, a capacitor and a transistor are connected to each other and the off-state current is measured with a circuit in which charge flowing into or from the capacitor is controlled by the transistor. In the measurement, part of a highly purified oxide semiconductor film is used for a channel region of the transistor, and the off-state current of the transistor is measured from a change in the amount of charge of the capacitor per unit time. As a result, it is found that in the case where the voltage between the source electrode and the drain electrode of the transistor is 3 V, lower off-state current of several tens of yoctoamperes per micrometer (yA/μm) can be obtained. Thus, the transistor including the highly purified oxide semiconductor film has a significantly low off-state current.

<Modification Example 3>

Figure 5A:
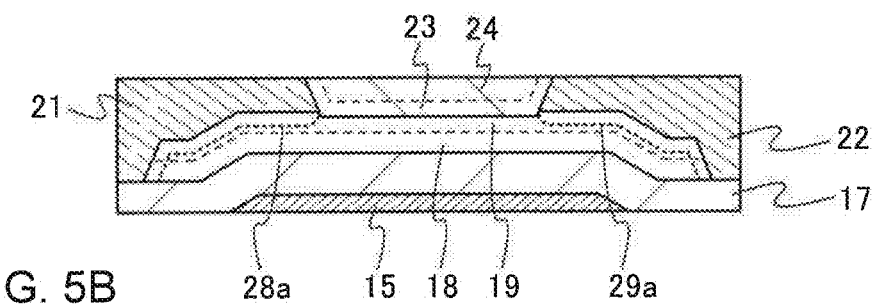
FIGS. 5A to 5C are cross-sectional views each illustrating one embodiment of a transistor.
Figure 5B:
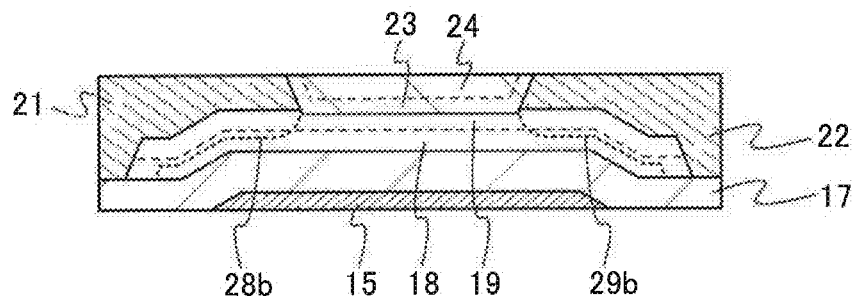
Figure 5C:
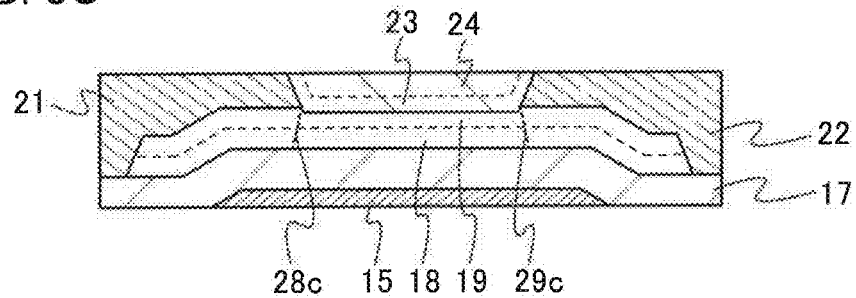

As for the pair of electrodes 21 and 22 provided in the transistor 50 described in this embodiment, it is preferable to use a conductive material which is easily bonded to oxygen, such as tungsten, titanium, aluminum, copper, molybdenum, chromium, or tantalum, or an alloy thereof. Thus, oxygen contained in the multilayer film 20 and the conductive material contained in the pair of electrodes 21 and 22 are bonded to each other, so that an oxygen deficient region is formed in the multilayer film 20. Further, in some cases, part of constituent elements of the conductive material that forms the pair of electrodes 21 and 22 is mixed into the multilayer film 20. As a result of these, in the multilayer film 20, a low-resistance region is formed in the vicinity of a region in contact with the pair of electrodes 21 and 22. FIGS. 5A to 5C are each an enlarged cross-sectional view of the multilayer film 20 of the transistor 50 shown in FIG. 1B.

There is a case where, as shown in FIG. 5A, large parts of low-resistance regions 28*a* and 29*a* are formed in the oxide film 19 containing In or Ga. There is another case where, as shown in FIG. 5B, low-resistance regions 28*b* and 29*b* are formed in the oxide semiconductor film 18 and the oxide film 19 containing In or Ga. There is still another case where, as shown in FIG. 5C, low-resistance regions 28*c* and 29*c* are formed in the oxide semiconductor film 18 and the oxide film 19 containing In or Ga so as to be in contact with the gate insulating film 17. Since the low-resistance regions 28*a* to 28*c* and 29*a* to 29*c* have high conductivity, contact resistance between the multilayer film 20 and the pair of electrodes 21 and 22 can be reduced, and thus, the on-state current of the transistor can be increased.

Further, the pair of electrodes 21 and 22 may each have a stacked-layer structure of the conductive material which is easily bonded to oxygen and a conductive material which is not easily bonded to oxygen, such as titanium nitride, tantalum nitride, or ruthenium. With such a stacked-layer structure, oxidization of the pair of electrodes 21 and 22 can be prevented at the interface between the pair of electrodes 21 and 22 and the oxide insulating film 23, so that the increase of the resistance of the pair of electrodes 21 and 22 can be inhibited.

<Modification Example 4>

In the method for manufacturing the transistor 50 described in this embodiment, after the pair of electrodes 21 and 22 is formed, cleaning treatment may be performed to remove an etching residue. By performing the cleaning treatment, occurrence of leakage current flowing between the pair of electrodes 21 and 22 can be inhibited. The cleaning treatment can be performed using an alkaline solution such as a tetramethylammonium hydroxide (TMAH) solution, an acidic solution such as diluted hydrofluoric acid, an oxalic acid solution, or a phosphorus acid solution.

<Modification Example 5>

In the method for manufacturing the transistor 50 described in this embodiment, after the pair of electrodes 21 and 22 is formed, the multilayer film 20 may be exposed to plasma generated in an oxygen atmosphere, so that oxygen may be supplied to the oxide semiconductor film 18 and the oxide film 19 containing In or Ga. Atmospheres of oxygen, ozone, dinitrogen monoxide, nitrogen dioxide, and the like can be given as examples of the oxygen atmosphere. Further, in the plasma treatment, the multilayer film 20 is preferred to be exposed to plasma generated with no bias applied to the substrate 11 side. Consequently, the multilayer film 20 can be supplied with oxygen without being damaged, and the number of oxygen vacancies in the multilayer film 20 can be reduced. Moreover, impurities remaining on the surface of the multilayer film 20 due to etching treatment, for example, a halogen such as fluorine or chlorine can be removed.

Note that the structures, methods, and the like described in this embodiment can be used as appropriate in combination with any of the structures, methods, and the like described in the other embodiments and examples.

Embodiment 2

In this embodiment, a semiconductor device having a transistor in which the number of defects in the oxide semiconductor film can be further reduced as compared to Embodiment 1 is described with reference to drawings. The transistor described in this embodiment is different from that in Embodiment 1 in having an oxide film containing In or Ga between the gate insulating film and the oxide semiconductor film.

Figure 6A:
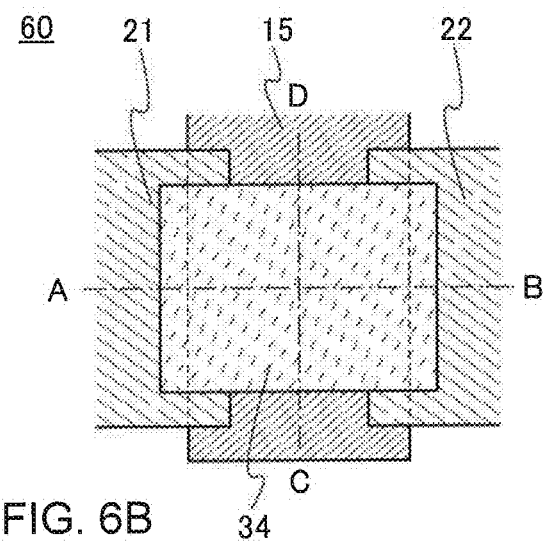
FIGS. 6A to 6C are a top view and cross-sectional views illustrating one embodiment of a transistor.
Figure 6C:
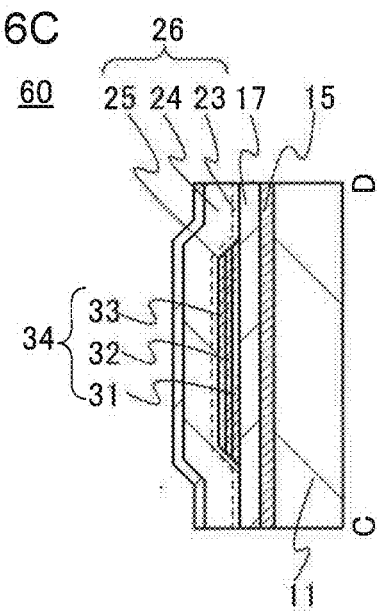
Figure 6B:
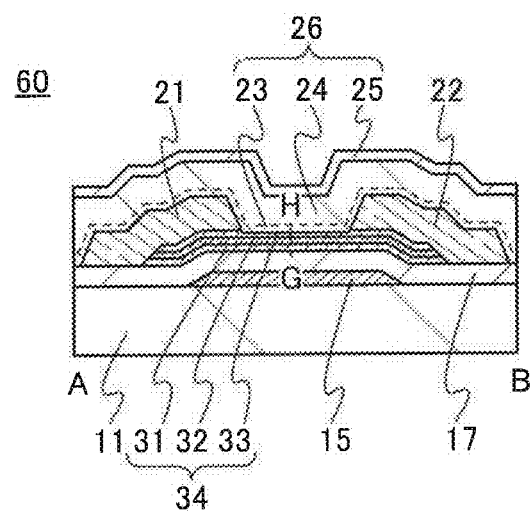

FIGS. 6A to 6E are a top view and cross-sectional views of a transistor 60 included in the semiconductor device. FIG. 6A is a top view of the transistor 60, FIG. 6B is a cross-sectional view taken along dashed-dotted line A-B of FIG. 6A, and FIG. 6C is a cross-sectional view taken along dashed-dotted line C-D of FIG. 6A. Note that in FIG. 6A, the substrate 11, the gate insulating film 17, the oxide insulating film 23, the oxide insulating film 24, the nitride insulating film 25, and the like are omitted for simplicity.

The transistor 60 shown in FIGS. 6A to 6E includes the gate electrode 15 provided over the substrate 11. Further, the gate insulating film 17 is formed over the substrate 11 and the gate electrode 15, and a multilayer film 34 overlapping with the gate electrode 15 with the gate insulating film 17 provided therebetween, and the pair of electrodes 21 and 22 in contact with the multilayer film 34 are included. Furthermore, the protective film 26 including the oxide insulating film 23, the oxide insulating film 24, and the nitride insulating film 25 is formed over the gate insulating film 17, the multilayer film 34, and the pair of electrodes 21 and 22.

In the transistor 60 described in this embodiment, the multilayer film 34 includes an oxide film 31 containing In or Ga, an oxide semiconductor film 32, and an oxide film 33 containing In or Ga. Further, part of the oxide semiconductor film 32 serves as a channel region.

Further, the gate insulating film 17 and the oxide film 31 containing In or Ga are in contact with each other. That is, the oxide film 31 containing In or Ga is provided between the gate insulating film 17 and the oxide semiconductor film 32.

Further, the oxide film 33 containing In and Ga and the oxide insulating film 23 are in contact with each other. That is, the oxide film 33 containing In or Ga is provided between the oxide semiconductor film 32 and the oxide insulating film 23.

A material and a formation method which are similar to those of the oxide film 19 containing In or Ga in Embodiment 1 can be used for the oxide film 31 containing In or Ga and the oxide film 33 containing In or Ga as appropriate.

Note that when the oxide film 31 containing In or Ga is In-M-Zn oxide film, the atomic ratio of In to M is preferably as follows: the proportion of In atoms be lower than 50 atomic % and the proportion of M atoms be higher than or equal to 50 atomic %, and it is further preferably as follows: the proportion of In atoms be lower than 25 atomic % and the proportion of M atoms be higher than or equal to 75 atomic %.

Note that when the oxide film 33 containing In or Ga is In-M-Zn oxide film, the atomic ratio of In to M is preferably as follows: the proportion of In atoms be lower than 50 atomic % and the proportion of M atoms be higher than or equal to 50 atomic %, and it is further preferably as follows: the proportion of In atoms be lower than 25 atomic % and the proportion of M atoms be higher than or equal to 75 atomic %.

A material and a formation method which are similar to those of the oxide semiconductor film 18 in Embodiment 1 can be used for the oxide semiconductor film 32.

Here, as the oxide film 31 containing In or Ga, a 30-nm-thick In—Ga—Zn oxide film (the atomic ratio of a sputtering target used for film formation is In:Ga:Zn=1:6:4) is formed by a sputtering method. Further, as the oxide semiconductor film 32, a 10-nm-thick In—Ga—Zn oxide film (the atomic ratio of a sputtering target used for film formation is In:Ga:Zn=1:1:1) is formed. Furthermore, as the oxide film 33 containing In or Ga, a 10-nm-thick In—Ga—Zn oxide film (the atomic ratio of a sputtering target used for film formation is In:Ga:Zn=1:3:2) is formed.

Here, the band structure along dashed-dotted line G-H in the vicinity of the multilayer film 34 of the transistor 60 in FIGS. 6A to 6E is described with reference to FIG. 7A, and the flow of carrier in the transistor 60 is described with reference to FIG. 7B.

Figure 7A:
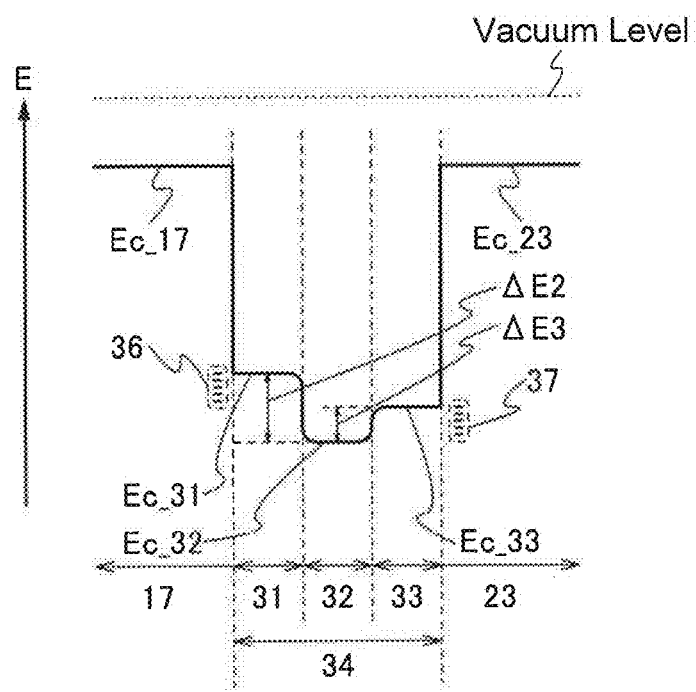
FIGS. 7A and 7B are diagrams illustrating the band structure of a transistor.

In the band structure shown in FIG. 7A, for example, In—Ga—Zn oxide (the atomic ratio of a sputtering target used for film formation is In:Ga:Zn=1:6:4) with an energy gap of 3.8 eV is used for the oxide film 31 containing In or Ga. In—Ga—Zn oxide (the atomic ratio of a sputtering target used for film formation is In:Ga:Zn=1:1:1) with an energy gap of 3.2 eV is used for the oxide semiconductor film 32. In—Ga—Zn oxide (the atomic ratio of a sputtering target used for film formation is In:Ga:Zn=1:3:2) with an energy gap of 3.5 eV is used for the oxide film 33 containing In or Ga.

The energy difference between the vacuum level and the valence band top (also referred to as ionization potential) of the oxide film 31 containing In or Ga, the energy difference therebetween of the oxide semiconductor film 32, and the energy difference therebetween of the oxide film 33 containing In or Ga are 7.8 eV, 7.9 eV, and 8.0 eV, respectively.

The energy difference between the vacuum level and the conduction band bottom (also referred to as electron affinity) of the oxide film 31 containing In or Ga, the energy difference therebetween of the oxide semiconductor film 32, and the energy difference therebetween of the oxide film 33 containing In or Ga are 4.0 eV, 4.7 eV, and 4.5 eV, respectively.

Further, the conduction band bottom of the oxide film 31 containing In or Ga is denoted by Ec_31, the conduction band bottom of the oxide semiconductor film 32 is denoted by Ec_32, and the conduction band bottom of the oxide film 33 containing In or Ga is denoted by Ec_33. Further, the conduction band bottom of the gate insulating film 17 is denoted by Ec_17, and the conduction band bottom of the oxide insulating film 23 is denoted by Ec_23.

As shown in FIG. 7A, in the multilayer film 34, the conduction band bottom in the vicinity of the interface between the oxide film 31 containing In or Ga and the oxide semiconductor film 32 and the conduction band bottom in the vicinity of the interface between the oxide semiconductor film 32 and the oxide film 33 containing In or Ga vary continuously. That is, there is no barrier in the vicinity of the interface between the oxide film 31 containing In or Ga and the oxide semiconductor film 32 and in the vicinity of the interface between the oxide semiconductor film 32 and the oxide film 33 containing In or Ga and the conduction band bottom smoothly varies. A structure having such a conduction band bottom can also be referred to as a U-shaped well (U shape well) structure. Such a shape is caused by mutual transfer of oxygen between the oxide film 31 containing In or Ga and the oxide semiconductor film 32 and between the oxide semiconductor film 32 and the oxide film 33 containing In or Ga. Further, in the multilayer film 34, the energy of the conduction band bottom Ec_32 of the oxide semiconductor film 32 is the lowest, and this region serves as a channel region.

Now, a state where electrons serving as carrier flow in the transistor 60 is described with reference to FIG. 7B. Note that in FIG. 7B, the flow of electrons flowing in the oxide semiconductor film 32 is represented by a dotted arrow.

Trap states 36 due to impurities and defects are formed in the vicinity of the interface between the gate insulating film 17 and the oxide film 31 containing In or Ga. Further, trap states 37 are formed in the vicinity of the interface between the oxide film 33 containing In or Ga and the oxide insulating film 23 in a similar manner. In the transistor 60 described in this embodiment, the oxide film 31 containing In or Ga is provided between the gate insulating film 17 and the oxide semiconductor film 32 as shown in FIG. 7B; thus, there is a distance between the oxide semiconductor film 32 and the trap states 36. Further, the oxide film 33 containing In or Ga is provided between the oxide semiconductor film 32 and the oxide insulating film 23; thus, there is a distance between the oxide semiconductor film 32 and the trap states 37.

As a result, electrons flowing in the oxide semiconductor film 32 are less likely to be captured by the trap states 36 and 37, the on-state current of the transistor can be increased, and field effect mobility can be increased. Further, when the electrons are captured by the trap states 36 and 37, the electrons become negative fixed charges. Consequently, a threshold voltage of the transistor fluctuates. However, by the distance between the oxide semiconductor film 32 and the trap states 36 and 37, capture of the electrons by the trap states 36 and 37 can be reduced, and accordingly a fluctuation of the threshold voltage can be reduced.

Note that when the energy difference ΔE2 of the conduction band bottom in the vicinity of the interface between the oxide film 31 containing In or Ga and the oxide semiconductor film 32 and the energy difference ΔE3 of the conduction band bottom in the oxide semiconductor film 32 and the oxide film 33 containing In or Ga are small, carrier flowing in the oxide semiconductor film 32 transcends the conduction band bottom of the oxide film 31 containing In or Ga and the conduction band bottom of the oxide film 33 containing In or Ga and is captured by the trap states 36 and 37. Thus, the energy difference ΔE2 between the conduction band bottoms of the oxide film 31 containing In or Ga and the oxide semiconductor film 32 and the energy difference ΔE3 between the conduction band bottoms of the oxide semiconductor film 32 and the oxide film 33 containing In or Ga are greater than or equal to 0.1 eV, preferably greater than or equal to 0.15 eV.

Note that when the energy difference ΔE3 in the vicinity of the interface between the oxide semiconductor film 32 and the oxide film 33 containing In or Ga is small as compared with the energy difference ΔE2 in the vicinity of the interface between the oxide film 31 containing In or Ga and the oxide semiconductor film 32, resistance between the oxide semiconductor film 32 and the pair of electrodes 21 and 22 can be reduced and the number of electrons captured by the trap states 36 can be reduced. Thus, the amount of on-state current of the transistor can be further increased, and the field-effect mobility can be further increased.

Although the energy difference ΔE3 is smaller than the energy difference ΔE2, the energy difference ΔE2 and the energy difference ΔE3 can be same or the energy difference ΔE3 can be larger than the energy difference ΔE2 by selecting, as appropriate, constituent elements and compositions of the oxide film 31 containing In or Ga, the oxide semiconductor film 32, and the oxide film 33 containing In or Ga in accordance with the electrical characteristics of the transistor.

Further, the oxide insulating film 24 (see FIGS. 6A to 6E) containing more oxygen than that in the stoichiometric composition is provided on the back channel side of the multilayer film 34 (a surface of the multilayer film 34, which is opposite to a surface facing the gate electrode 15) with the oxide insulating film 23 through which oxygen is permeated provided therebetween. Therefore, oxygen contained in the oxide insulating film 24 containing more oxygen than that in the stoichiometric composition is moved to the oxide semiconductor film 32 included in the multilayer film 34, whereby oxygen vacancies in the oxide semiconductor film 32 can be reduced.

Although the multilayer film 34 is damaged by etching for forming the pair of electrodes 21 and 22 and oxygen vacancies are generated on the back channel side of the multilayer film 34, the oxygen vacancies can be repaired by oxygen contained in the oxide insulating film 24 containing more oxygen than that in the stoichiometric composition. Accordingly, the reliability of the transistor 60 can be improved.

From the above, oxygen vacancies in the multilayer film 34 can be reduced by providing the multilayer film 34 including the oxide film 31 containing In or Ga, the oxide semiconductor film 32, and the oxide film 33 containing In or Ga, and the oxide insulating film 24 containing more oxygen than that in the stoichiometric composition provided over the multilayer film 34 with the oxide insulating film 23 through which oxygen is permeated provided therebetween. Further, the oxide film 31 containing In or Ga is provided between the gate insulating film 17 and the oxide semiconductor film 32, and the oxide film 33 containing In or Ga is provided between the oxide semiconductor film 32 and the oxide insulating film 23. Thus, it is possible to reduce the concentration of silicon or carbon in the vicinity of the interface between the oxide film 31 containing In or Ga and the oxide semiconductor film 32, the concentration of silicon or carbon in the oxide semiconductor film 32, or the concentration of silicon or carbon in the vicinity of the interface between the oxide film 33 containing In or Ga and the oxide semiconductor film 32. Consequently, in the multilayer film 34, the absorption coefficient derived from a constant photocurrent method is lower than $1 \times 10^{-3}$/cm, preferably lower than $1 \times 10^{-4}$/cm, and thus density of localized states is extremely low.

Since the transistor 60 having such a structure includes very few defects in the multilayer film 34 including the oxide semiconductor film 32, the electrical characteristics of the transistor can be improved, and typically, the on-state current can be increased and the field-effect mobility can be improved. Further, due to a BT stress test and a BT photostress test which are examples of a stress test, the threshold voltage does not change or the amount of change in the negative direction or the positive direction is less than or equal to 1.0 V, preferably less than or equal to 0.5 V, and thus, reliability is high.

<Modification Example 1>

Figure 6D:
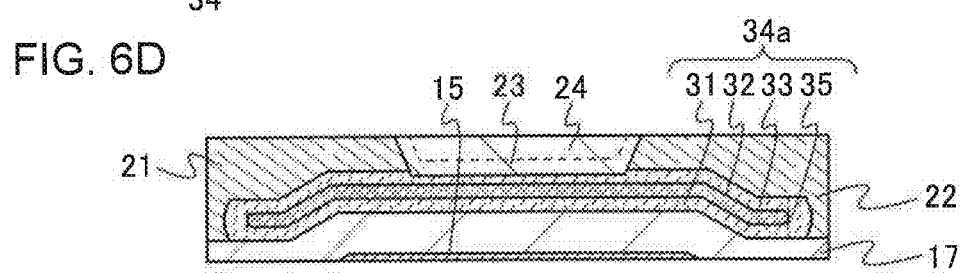
FIGS. 6D and 6E are cross-sectional views illustrating another embodiment of a transistor.
Figure 6E:
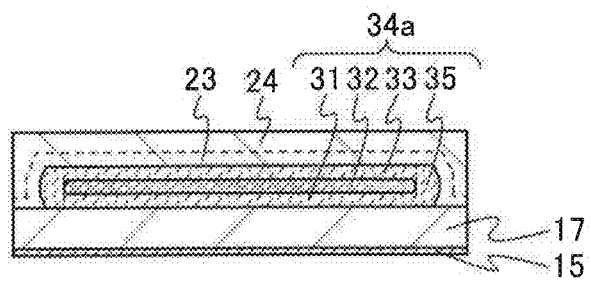
Figure 7B:
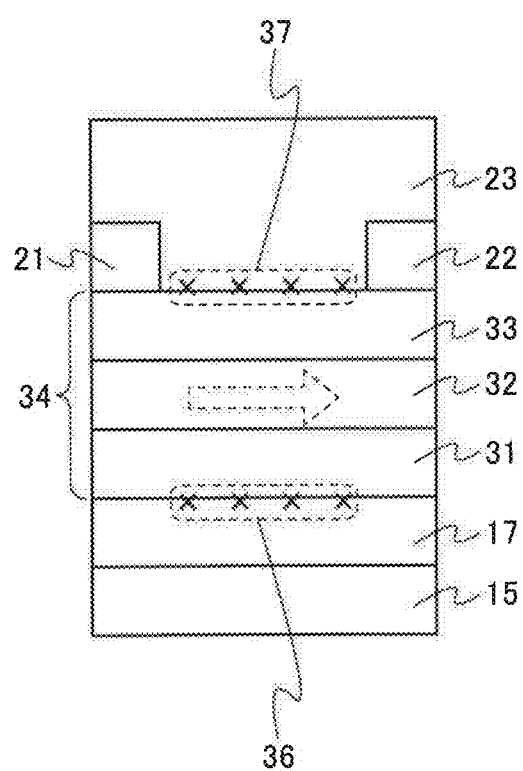

Instead of the multilayer film 34 which is described in this embodiment and shown in FIGS. 6A to 6C, a multilayer film 34a including the oxide film 31 containing In or Ga, the oxide semiconductor film 32, the oxide film 33 containing In or Ga, and an oxide film 35 containing In or Ga can be used as shown in FIGS. 6D and 6E. Note that FIG. 6D corresponds to an enlarged view of the vicinity of the multilayer film 34 shown in FIG. 6B, and FIG. 6E corresponds to an enlarged view of the vicinity of the multilayer film 34 shown in FIG. 6C.

The oxide film 35 containing In or Ga is provided on the side surfaces of the oxide film 31 containing In or Ga, the oxide semiconductor film 32, and the oxide film 33 containing In or Ga. That is, the oxide semiconductor film 32 is surrounded by the oxide films each containing In or Ga.

The oxide film 35 containing In or Ga is formed using metal oxide which is similar to that of the oxide films 31 and 33 each containing In or Ga. That is, the bandgap of the oxide film 35 containing In or Ga is larger than that of the oxide semiconductor film 32, and thus, it is possible to inhibit capturing of an electron in a trap state in the vicinity of the interface between the multilayer film 34a and the gate insulating film 17 or a trap state in the vicinity of the interface between the multilayer film 34a and the oxide insulating film 23. Consequently, the reliability of the transistor is improved.

Note that the oxide film 35 containing In or Ga is formed in such a manner that a reaction product generated in a step of dry etching for forming the oxide film 31 containing In or Ga, the oxide semiconductor film 32, and the oxide film 33 containing In or Ga is attached to the side surfaces of the oxide film 31 containing In or Ga, the oxide semiconductor film 32, and the oxide film 33 containing In or Ga. The dry etching may be performed under conditions in which, for example, a boron trichloride gas and a chlorine gas are used as etching gases and inductively coupled plasma (ICP) power and substrate bias power are applied.

<Modification Example 2>

In the transistor 60 described in this embodiment, the stacked-layer structure of the multilayer film 34 and the pair of electrodes 21 and 22 may be changed as appropriate. For example, a transistor 65 as shown in FIGS. 8A to 8C can be given as a modification example.

A top view of the transistor 65 is shown in FIG. 8A. A cross-sectional view taken along dashed-dotted line A-B in FIG. 8A is shown in FIG. 8B, and a cross-sectional view taken along dashed-dotted line C-D is shown in FIG. 8C. Note that in FIG. 8A, the substrate 11, the gate insulating film 17, the oxide film 31 containing In or Ga, the oxide semiconductor film 32, the protective film 26, and the like are omitted for simplicity.

The transistor 65 is different from the transistor 60 in that part of the pair of electrodes 21 and 22 is surrounded by the oxide semiconductor film 32 and the oxide film 33 containing In or Ga. Specifically, in the transistor 65, the oxide semiconductor film 32 is provided over the oxide film 31 containing In or Ga, the pair of electrodes 21 and 22 is provided over the oxide semiconductor film 32, and the oxide film 33 containing In or Ga is provided in contact with the oxide semiconductor film 32 and the pair of electrodes 21 and 22. Note that in the transistor 65, the stacked-layer structure of the other components is the same as the stacked-layer structure in the transistor 60.

The transistor 65 is a transistor in which the contact resistance between the multilayer film 34 and the pair of electrodes 21 and 22 is lower than that of the transistor 60 and the on-state current is improved as compared to the transistor 60 because the pair of electrodes 21 and 22 is in contact with the oxide semiconductor film 32.

Further, since the pair of electrode 21 and 22 is in contact with the oxide semiconductor film 32 in the transistor 65, the oxide film 33 containing In or Ga can be thickened without increase of the contact resistance between the multilayer film 34 and the pair of electrodes 21 and 22. Thus, it is possible to inhibit formation of a trap state, which occurs due to plasma damage at the time of forming the protective film 26, mixing of a constituent element of the protective film 26, or the like, in the vicinity of the interface between the oxide semiconductor film 32 and the oxide film 33 containing In or Ga. That is, the transistor 65 can achieve both improvement of on-state current and reduction of change in threshold voltage.

A method for manufacturing the transistor 65 is described with reference to FIGS. 9A to 9D. First, in a manner similar to that of FIG. 4A, the gate electrode 15 and the gate insulating film 17 are formed over the substrate 11 (see FIG. 9A).

Figure 9A:
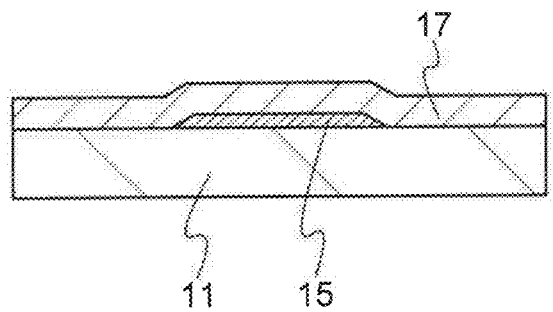
FIGS. 9A to 9D are cross-sectional views illustrating one embodiment of a method for manufacturing a transistor.
Figure 9B:
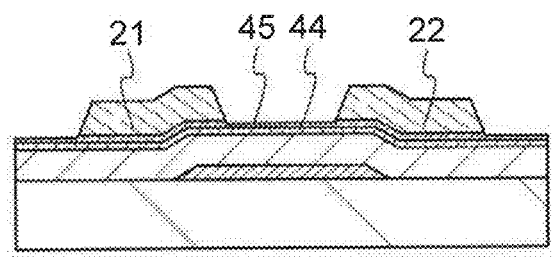

Next, an oxide film 44 containing In or Ga which is to be the oxide film 31 containing In or Ga and an oxide semiconductor film 45 which is to be the oxide semiconductor film 32 are successively formed, and then, the pair of electrodes 21 and 22 is formed (see FIG. 9B). A material and a formation method which are similar to those of the oxide film 19 containing In or Ga described in Embodiment 1 can be used for the oxide film 44 containing In or Ga as appropriate. A material and a formation method which are similar to those of the oxide semiconductor film 18 described in Embodiment 1 can be used for the oxide semiconductor film 45 as appropriate. Further, the pair of electrodes 21 and 22 can be formed in a manner similar to that of FIG. 4C. Note that the pair of electrodes 21 and 22 is formed over the oxide semiconductor film 45.

Next, an oxide film containing In or Ga which is to be the oxide film 33 containing In or Ga is formed to cover the oxide semiconductor film 45 which is to be the oxide semiconductor film 32 and the pair of electrodes 21 and 22. A material and a formation method which are similar to those of the oxide film 19 containing In or Ga described in Embodiment 1 can be used for the oxide film containing In or Ga as appropriate.

Figure 9C:
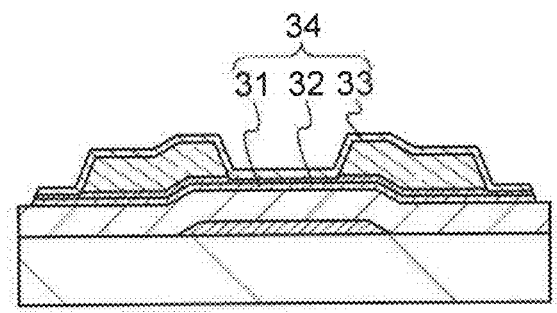
Figure 9D:
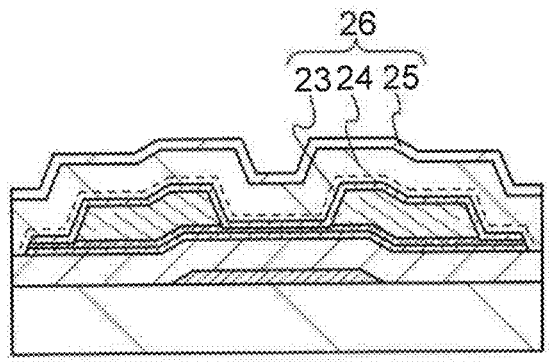

After that, the oxide film 44 containing In or Ga which is to be the oxide film 31 containing In or Ga, the oxide semiconductor film 45 which is to be the oxide semiconductor film 32, and the oxide film containing In or Ga which is to be the oxide film 33 containing In or Ga are each partly etched to form the multilayer film 34 including the oxide film 31 containing In or Ga, the oxide semiconductor film 32, and the oxide film 33 containing In or Ga (see FIG. 9C). Note that the etching can be implemented with the use of a mask after the mask is formed by a photolithography process over the oxide film containing In or Ga which is to be the oxide film 33 containing In or Ga.

Next, the protective film 26 is formed to cover the gate insulating film 17, the multilayer film 34, and the pair of electrodes 21 and 22. The protective film 26 can be formed in a manner similar to that in Embodiment 1 (see FIG. 9D). Further, in the method for manufacturing the transistor 65, heat treatment can be performed with reference to Embodiment 1 as appropriate.

Further, by the etching for forming the pair of electrodes 21 and 22, defects such as oxygen vacancies are generated in the oxide semiconductor film which is to be the oxide semiconductor film 32 and the carrier density is increased in some cases; therefore, before the oxide film containing In or Ga which is to be the oxide film 33 containing In or Ga is formed, the oxide semiconductor film is preferably exposed to plasma generated in an oxygen atmosphere so that oxygen is supplied to the oxide semiconductor film. Thus, in the transistor 65, formation of a trap state in the vicinity of the interface between the oxide semiconductor film 32 and the oxide film 33 containing In or Ga can be inhibited, and change in threshold voltage can be reduced. Further, in the transistor 65, leakage current that flows in the vicinity of the side surface of the oxide semiconductor film 32 in the multilayer film 34 can be reduced, and increase of off-state current can be inhibited.

Although the multilayer film 34 is damaged by etching for forming the pair of electrodes 21 and 22 and oxygen vacancies are generated on the back channel side of the multilayer film 34, the oxygen vacancies can be repaired by oxygen contained in the oxide insulating film 24 containing more oxygen than that in the stoichiometric composition. Accordingly, the reliability of the transistor 65 can be improved.

<Modification Example 3>

In the transistor 60 described in this embodiment, the stacked-layer structure of the multilayer film 34 and the pair of electrodes 21 and 22 may be changed as appropriate. For example, a transistor 66 as shown in FIGS. 10A to 10C can be given as a modification example.

Figure 10A:
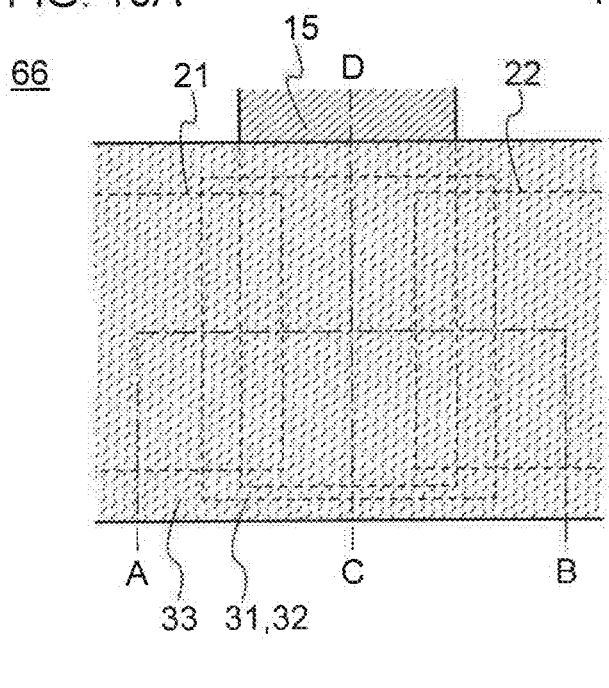
FIGS. 10A to 10C are a top view and cross-sectional views illustrating one embodiment of a transistor.
Figure 10C:
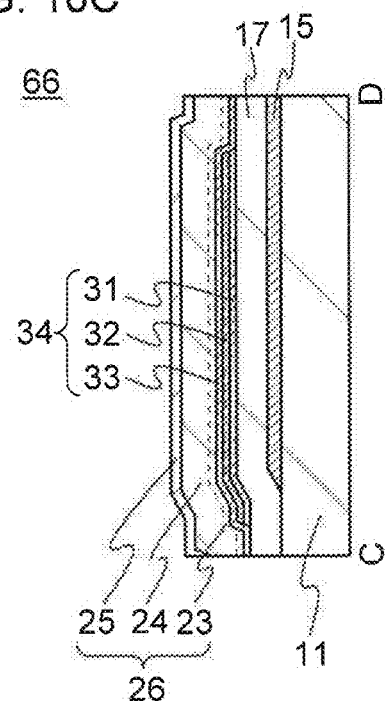
Figure 10B:
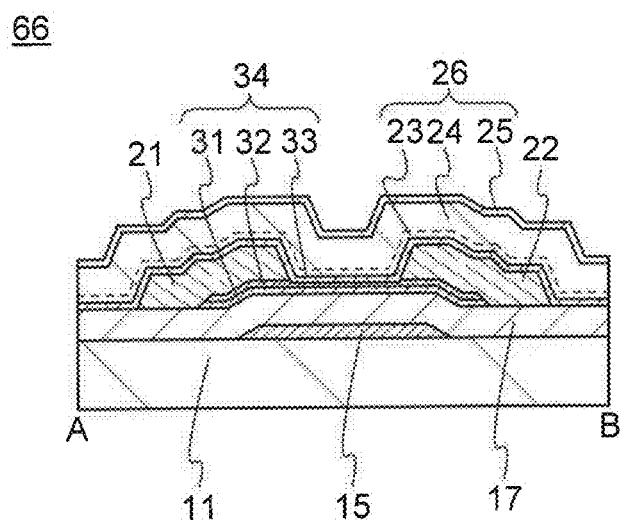

A top view of the transistor 66 is shown in FIG. 10A. A cross-sectional view taken along dashed-dotted line A-B in FIG. 10A is shown in FIG. 10B, and a cross-sectional view taken along dashed-dotted line C-D is shown in FIG. 10C. Note that in FIG. 10A, the substrate 11, the gate insulating film 17, the protective film 26, and the like are omitted for simplicity.

The transistor 66 is different from the transistor 60 in that the oxide film 33 containing In or Ga is formed over the gate insulating film 17, the pair of electrodes 21 and 22, and the oxide semiconductor film 32. Specifically, in the transistor 66, the oxide semiconductor film 32 is provided over the oxide film 31 containing In or Ga, the pair of electrodes 21 and 22 is provided to cover the oxide film 31 containing In or Ga and the oxide semiconductor film 32, and the oxide film 33 containing In or Ga is provided to cover the oxide film 31 containing In or Ga, the oxide semiconductor film 32, and the pair of electrodes 21 and 22. Note that in the transistor 66, the stacked-layer structure of the other components is the same as the stacked-layer structure of the transistor 60.

The transistor 66 is a transistor in which the contact resistance between the multilayer film 34 and the pair of electrodes 21 and 22 is low and the on-state current is improved as compared to the transistor 60 because the area of contact of the pair of electrodes 21 and 22 with the oxide semiconductor film 32 is larger than that in the transistor 60.

Further, since the area of contact of the pair of electrodes 21 and 22 with the oxide semiconductor film 32 is large in the transistor 66, the oxide film 33 containing In or Ga can be thickened without increase of the contact resistance between the multilayer film 34 and the pair of electrodes 21 and 22. Thus, it is possible to inhibit formation of a trap state, which occurs due to plasma damage at the time of forming the protective film 26, mixing of a constituent element of the protective film 26, or the like, in the vicinity of the interface between the oxide semiconductor film 32 and the oxide film 33 containing In or Ga. That is, the transistor 66 can achieve both improvement of on-state current and reduction of change in threshold voltage.

A method for manufacturing the transistor 66 is described with reference to FIGS. 11A to 11D. First, in a manner similar to that in FIG. 4A, the gate electrode and the gate insulating film 17 are formed over the substrate 11 (see FIG. 11A).

Next, the oxide film containing In or Ga which is to be the oxide film 31 containing In or Ga and the oxide semiconductor film which is to be the oxide semiconductor film 32 are successively formed, and a mask is provided over the oxide semiconductor film by a photolithography process, and etching is performed with the use of the mask to form the oxide film 31 containing In or Ga and the oxide semiconductor film 32. After that, the pair of electrodes 21 and 22 is formed to cover the edge portions of the oxide film 31 containing In or Ga and the oxide semiconductor film 32 (see FIG. 11B). Note that a material and a film formation method which are similar to those of the oxide film 19 containing In or Ga in Embodiment 1 can be used for the oxide film containing In or Ga as appropriate. A material and a film formation method which are similar to those of the oxide semiconductor film 18 in Embodiment 1 can be used for the oxide semiconductor film as appropriate. Further, the pair of electrodes 21 and 22 can be formed in a manner similar to that shown in FIG. 4C.

Figure 11A:
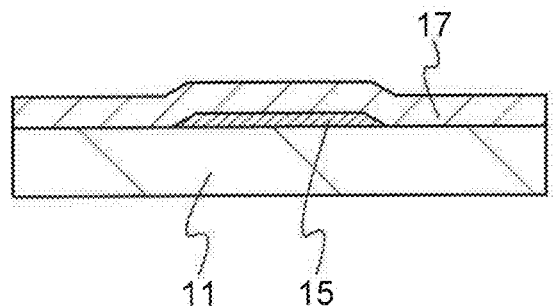
FIGS. 11A to 11D are cross-sectional views illustrating one embodiment of a method for manufacturing a transistor.
Figure 11B:
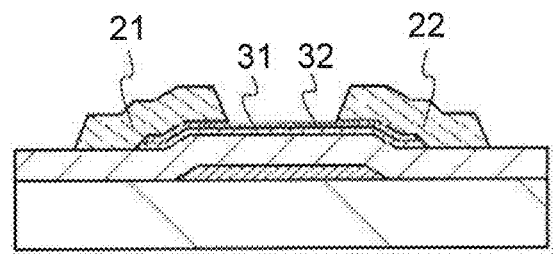
Figure 11C:
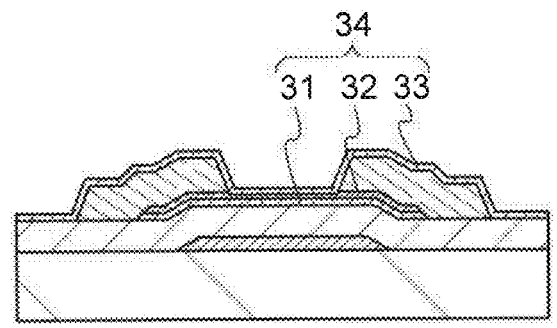
Figure 11D:
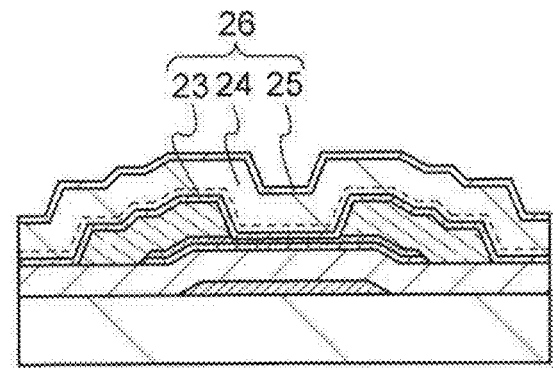

Next, the oxide film 33 containing In or Ga is formed to cover the oxide semiconductor film 32 and the pair of electrodes 21 and 22; thus, the multilayer film 34 is formed (see FIG. 11C). A material and a film formation method which are similar to those of the oxide film 19 containing In or Ga in Embodiment 1 can be used for the oxide film containing In or Ga as appropriate. Note that the oxide film 33 containing In or Ga may be processed by etching or the like using a mask formed by a photolithography process or the like as shown in FIG. 8B, or may remain the state when the film was formed.

Next, the protective film 26 is formed over the gate insulating film 17 and the oxide film 33 containing In or Ga. The protective film 26 can be formed in a manner similar to that in Embodiment 1 (see FIG. 11D). Further, in the method for manufacturing the transistor 66, heat treatment can be performed referring to Embodiment 1 as appropriate.

Further, by etching for forming the oxide film 31 containing In or Ga and the oxide semiconductor film 32, defects such as oxygen vacancies are generated in the side surface of the oxide semiconductor film 32 and carrier density is increased accordingly in some cases. Furthermore, by etching for forming the pair of electrodes 21 and 22, defects such as oxygen vacancies are generated in the surface of the oxide semiconductor film 32 and carrier density is increased accordingly in some cases. Therefore, after the oxide film 31 containing In or Ga and the oxide semiconductor film 32 are formed or/and after the pair of electrodes 21 and 22 is formed, the oxide semiconductor film 32 is preferably exposed to plasma generated in an oxygen atmosphere so that oxygen is supplied to the oxide semiconductor film 32.

Although the multilayer film 34 is damaged by etching for forming the pair of electrodes 21 and 22 and oxygen vacancies are generated on the back channel side of the multilayer film 34, the oxygen vacancies can be repaired by oxygen contained in the oxide insulating film 24 containing more oxygen than that in the stoichiometric composition. Accordingly, the reliability of the transistor 66 can be improved.

Thus, in the transistor 66, formation of a trap state in the side surface of the oxide semiconductor film 32 and in the vicinity of the interface between the oxide semiconductor film 32 and the oxide film 33 containing In or Ga can be inhibited, and change in threshold voltage can be reduced.

Further, in the transistor 66, the oxide film 33 containing In or Ga is provided to cover the side surfaces (the side surfaces in the channel length direction) of the oxide film 31 containing In or Ga and the oxide semiconductor film 32 (see FIG. 10C). Thus, leakage current that flows in the side surface of the oxide semiconductor film 32 can be reduced, and increase of off-state current can be inhibited.

Further, when the oxide film 31 containing In or Ga and the oxide semiconductor film 32 are formed (see FIG. 10B), in an etching step in which the oxide film 31 containing In or Ga is formed after the oxide semiconductor film 32 is formed, there may be a case where a reaction product is attached on the side surfaces of the oxide film 31 containing In or Ga and the oxide semiconductor film 32 to form an oxide film containing In or Ga (corresponding to the oxide film 35 containing In or Ga shown in FIG. 6D). In this case, the oxide film 33 containing In or Ga is formed to cover the oxide film containing In or Ga that covers the side surface of the oxide semiconductor film 32.

<Modification Example 4>

In the transistor 60 described in this embodiment, the stacked-layer structure of the multilayer film 34 and the pair of electrodes 21 and 22 may be changed as appropriate. For example, a transistor 67 as shown in FIGS. 12A to 12C can be given as a modification example.

A top view of the transistor 67 is shown in FIG. 12A. A cross-sectional view taken along dashed-dotted line A-B in FIG. 12A is shown in FIG. 12B, and a cross-sectional view taken along dashed-dotted line C-D is shown in FIG. 12C. Note that in FIG. 12A, the substrate 11, the gate insulating film 17, the protective film 26, and the like are omitted for simplicity.

In the transistor 67, the oxide film 33 containing In or Ga is provided to cover the pair of electrodes 21 and 22 and the edge portions of the oxide film 33 containing In or Ga are located over the pair of electrodes 21 and 22 in the transistor 66 shown in FIG. 10B. Note that in the transistor 67, the stacked-layer structure of the other components is the same as the stacked-layer structure of the transistor 66.

In the transistor 67, as shown in FIG. 12C, the oxide film 33 containing In or Ga is provided to cover the side surfaces of the oxide film 31 containing In or Ga and the oxide semiconductor film 32 on the side surfaces intersecting with the channel width direction. Thus, leakage current that flows in the side surface of the oxide semiconductor film 32 can be reduced, and increase of off-state current can be inhibited.

Note that the structures, methods, and the like described in this embodiment can be used as appropriate in combination with any of the structures, methods, and the like described in the other embodiments and examples.

Embodiment 3

In this embodiment, a transistor having a different structure from the transistors in Embodiment 1 and Embodiment 2 is described with reference to FIG. 13. A transistor 70 described in this embodiment includes a plurality of gate electrodes facing each other with an oxide semiconductor film provided therebetween.

Figure 13:
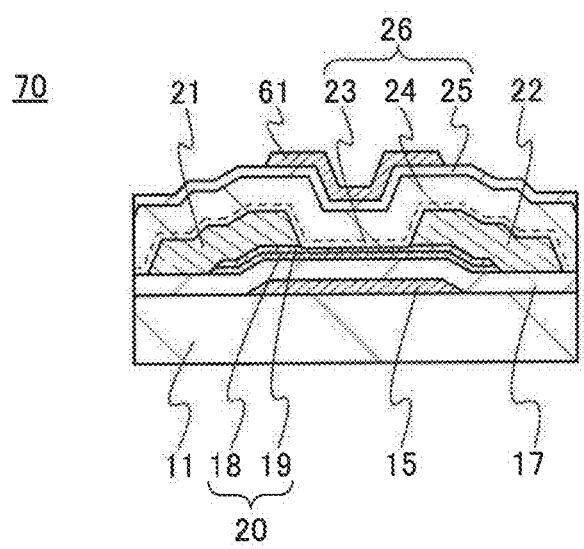
FIG. 13 is a cross-sectional view illustrating one embodiment of a transistor.

The transistor 70 shown in FIG. 13 includes the gate electrode 15 provided over the substrate 11. Further, the gate insulating film 17 is formed over the substrate 11 and the gate electrode 15, and the multilayer film 20 overlapping with the gate electrode 15 with the gate insulating film 17 provided therebetween, and the pair of electrodes 21 and 22 in contact with the multilayer film 20 are included. Note that the multilayer film 20 includes the oxide semiconductor film 18 and the oxide film 19 containing In or Ga. Furthermore, the protective film 26 including the oxide insulating film 23, the oxide insulating film 24, and the nitride insulating film 25 is formed over the gate insulating film 17, the multilayer film 20, and the pair of electrodes 21 and 22. Still furthermore, a gate electrode 61 overlapping with the multilayer film 20 with the protective film 26 provided therebetween is included.

The gate electrode 61 can be formed in a manner similar to that of the gate electrode 15 in Embodiment 1.

The transistor 70 described this embodiment has the gate electrode 15 and the gate electrode 61 facing each other with the multilayer film 20 provided therebetween. By applying different potentials to the gate electrode 15 and the gate electrode 61, the threshold voltage of the transistor 70 can be controlled.

Further, when the multilayer film 20 having the oxide semiconductor film 18 in which the number of oxygen vacancies is reduced is included, the electrical characteristics of the transistor can be improved. Further, the transistor in which the amount of change in threshold voltage is small and which is highly reliable is obtained.

Although the oxide semiconductor film which is described in the above embodiments can be formed by a sputtering method, such film may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The oxide semiconductor film which is described in the above embodiments can be formed by a thermal CVD method such as a MOCVD method or an ALD method. For example, in the case where an InGaZnO$_X$ (X>0) film is formed, trimethylindium, trimethylgallium, and diethylzinc are used. Note that the chemical formula of trimethylindium is (CH$_3$)$_3$In. The chemical formula of trimethylgallium is (CH$_3$)$_3$Ga. The chemical formula of diethylzinc is (CH$_3$)$_2$Zn. Without limitation to the above combination, triethylgallium (chemical formula: (C$_2$H$_5$)$_3$Ga) can be used instead of trimethylgallium and dimethylzinc (chemical formula: (C$_2$H$_5$)$_2$Zn) can be used instead of diethylzinc.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Instead of an In(CH$_3$)$_3$ gas, an In(C$_2$H$_5$)$_3$ may be used. Furthermore, a Zn(CH$_3$)$_2$ gas may be used.

Note that the structures, methods, and the like described in this embodiment can be used as appropriate in combination with any of the structures, methods, and the like described in the other embodiments and examples.

Embodiment 4

In this embodiment, one embodiment which can be applied to an oxide semiconductor film in the transistor included in the semiconductor device described in the above embodiment is described.

The oxide semiconductor film can be formed using any of an amorphous oxide semiconductor, a single crystal oxide semiconductor, and a polycrystalline oxide semiconductor. Alternatively, the oxide semiconductor film may be formed using an oxide semiconductor including a crystalline portion (CAAC-OS).

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

There are three methods for forming a CAAC-OS film.

The first method is to form an oxide semiconductor film at a temperature higher than or equal to 150° C. and lower than or equal to 500° C., preferably higher than or equal to 150° C. and lower than or equal to 450° C., more preferably higher than or equal to 200° C. and lower than or equal to 350° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

In a transistor using the CAAC-OS for an oxide semiconductor film, variations in electric characteristics of the transistor due to irradiation with visible light or ultraviolet light is small. Thus, the transistor using the CAAC-OS for the oxide semiconductor film has high reliability.

For example, the CAAC-OS is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface on which the CAAC-OS is formed while maintaining its crystal state, whereby the CAAC-OS can be deposited.

For the deposition of the CAAC-OS, the following conditions are preferably employed.

By reducing the number of impurities entering the CAAC-OS during the deposition, the crystal state can be inhibited from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the heating temperature of the surface on which the CAAC-OS is formed (e.g., the substrate heating temperature) during the deposition, migration of a sputtered particle is likely to occur after the sputtered particle reaches the surface on which the CAAC-OS is formed. Specifically, the temperature of the surface on which the CAAC-OS is formed during the deposition is higher than or equal to 100° C. and lower than or equal to 740° C., preferably higher than or equal to 200° C. and lower than or equal to 500° C. By increasing the temperature of the surface on which the CAAC-OS is formed during the deposition, when the flat-plate-like or pellet-like sputtered particle reaches the surface on which the CAAC-OS is formed, migration occurs on the surface on which the CAAC-OS is formed, so that a flat plane of the sputtered particle is attached to the surface on which the CAAC-OS is formed.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn-based compound target is described below.

The polycrystalline In—Ga—Zn-based compound target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 3:1:2, 1:3:2, 1:6:4, or 1:9:6. The kinds of powder and the molar ratio for mixing powder may be determined as appropriate depending on the desired sputtering target.

Note that the structures, methods, and the like described in this embodiment can be used as appropriate in combination with any of the structures, methods, and the like described in the other embodiments and examples.

Embodiment 5

A semiconductor device (also referred to as a display device) having a display function can be manufactured using the transistor examples of which are shown in the above embodiments. Moreover, some or all of the driver circuits which include the transistor can be formed over a substrate where the pixel portion is formed, whereby a system-on-panel can be obtained. In this embodiment, an example of a display device using the transistor examples of which are shown in the above embodiments is described with reference to FIGS. 14A to 14C and FIGS. 15A and 15B. FIGS. 15A and 15B are cross-sectional views illustrating cross-sectional structures taken along dashed-dotted line M-N in FIG. 14B.

Figure 14A:
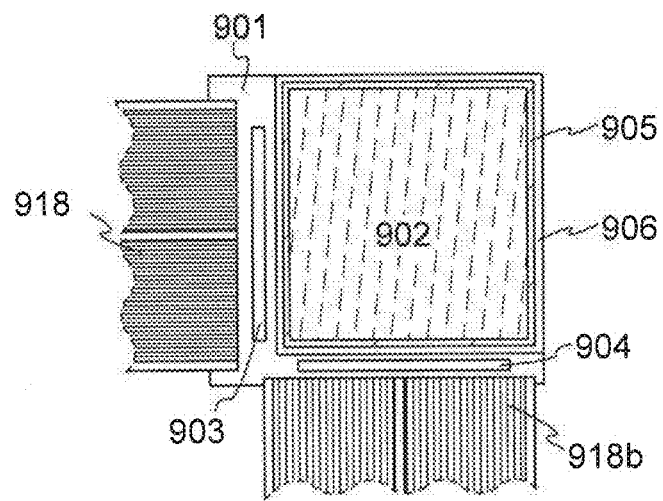
FIGS. 14A to 14C are top views each illustrating one embodiment of a semiconductor device.

In FIG. 14A, a sealant 905 is provided so as to surround a pixel portion 902 provided over a first substrate 901, and the pixel portion 902 is sealed with a second substrate 906. In FIG. 14A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from a flexible printed circuit (FPC) 918.

Figure 14B:
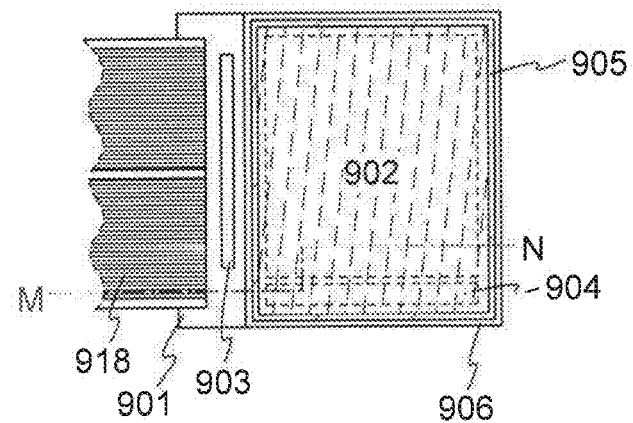
Figure 14C:
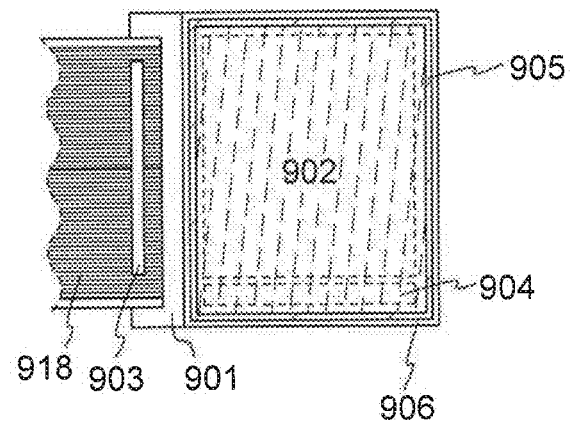

In FIGS. 14B and 14C, the sealant 905 is provided so as to surround the pixel portion 902 and the scan line driver circuit 904 which are provided over the first substrate 901.

The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 14B and 14C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 14B and 14C, various signals and potentials are supplied to the signal line driver circuit 903, the scan line driver circuit 904, and the pixel portion 902 from an FPC 918.

Although FIGS. 14B and 14C each show an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 14A shows an example in which the signal line driver circuit 903 and the scan line driver circuit 904 are mounted by a COG method. FIG. 14B shows an example in which the signal line driver circuit 903 is mounted by a COG method. FIG. 14C shows an example in which the signal line driver circuit 903 is mounted by a TAB method.

The display device includes in its category a panel in which a display element is sealed and a module in which an IC including a controller or the like is mounted on the panel.

A display device in this specification refers to an image display device or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be used.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used. FIG. 15A illustrates an example of a liquid crystal display device using a liquid crystal element as the display element and FIG. 15B illustrates an example of a light-emitting display device using a light-emitting element as the display element.

As illustrated in FIGS. 15A and 15B, the display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a pair of electrodes in each of a transistor 910 and a transistor 911.

Each of the pixel portion 902 and the scan line driver circuit 904 which are provided over the first substrate 901 includes a plurality of transistors. FIGS. 15A and 15B illustrate the transistor 910 included in the pixel portion 902 and the transistor 911 included in the scan line driver circuit 904. In FIG. 15A, an insulating film 924 is provided over each of the transistor 910 and the transistor 911, and in FIG. 15B, a planarization film 921 is further provided over the insulating film 924. Note that as a multilayer film 926 including an oxide semiconductor film in each of the transistors 910 and 911, the multilayer film 20 including an oxide semiconductor film described in Embodiment 1 or the multilayer film 34 including an oxide semiconductor film described in Embodiment 2 can be used as appropriate. As the insulating film 924, the protective film 26 described in Embodiment 1 can be used as appropriate. The insulating film 923 is an insulating film serving as a base film.

In this embodiment, any of the transistors described in the above embodiments can be used as the transistor 910 and the transistor 911 as appropriate. Any of the transistors described in Embodiment 1 to Embodiment 3 is used as the transistors 910 and 911, whereby a display device with high image quality can be fabricated.

Moreover, FIG. 15B shows an example in which a conductive film 917 is provided over the planarization film 921 so as to overlap with a channel region of the multilayer film 926 of the transistor 911 for the driver circuit. In this embodiment, the conductive film 917 is formed using the conductive film which is used as the first electrode 930. By providing the conductive film 917 so as to overlap with the channel region of the multilayer film 926, the amount of change in the threshold voltage of the transistor 911 between before and after a BT stress test can be further reduced. The conductive film 917 may have the same potential as or a potential different from that of the gate electrode of the transistor 911, and the conductive film 917 can serve as a second gate electrode. The potential of the conductive film 917 may be GND, 0 V, in a floating state, or the same potential or substantially the same potential as the minimum potential (Vss; for example, the potential of the source electrode in the case where the potential of the source electrode is a reference potential) of the driver circuit.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent a change in electrical characteristics of the transistor due to the influence of an external electric field such as static electricity. The conductive film 917 can be used for any of the transistors described in the above embodiments.

In the display panel, the transistor 910 included in the pixel portion 902 is electrically connected to a display element. There is no particular limitation on the kind of the display element as long as display can be performed, and various kinds of display elements can be used.

In FIG. 15A, a liquid crystal element 913 which is a display element includes the first electrode 930, a second electrode 931, and a liquid crystal layer 908. Note that an insulating film 932 and an insulating film 933 which serve as alignment films are provided so that the liquid crystal layer 908 is provided therebetween. The second electrode 931 is provided on the second substrate 906 side. The second electrode 931 overlaps with the first electrode 930 with the liquid crystal layer 908 provided therebetween.

A spacer 935 is a columnar spacer obtained by selective etching of an insulating film and is provided in order to control the distance between the first electrode 930 and the second electrode 931 (a cell gap). Alternatively, a spherical spacer may be used.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used for the liquid crystal layer in order to improve the temperature range. The liquid crystal composition which includes a liquid crystal showing a blue phase and a chiral material has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be increased.

The first substrate 901 and the second substrate 906 are fixed in place by the sealant 925. As the sealant 925, an organic resin such as a thermosetting resin or a photocurable resin can be used.

Further, the transistor including an oxide semiconductor film used in the above embodiments has excellent switching characteristics. Furthermore, relatively high field-effect mobility is obtained, which enables high-speed operation. Consequently, when the above transistor is used in a pixel portion of a semiconductor device having a display function, high-quality images can be obtained. Since a driver circuit portion and the pixel portion can be formed over one substrate with the use of the above transistor, the number of components of the semiconductor device can be reduced.

The size of storage capacitor formed in the liquid crystal display device is set considering the leakage current of the transistor provided in the pixel portion or the like so that charge can be held for a predetermined period. By using the transistor including the highly-purified oxide semiconductor film, it is enough to provide a storage capacitor having a capacitance that is ⅓ or less, preferably ⅕ or less of a liquid crystal capacitance of each pixel; therefore, the aperture ratio of a pixel can be increased.

In the display device, a black matrix (a light-blocking film), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be used. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. One embodiment of the present invention is not limited to the application to a display device for color display but can also be applied to a display device for monochrome display.

In FIG. 15B, a light-emitting element 963 which is a display element is electrically connected to the transistor 910 provided in the pixel portion 902. Note that although the structure of the light-emitting element 963 is a stacked-layer structure of the first electrode 930, a light-emitting layer 961, and the second electrode 931, the structure is not limited thereto. The structure of the light-emitting element 963 can be changed as appropriate depending on the direction in which light is extracted from the light-emitting element 963, or the like.

A partition wall 960 can be formed using an organic insulating material or an inorganic insulating material. It is particularly preferred that the partition wall 960 be formed using a photosensitive resin material to have an opening over the first electrode 930 so that a sidewall of the opening has an inclined surface with a continuous curvature.

The light-emitting layer 961 may be formed to have a single-layer structure or a stacked-layer structure including a plurality of layers.

A protective layer may be formed over the second electrode 931 and the partition wall 960 in order to prevent oxygen, hydrogen, moisture, carbon dioxide, or the like from entering the light-emitting element 963. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, in a space which is sealed with the first substrate 901, the second substrate 906, and a sealant 936, a filler 964 is provided and sealed. It is preferred that, in this manner, the light-emitting element be packaged (sealed) with a protective film (such as a laminate film or an ultraviolet curable resin film) or a cover material with high air-tightness and little degasification so that the panel is not exposed to the outside air.

As the sealant 936, an organic resin such as a thermosetting resin or a photocurable resin, fritted glass including low-melting glass, or the like can be used. The fritted glass is preferred because of its high barrier property against impurities such as water and oxygen. Further, in the case where the fritted glass is used as the sealant 936, as illustrated in FIG. 15B, the fritted glass is provided over the insulating film 924, whereby adhesion of the insulating film 924 to the fritted glass becomes high, which is preferable.

As the filler 964, as well as an inert gas such as nitrogen or argon, an ultraviolet curable resin or a thermosetting resin can be used: polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Alternatively, the first electrode 930 and the second electrode 931 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The first electrode 930 and the second electrode 931 can be formed using a conductive composition including a conductive macromolecule (also referred to as a conductive polymer). As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferred to be provided. The protection circuit is preferred to be formed using a nonlinear element.

As described above, by using any of the transistors described in the above embodiments, a highly reliable semiconductor device having a display function can be provided.

Note that the structures, methods, and the like described in this embodiment can be used as appropriate in combination with any of the structures, methods, and the like described in the other embodiments and examples.

Embodiment 6

In this embodiment, a display device (also referred to as a touch panel) provided with a touch sensor (a contact detection device) is described below.

Figure 16:
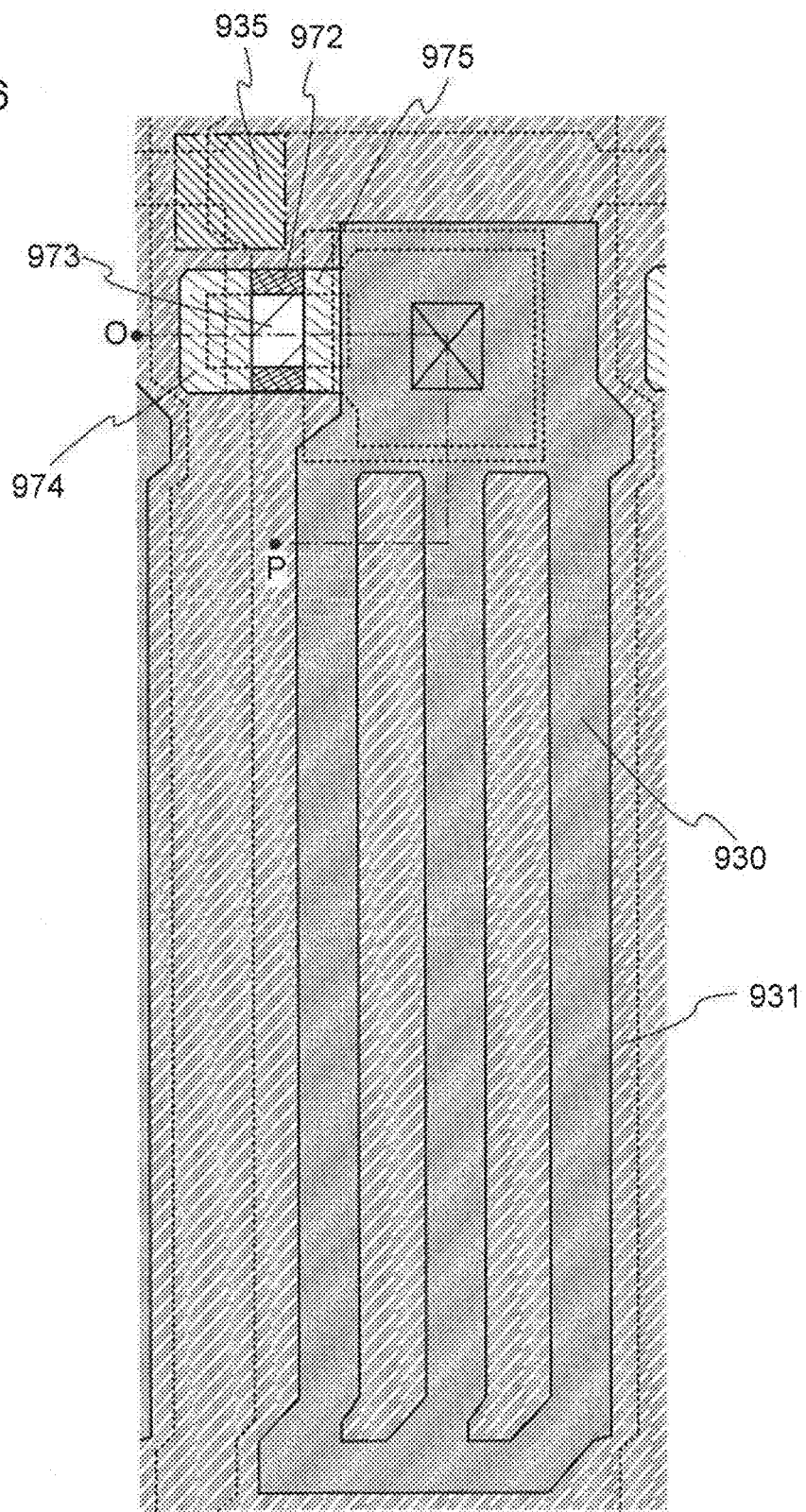
FIG. 16 is a top view illustrating one embodiment of a semiconductor device.

FIG. 16 is a top view illustrating a structural example of a pixel portion of a display device 900. FIG. 17 is a cross-sectional view taken along dashed-dotted line O-P in FIG. 16. Note that in FIG. 16, some components are not illustrated for clarity. Further, in this embodiment, the reference numerals used in Embodiment 5 are used as appropriate.

The pixel portion includes at least the transistor 910, a scan line part of which functions as a gate electrode 972, a signal line part of which functions as one electrode 974 of a pair of electrodes 974 and 975, the first electrode 930, the second electrode 931, and the spacer 935 (see FIG. 16).

The transistor 910 includes the gate electrode 972, a gate insulating film 976, the multilayer film 926, the pair of electrodes 974 and 975, and the insulating film 924. The gate electrode 972 is provided over the insulating film 923 serving as a base film over the first substrate 901. The gate insulating film 976 is provided over the gate electrode 972, the multilayer film 926 is provided over the gate insulating film 976 to overlap with the gate electrode 972, the pair of electrodes 974 and 975 is provided over the multilayer film 926, and the insulating film 924 is provided over the multilayer film 926 and the pair of electrodes 974 and 975 (see FIG. 17).

Further, an organic resin film 945 is provided over the insulating film 924. The second electrode 931 serving as a common electrode is provided over the organic resin film 945. An insulating film 937 is provided over the organic resin film 945 and the second electrode 931. An opening reaching the electrode 975 is formed in the insulating film 924, the insulating film 937, and the organic resin film 945, and the first electrode 930 serving as a pixel electrode is provided in the opening and over the insulating film 937 (see FIG. 17). That is, the first electrode 930 serving as a pixel electrode is electrically connected to one of the pair of electrodes 974 and 975.

Further, the insulating film 932 serving as an alignment film is provided over the insulating film 937 and the first electrode 930 serving as a pixel electrode. The insulating film 933 serving as an alignment film is provided on a surface of the second substrate 906, which faces the first substrate 901, and the liquid crystal layer 908 is provided between the insulating film 932 and the insulating film 933 serving as alignment films. In addition to the above components, an optical member may be provided as appropriate. For example, a polarization plate can be provided on the outer side of each of the first substrate 901 and the second substrate 906.

The display device 900 includes a capacitive sensor as a touch sensor. An electrode 941 is provided on the outer side of the second substrate 906. Note that the polarization plate provided on the outer side of the second substrate 906 is provided between the electrode 941 and the second substrate 906.

The second electrode 931 which is on the first substrate 901 side and serves as a common electrode serves as a common electrode of a pixel and one electrode of a capacitor of a touch sensor. The electrode 941 functions as the other electrode of the capacitor of the touch sensor. Further, a pixel portion of the display device 900 applies a pixel structure of the FFS mode; thus, a conductive film is not formed on the second substrate 906 side, so that the electrode 941 functions as a conductor for preventing the second substrate 906 from being charged with electricity.

The transistor 910 can be formed using a material and a method similar to those of the transistor 50 described in Embodiment 1. That is, the gate electrode 972, the gate insulating film 976, the multilayer film 926, the pair of electrodes 974 and 975, and the insulating film 924 can be formed using a material and a method similar to those of the gate electrode 15, the gate insulating film 17, the multilayer film 20, the pair of electrodes 21 and 22, and the protective film 26, respectively, of the transistor 50 described in Embodiment 1.

Further, one of or both the signal line driver circuit and the scan line driver circuit of the display device 900 can be formed by using a manufacturing process of the transistor 910. For example, a transistor and a diode which are included in one of or both the signal line driver circuit and the scan line driver circuit, and a lead wiring provided in a terminal portion connected to an FPC and the like, can be formed.

The organic resin film 945 can be formed using a material and a method applicable to the planarization film 921 or the partition wall 960 which are described in Embodiment 5. The insulating film 937 can be formed using a material and a method applicable to an insulating film (such as the gate insulating film 976 and the insulating film 924) included in the transistor 910.

One electrode 975 of the pair of electrodes 974 and 975 is in contact with the first electrode 930 serving as a pixel electrode through the opening formed in the insulating film 924, the insulating film 937, and the organic resin film 945. The opening can be formed by forming a resist mask through a photolithography process or the like and etching the insulating film 937 and the organic resin film 945 with the use of the resist mask. Specifically, the opening is formed through an etching process of part of the insulating film 924 and part of the organic resin film 945 and an etching process of part of the insulating film 937.

Figure 18A:
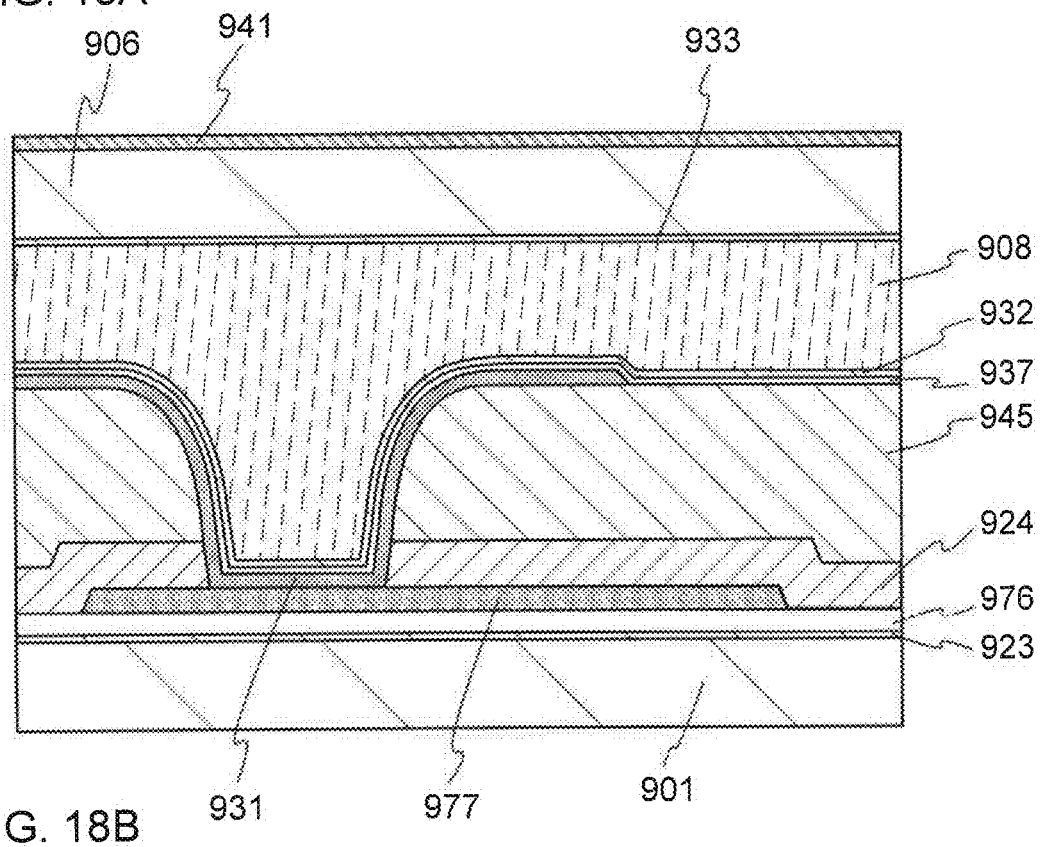
FIGS. 18A and 18B are diagrams illustrating one example of a connection structure of a common electrode of a display device and one example of a connection structure of a wiring of a display device.

FIG. 18A shows a cross-sectional view of one example of a connection structure in which the second electrode 931 serving as a common electrode is connected to a wiring 977 which is electrically connected to the pair of electrodes 974 and 975. The wiring 977 is in contact with the second electrode 931 serving as a common electrode through an opening formed in the insulating film 924 and the organic resin film 945. With such a structure, potential can be supplied to the second electrode 931 serving as a common electrode by supplying potential to the wiring 977. Note that the wiring 977 can be formed by using a manufacturing process of the pair of electrodes 974 and 975.

Figure 18B:
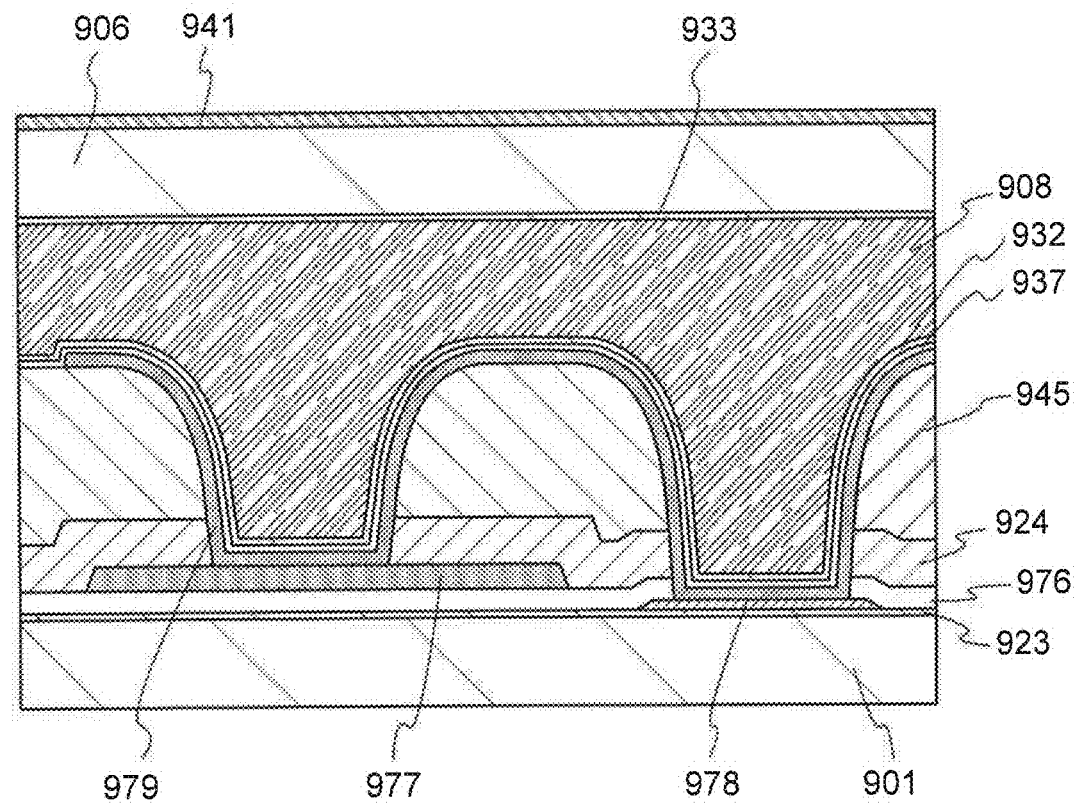

FIG. 18B shows a cross-sectional view of one example of a connection structure of a wiring in a terminal portion connected to an FPC and the like. An electrode 979 is in contact with the wiring 977 through an opening formed in the insulating film 924 and the organic resin film 945, and is in contact with the wiring 978 through an opening formed in the gate insulating film 976, the insulating film 924, and the organic resin film 945. With such a structure, potential can be supplied to the wiring 977 by supplying potential to the wiring 978. Note that the wiring 978 can be formed by using a manufacturing process of the gate electrode 972.

As illustrated in FIG. 18B, the wiring 977 is connected to the wiring 978 through the electrode 979, whereby the number of photomasks can be reduced by one as compared to the case where a connection portion in which the wiring 977 is directly in contact with the wiring 978 is formed. It is because, in order to have a connection structure in which the wiring 977 is directly in contact with the wiring 978, a photomask for forming a contact hole in the gate insulating film 976 is needed before the pair of electrodes 974 and 975 is formed; however, the photomask is not needed for the connection structure in FIG. 18B.

Figure 19:
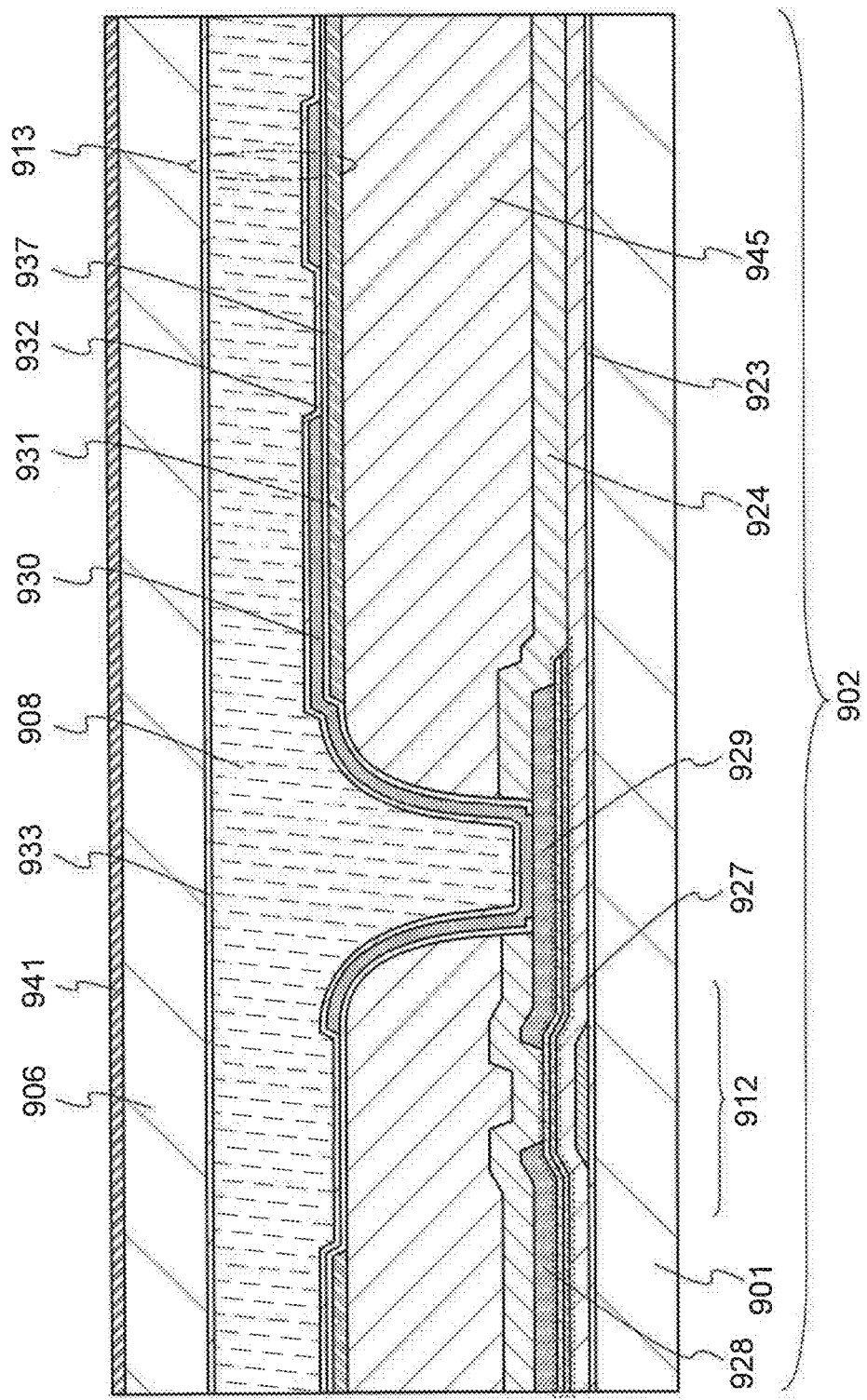
FIG. 19 is a cross-sectional view illustrating one embodiment of a semiconductor device.

Further, instead of the transistor 910 illustrated in FIG. 17, a transistor 912 illustrated in FIG 19 is formed using a multi-tone mask, whereby the number of photomasks can be reduced. The multi-tone mask is a mask capable of light exposure with multi-level light intensity, and typically, light exposure is performed with three levels of light intensity to provide an exposed region, a half-exposed region, and an unexposed region. By one light exposure and development step with the use of the multi-tone mask, a resist mask with plural thicknesses (typically, two kinds of thicknesses) can be formed. Therefore, by the usage of the multi-tone mask, the number of photomasks can be reduced. Specifically, the multi-tone mask is used in a forming process of the multilayer film 927 and the pair of electrodes 928 and 929, whereby the one photomask can be cut. With the multi-tone mask, end portions of the multilayer film 927 are positioned on the outer side than end portions of the pair of electrodes 928 and 929.

Figure 20:
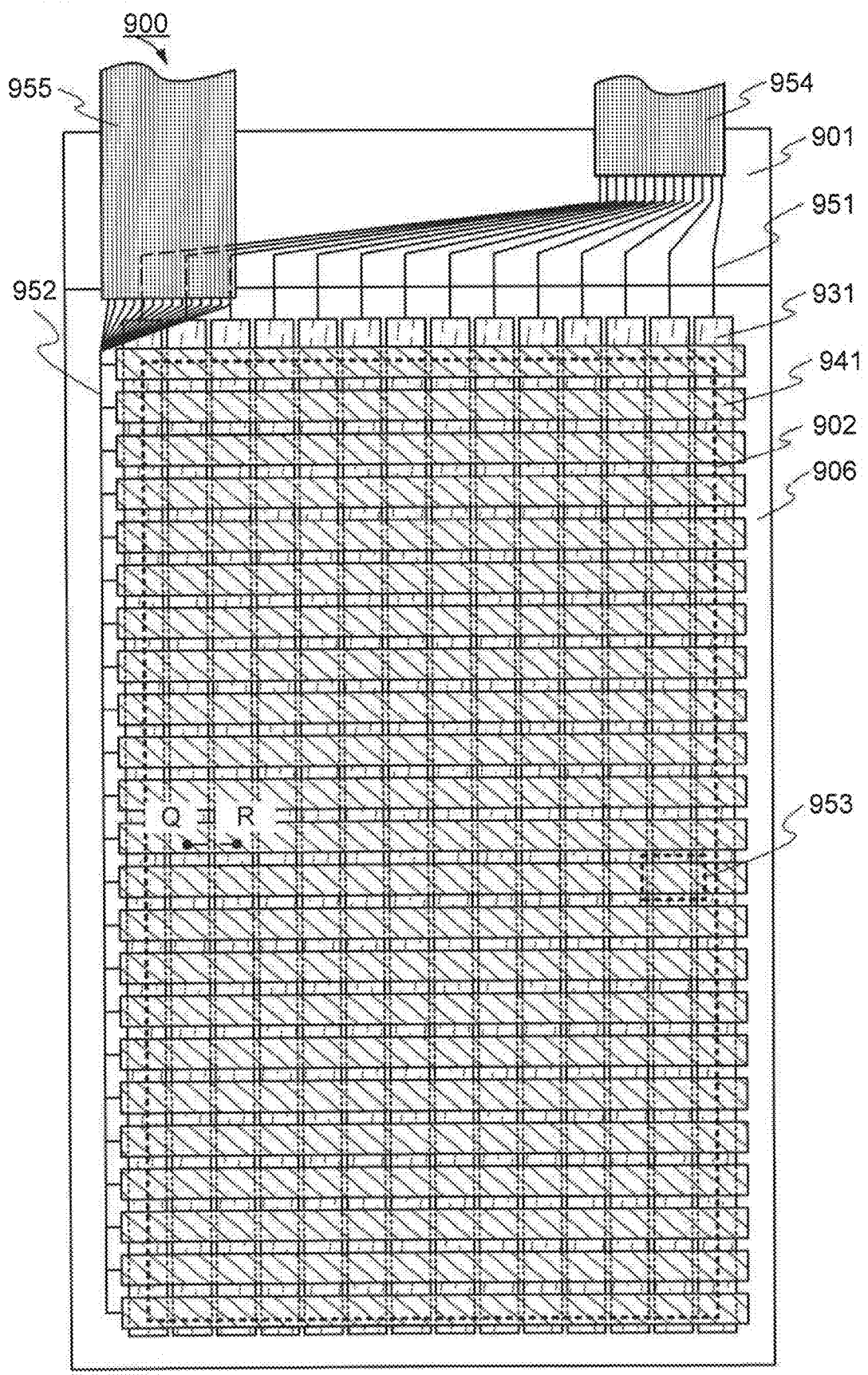
FIG. 20 is a top view illustrating one embodiment of a semiconductor device.

FIG. 20 is a plan view showing a structural example of the second electrode 931 serving as a common electrode and the electrode 941 which are included in the display device 900. As illustrated in FIG. 20, the second electrode 931 serving as a common electrode and the electrode 941 each have a stripe shape, and are provided so as to be perpendicular to each other in a plane. Each second electrode 931 serving as a common electrode is connected to an FPC 954 attached to the substrate 901, through a lead wiring 951, and each electrode 941 is connected to an FPC 955 attached to the substrate 906, through a lead wiring 952.

Figure 21A:
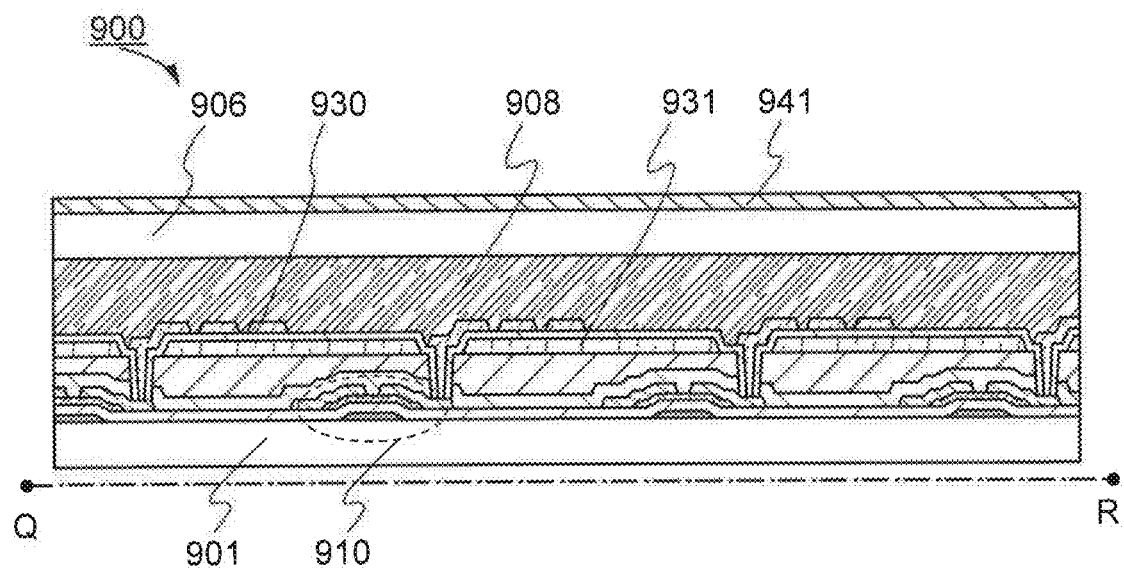
FIGS. 21A and 21B are a top view and a cross-sectional view illustrating one embodiment of a semiconductor device.
Figure 21B:
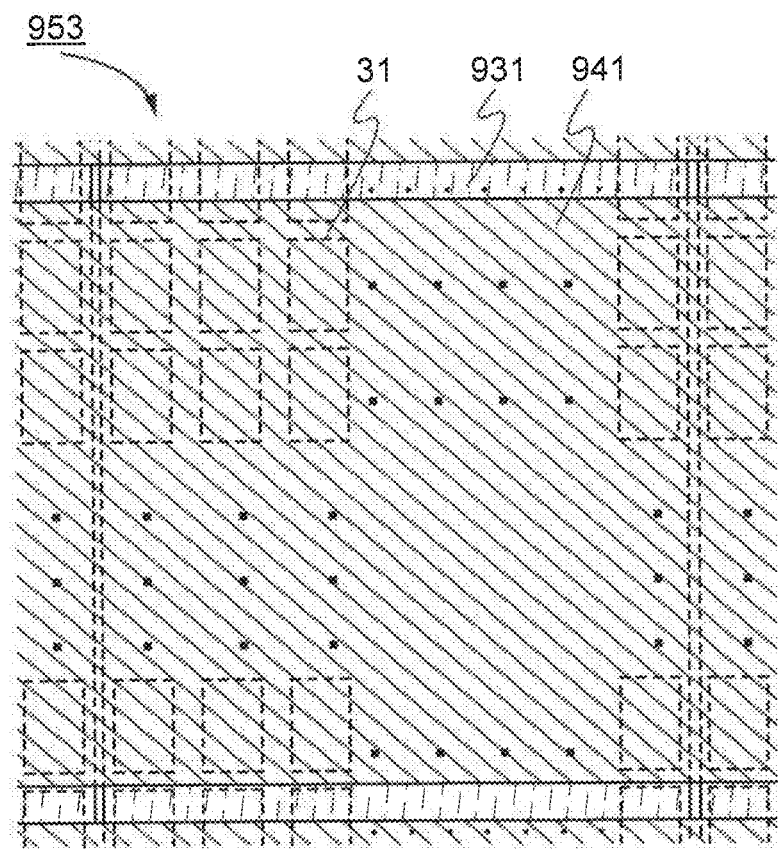

FIG. 21A is a cross-sectional view taken along dashed-dotted line Q-R in FIG. 20 and FIG. 21B is a plan view of a region 953 in FIG. 20. As illustrated in FIG. 21A, the second electrode 931 serving as a common electrode is provided in common in a plurality of pixels, and the first electrode 930 serving as a pixel electrode is provided in each of the pixels and connected to the transistor 910. An electrostatic capacitor of a touch sensor is formed in a region where the second electrode 931 serving as a common electrode and the electrode 941 intersect with each other. The electrostatic capacitor is composed of the second electrode 931 serving as a common electrode, the electrode 941, and a dielectric provided between the second electrode 931 serving as a common electrode and the electrode 941. The second electrode 931 serving as a common electrode is an electrode for supplying potential to the electrostatic capacitor. The electrode 941 is an electrode for extracting current flowing in the electrostatic capacitor.

An operation of the display device 900 can be roughly divided into a display operation in which an image signal is input to the pixel and a sensing operation in which a touch is detected. In the display operation, potential of the second electrode 931 serving as a common electrode is fixed at a low level. In a sensing period, pulse signals are sequentially applied to each second electrode 931 serving as a common electrode and the potential is a high level. At this time, if a finger is touching the display device 900, a capacitance formed by the touch with the finger is applied to the electrostatic capacitor of the touch sensor; thus, current flowing in the capacitor is changed and the potential of the electrode 941 is changed. The electrodes 941 are sequentially scanned and the change in the potential of the electrode 941 is detected, whereby the location of the touch with the finger is detected.

As described above, in a display device including a liquid crystal element, as an electrode forming electrostatic capacity of the display device 900, a common electrode of the pixel and the conductor for preventing charge with electricity originally provided in a liquid crystal device of the FFS mode can be used; thus, a touch panel that is light and thin and with a high display quality can be provided.

Here, the second electrode 931 serving as a common electrode is provided below the first electrode 930 serving as a pixel electrode (on the first substrate 901 side); however, the second electrode 931 serving as a common electrode can be provided over the first electrode 930 serving as a pixel electrode.

Note that as the structure of the display device, a structure except the display device 900 described in this embodiment may be used. For example, an externally attached touch panel can be employed, in which electrostatic capacity is formed and a touch panel substrate is attached to the first substrate 901 side or the second substrate 906 side of a liquid crystal display device or a light-emitting display device. Further, with a conductive film which is attached outside the first substrate 901 or the second substrate 906 to prevent build-up of static electricity, a surface capacitive touch sensor can be formed. Hereinafter, a structural example of the touch sensor which is applied to the externally attached touch panel is described with reference to FIGS. 22A to 22C and FIGS. 23A and 23B.

Figure 22A:
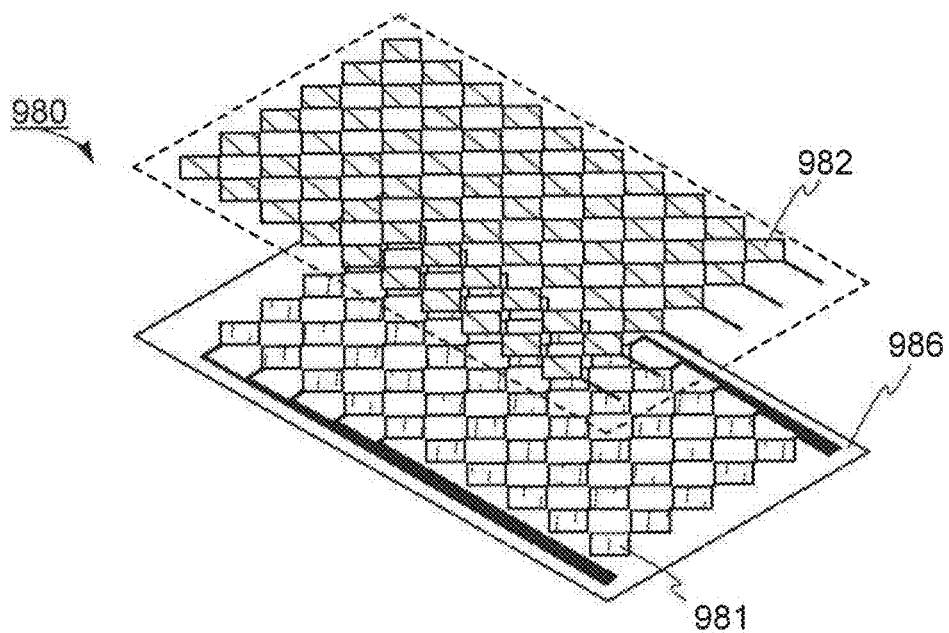
FIGS. 22A to 22C are an exploded perspective view and top views showing an example of a structure of a touch sensor.
Figure 22B:
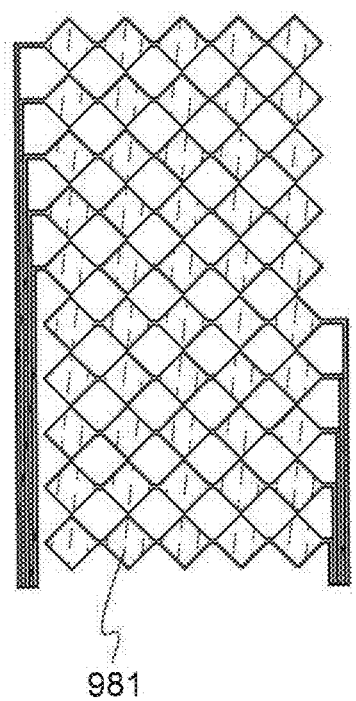
Figure 22C:
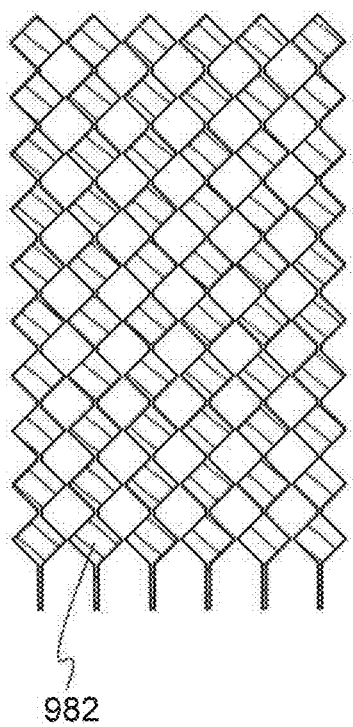

FIG. 22A is an exploded perspective view showing a structural example of the touch sensor, FIG. 22B is a plan view showing a structural example of an electrode 981 of the touch sensor, and FIG. 22C is a plan view showing a structural example of an electrode 982 of the touch sensor.

As illustrated in FIGS. 22A to 22C, in a touch sensor 980, a plurality of electrodes 981 arranged in the X-axis direction and a plurality of electrodes 982 arranged in the Y-axis direction which intersects with the X-axis direction are formed over a substrate 986.

The electrodes 981 and the electrodes 982 each have a structure in which a plurality of quadrangular conductive films is connected to each other. The plurality of electrodes 981 and the plurality of electrodes 982 are each provided so that the quadrangular conductive films are not overlapped with each other. In a portion where the electrode 981 and the electrode 982 intersect with each other, an insulating film is provided between the electrode 981 and the electrode 982 so that the electrode 981 and the electrode 982 are not in contact with each other.

Figure 23A:
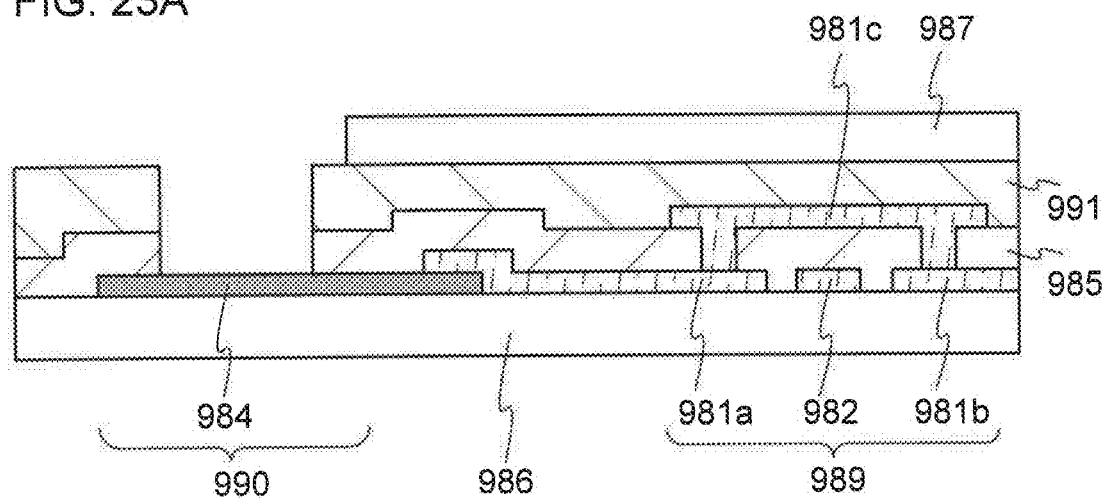
FIGS. 23A and 23B are a cross-sectional view and a circuit diagram showing an example of a structure of a touch sensor.
Figure 23B:
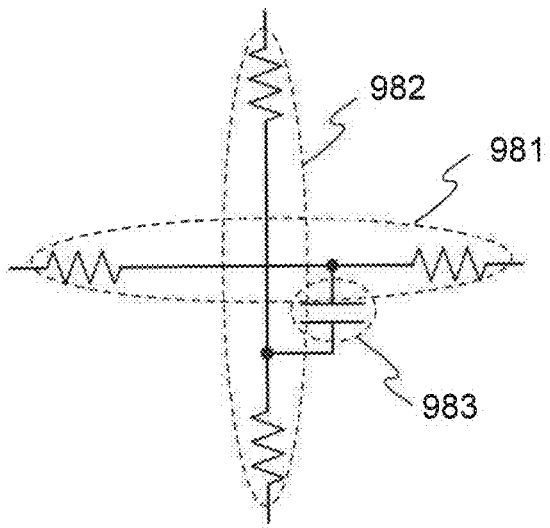

FIG. 23A is a cross-sectional view illustrating an example of connection structures of the electrode 981 and the electrode 982 and shows a cross-sectional view of a portion where the electrodes 981 and 982 intersect with each other as an example. FIG. 23B is an equivalent circuit diagram of the portion where the electrodes 981 and 982 intersect with each other. As illustrated in FIG. 23B, in the portion where the electrodes 981 and 982 intersect with each other, a capacitor 983 is formed.

As illustrated in FIG. 23A, in a sensor portion 989, the electrode 981 includes a conductive film 981a and a conductive film 981b which are in the first layer, and a conductive film 981c in the second layer over an insulating film 985. The conductive films 981a and 981b are connected to each other via the conductive film 981c. The electrode 982 is formed using the conductive film in the first layer. An insulating film 991 is formed to cover the electrode 981, the electrode 982, an electrode 984, and the insulating film 985. As the insulating films 985 and 991, for example, a silicon oxide film, a silicon oxynitride film, or the like may be used. Note that a base insulating film may be formed between the substrate 986 and each of the electrode 981 and the electrode 984. As the base insulating film, for example, a silicon oxide film, a silicon oxynitride film, or the like can be used.

The electrodes 981 and 982 are formed using a conductive material having a light-transmitting property with respect to visible light. For example, as the conductive material having a light-transmitting property, indium tin oxide containing silicon oxide, indium tin oxide, zinc oxide, indium zinc oxide, and zinc oxide to which gallium is added are given.

The conductive film 981a is connected to the electrode 984 in a terminal portion 990. A terminal for connecting to the FPC is formed using the electrode 984. The electrode 982 is also connected to other electrode 984 like the electrode 981. The electrode 984 can be formed using a tungsten film, for example.

An opening is formed in the insulating film 985 and the insulating film 991 which are over the electrode 984 for electrically connecting the electrode 984 and the FPC. A substrate 987 is attached to and over the insulating film 991 using an adhesive, an adhesive film, or the like. The substrate 986 is attached to the first substrate 901 or the second substrate 906 of the display device using an adhesive or an adhesive film, whereby a touch panel is formed.

Note that the structures, methods, and the like described in this embodiment can be used as appropriate in combination with any of the structures, methods, and the like described in the other embodiments and examples.

Embodiment 7

Figure 24:
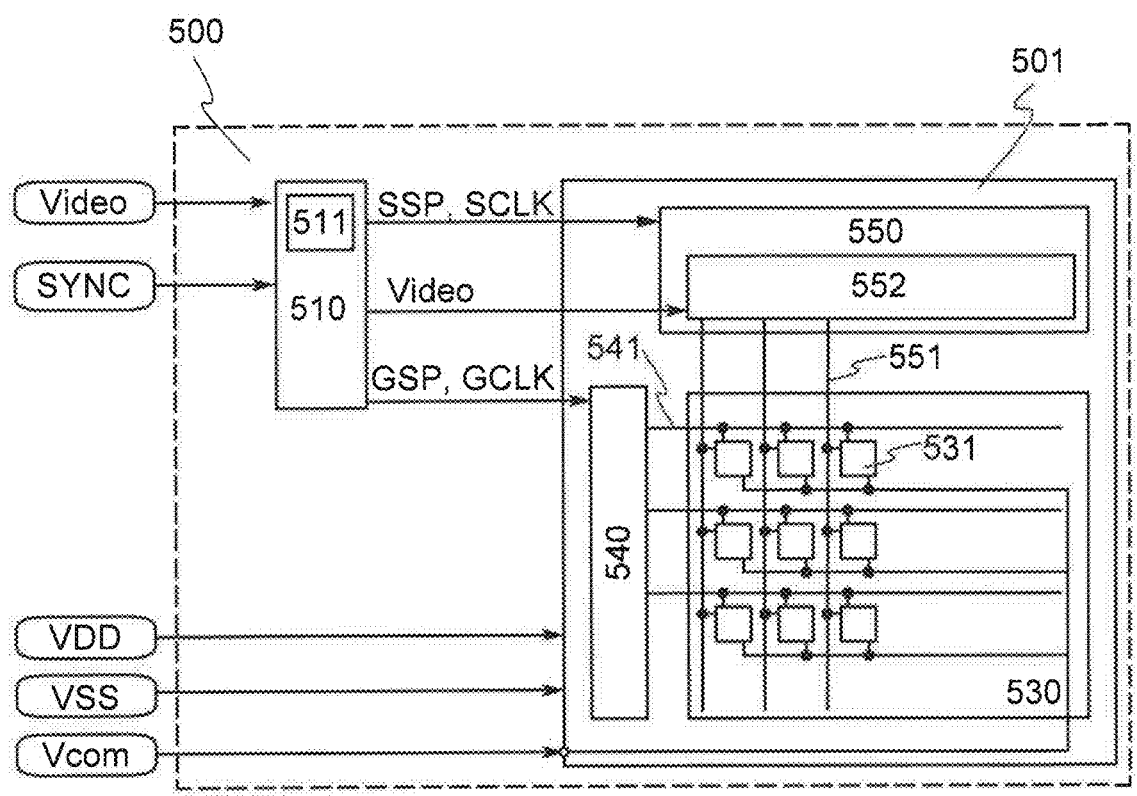
FIG. 24 is a block diagram showing an example of a structure of a liquid crystal display device.
Figure 25:
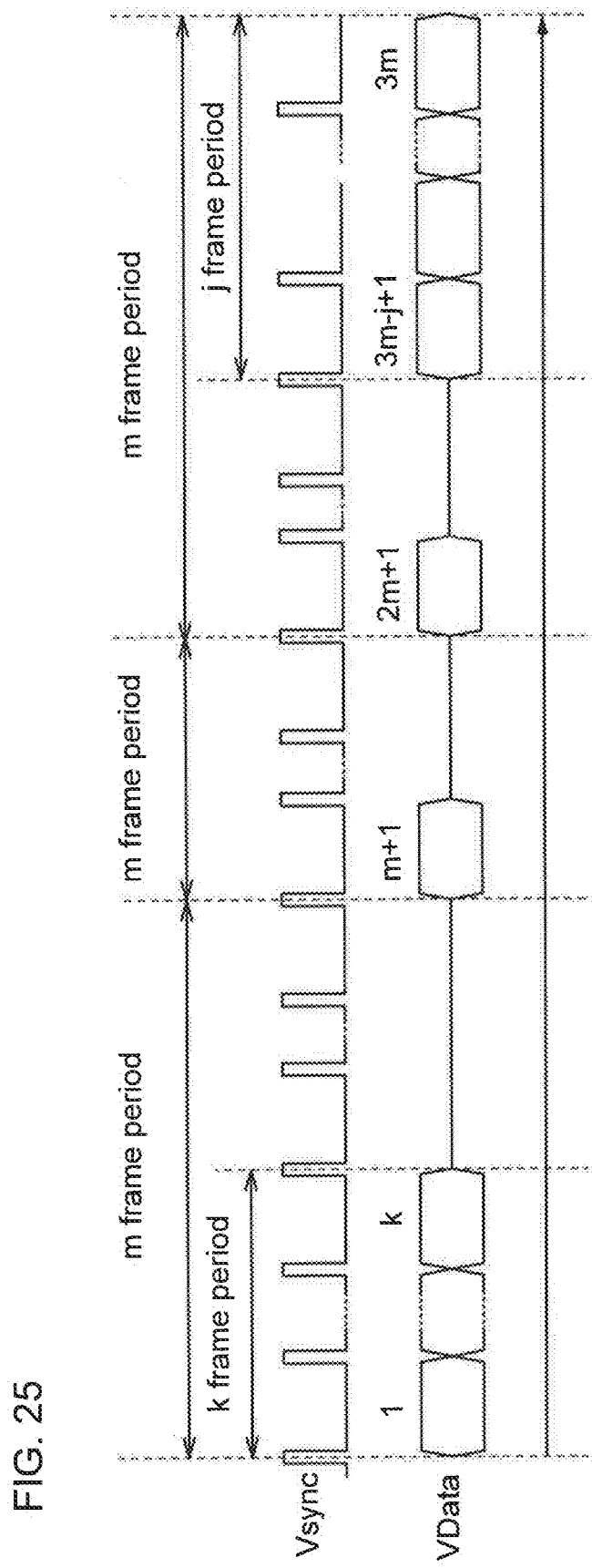
FIG. 25 is a timing chart illustrating one example of a method for driving a liquid crystal display device.

In this embodiment, a driving method for reducing power consumption of a display device is described. By using the driving method in this embodiment, power consumption of a display device including an oxide semiconductor transistor in a pixel can be further reduced. With reference to FIGS. 24 and 25, low power consumption of a liquid crystal display device, which is an example of the display device, is described below.

FIG. 24 is a block diagram illustrating a structural example of a liquid crystal display device in this embodiment. As shown in FIG. 24, a liquid crystal display device 500 includes a liquid crystal panel 501 as a display module, a control circuit 510, and a counter circuit.

An image signal (Video), which is digital data, and a synchronization signal (SYNC) for controlling rewriting of a screen of the liquid crystal panel 501 are input to the liquid crystal display device 500. Examples of a synchronization signal include a horizontal synchronization signal (Hsync), a vertical synchronization signal (Vsync), and a reference clock signal (CLK).

The liquid crystal panel 501 includes a display portion 530, a scan line driver circuit 540, and a data line driver circuit 550. The display portion 530 includes a plurality of pixels 531. The pixels 531 in the same row are connected to the scan line driver circuit 540 through a common scan line 541, and the pixels 531 in the same column are connected to the data line driver circuit 550 through a common data line 551.

A high power supply voltage (VDD) and a low power supply voltage (VSS), which serve as power supply voltages, and a common voltage (hereinafter referred to as Vcom) are supplied to the liquid crystal panel 501. The common voltage (Vcom) is supplied to each pixel 531 in the display portion 530.

The data line driver circuit 550 processes an input image signal to generate a data signal, and outputs the data signal to the data line 551. The scan line driver circuit 540 outputs, to the scan line 541, a scan signal for selecting the pixel 531 into which a data signal is to be written.

The pixel 531 includes a switching element whose electrical connection to the data line 551 is controlled by a scan signal. When the switching element is turned on, a data signal is written into the pixel 531 through the data line 551.

An electrode to which Vcom is applied corresponds to a common electrode.

The control circuit 510 controls the whole liquid crystal display device 500 and includes a circuit which generates control signals for circuits included in the liquid crystal display device 500.

The control circuit 510 includes a control signal generation circuit which generates control signals for the scan line driver circuit 540 and the data line driver circuit 550 on the basis of the synchronization signal (SYNC). Examples of a control signal for the scan line driver circuit 540 include a start pulse (GSP) and a clock signal (GCLK). Examples of a control signal for the data line driver circuit 550 include a start pulse (SSP) and a clock signal (SCLK). For example, the control circuit 510 generates a plurality of clock signals with the same cycle and shifted phases as the clock signals (GCLK and SCLK).

Further, the control circuit 510 controls output of an image signal (Video), which is input from the outside of the liquid crystal display device 500, to the data line driver circuit 550.

The data line driver circuit 550 includes a digital/analog conversion circuit (hereinafter referred to as a D-A conversion circuit 552). The D-A conversion circuit 552 converts an image signal to an analog signal, thereby generating a data signal.

Note that in the case where an image signal input to the liquid crystal display device 500 is an analog signal, the image signal is converted to a digital signal in the control circuit 510 and output to the liquid crystal panel 501.

An image signal is image data for each frame. The control circuit 510 has a function of performing image processing on the image signal and controlling output of the image signal to the data line driver circuit 550 on the basis of data obtained by the processing. For that function, the control circuit 510 includes a motion detection portion 511 which detects motion in the image data for each frame. The control circuit 510 stops output of an image signal to the data line driver circuit 550 when the motion detection portion 511 determines that there is no motion, and restarts the output of an image signal when the motion detection portion 511 determines that there is motion.

There is no particular limitation on the image processing for detecting motion which is performed in the motion detection portion 511. An example of a method for detecting motion is to obtain difference data from image data for two consecutive frames. It can be determined whether there is motion or not from the obtained difference data. Another example of the method is to detect a motion vector.

In addition, the liquid crystal display device 500 may be provided with an image signal correction circuit which corrects an input image signal. For example, an image signal is corrected such that a voltage higher than a voltage corresponding to the gray scale of the image signal is written into the pixel 531. Such correction can shorten the response time of the liquid crystal element. A method in which the control circuit 510 is driven with an image signal corrected in this manner is referred to as overdriving. In the case of performing high frame rate driving in which the liquid crystal display device 500 is driven at an integral multiple of the frame frequency of an image signal, image data for interpolation between two frames or image data for performing black display between two frames may be generated in the control circuit 510.

Next, the operation of the liquid crystal display device 500 for displaying an image with motion, such as a moving image, and an image without motion, such as a still image, is described with reference to a timing chart in FIG. 25. FIG. 25 shows the signal waveforms of a vertical synchronization signal (Vsync) and a data signal (Vdata) output to the data line 551 from the data line driver circuit 550.

FIG. 25 is a timing chart of the liquid crystal display device 500 during 3m frame periods. Here, there is motion in image data in the first k frame periods and the last j frame periods and there is no motion in image data in the other frame periods. Note that k and j are each an integer greater than or equal to 1 and less than or equal to m−2.

In the first k frame periods, the motion detection portion 511 determines that there is motion in image data for each frame. The control circuit 510 outputs data signals (Vdata) to the data line 551 on the basis of the result of determination by the motion detection portion 511.

The motion detection portion 511 performs image processing for detecting motion and determines that there is no motion in image data for the (k+1)-th frame. Then, the control circuit 510 stops output of image signals (Video) to the data line driver circuit 550 in the (k+1)-th frame period on the basis of the result of determination by the motion detection portion 511. Thus, output of the data signal (Vdata) from the data line driver circuit 550 to the data line 551 is stopped. Further, the control circuit 510 stops the supply of control signals (e.g., a start pulse signal and a clock signal) to the scan line driver circuit 540 and the data line driver circuit 550 in order to stop rewriting of the display portion 530. The control circuit 510 does not output an image signal to the data line driver circuit 550 nor output control signals to the scan line driver circuit 540 and the data line driver circuit 550, thereby keeping rewriting of the display portion 530 stopped, until the motion detection portion 511 determines that there is motion in image data.

Note that, in this specification, "not to supply" a signal to a liquid crystal panel means to apply voltage which is different from a predetermined voltage for operating a circuit to a wiring for supplying the signal, or to bring the wiring into an electrically floating state.

When rewriting of the display portion 530 is stopped, an electric field in one direction is kept applied to the liquid crystal element, which might lead to deterioration of liquid crystal in the liquid crystal element. In the case where such a problem is likely to occur, it is preferable that signals be supplied to the scan line driver circuit 540 and the data line driver circuit 550 from the control circuit 510 and data signals with an inverted polarity be written into the data line 551 at predetermined timings to invert the direction of the electric field applied to the liquid crystal element, regardless of the result of determination by the motion detection portion 511.

Note that the polarity of a data signal input to the data line 551 is determined relative to Vcom. The polarity is positive when the voltage of the data signal is higher than Vcom, and is negative when the voltage of the data signal is lower than Vcom.

Specifically, as shown in FIG. 25, in the (m+1)-th frame period, the control circuit 510 outputs control signals to the scan line driver circuit 540 and the data line driver circuit 550 and outputs an image signal (Video) to the data line driver circuit 550. The data line driver circuit 550 outputs, to the data line 551, a data signal (Vdata) which has an inverted polarity with respect to a data signal (Vdata) output to the data line 551 in the k-th frame period. In this manner, a data signal (Vdata) with an inverted polarity is written into the data line 551 in the (m+1)-th frame period and in the (2m+1)-th frame period, which are periods in which no motion is detected in image data. Rewriting of the display portion 530 is intermittently performed in periods in which there is no change in image data; thus, it is possible to reduce power consumption due to rewriting and prevent deterioration of the liquid crystal element.

When the motion detection portion 511 determines that there is motion in image data for any frame after the (2m+1)-th frame, the control circuit 510 controls the scan line driver circuit 540 and the data line driver circuit 550 to perform rewriting of the display portion 530.

As described above, with the driving method in FIG. 25, the polarity of a data signal (Vdata) is inverted every m frame periods regardless of whether there is motion in image data (Video) or not. Meanwhile, the display portion 530 is rewritten every frame in periods in which an image with motion is displayed and is rewritten every m frames in periods in which an image without motion is displayed. Consequently, power consumed owing to rewriting of the display portion can be reduced. This can prevent an increase in power consumption due to an increase in driving frequency and the number of pixels.

As described above, in the liquid crystal display device 500, the method for driving the liquid crystal display device is switched between in a moving image display mode and in a still image display mode; thus, it is possible to provide a liquid crystal display device with low power consumption while inhibiting deterioration of liquid crystal and maintaining display quality.

In the case where a still image is displayed, when a pixel is rewritten every one frame, human eyes perceive the rewriting of the pixel as flickers in some cases, which causes eyestrain. The pixel is not frequently rewritten in the display period of the still image in the liquid crystal device of this embodiment, which is effective for reducing eyestrain.

Thus, with the use of a liquid crystal panel in which a backplane is formed using an oxide semiconductor transistor, a middle size liquid crystal display device with high resolution and low power consumption, which is very suitable for a portable electronic device, can be provided.

Note that, in order to prevent deterioration of the liquid crystal, the interval between polarity inversions of data signals (here, m frame periods) is set to two seconds or shorter, preferably one second or shorter.

Although the detection of motion in image data is performed in the motion detection portion 511 in the control circuit 510, the detection of motion is not necessarily performed only in the motion detection portion 511. Data on whether there is motion or not may be input to the control circuit 510 from the outside of the liquid crystal display device 500.

Determination that there is no motion in image data is not always based on image data for two consecutive frames; the number of frames required for the determination may be set as appropriate depending on the usage mode of the liquid crystal display device 500. For example, rewriting of the display portion 530 may be stopped when there is no motion in image data for m consecutive frames.

Note that although description of this embodiment is made using a liquid crystal display device as a display device, the driving method in this embodiment can be used for other display devices, e.g., a light-emitting display device.

Note that the structures, methods, and the like described in this embodiment can be used as appropriate in combination with any of the structures, methods, and the like described in the other embodiments and examples.

Embodiment 8

The semiconductor device which is one embodiment of the present invention can be applied to a variety of electronic appliances (including game machines). Examples of electronic appliances include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console, and the like. Examples of these electronic appliances are illustrated in FIGS. 26A to 26C.

Figure 26A:
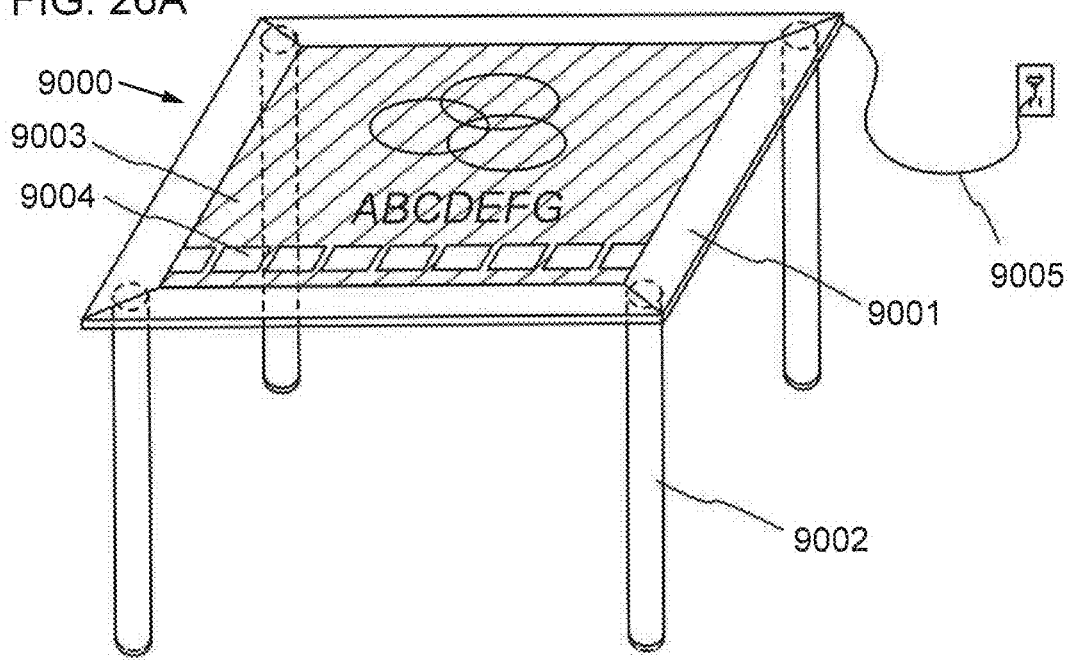
FIGS. 26A to 26C are diagrams illustrating electronic devices each including a semiconductor device which is one embodiment of the present invention.
Figure 26B:
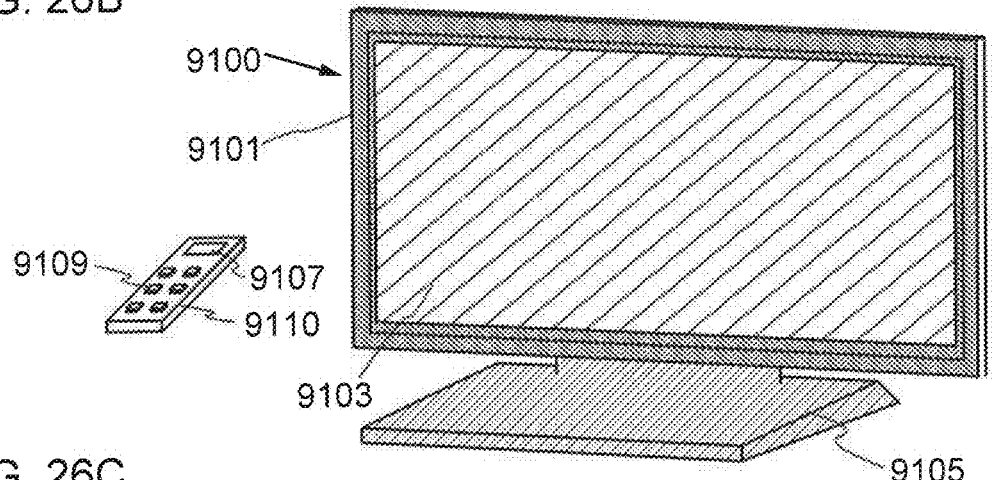
Figure 26C:
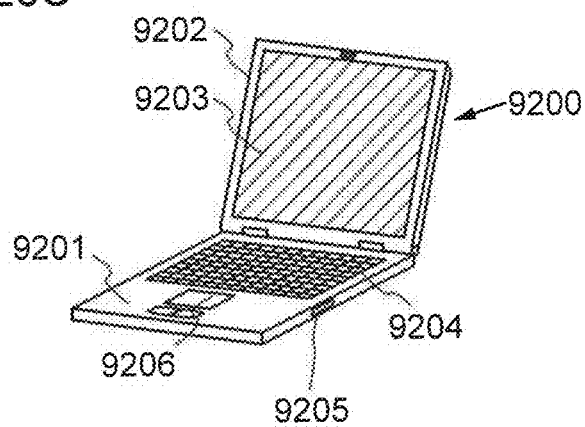

FIG. 26A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The semiconductor device described in any of the above embodiments can be used for the display portion 9003. Thus, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of the semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 26B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 26B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the semiconductor devices described in the above embodiments can be used for the display portions 9103 and 9107. Thus, the television device can have high display quality.

FIG. 26C illustrates a computer 9200, which includes a main body 9201, a housing 9202, a display portion 9203, a keyboard 9204, an external connection port 9205, a pointing device 9206, and the like.

Any of the semiconductor devices described in the above embodiments can be used for the display portion 9203. Thus, the computer 9200 can have high display quality.

The display portion 9203 has a touch-input function. When a user touches displayed buttons which are displayed on the display portion 9203 of the computer 9200 with his/her fingers or the like, the user can carry out operation of the screen and input of information. Further, when the table may be made to communicate with home appliances or control the home appliances, the display portion 9203 may function as a control device which controls the home appliances by operation on the screen.

Figure 27A:
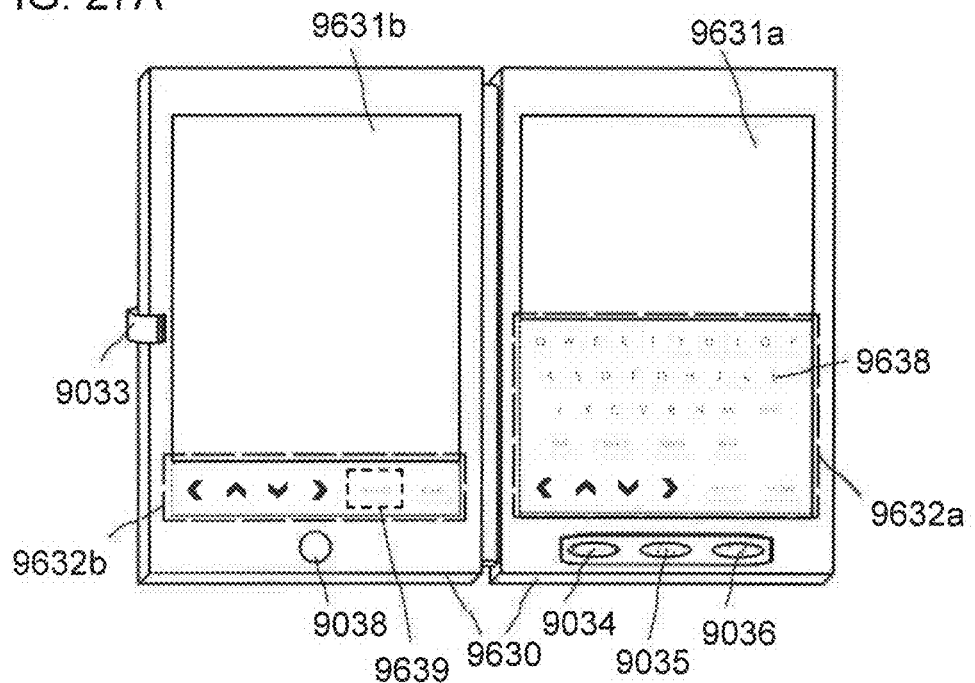
FIGS. 27A to 27C are diagrams illustrating an electronic device including a semiconductor device which is one embodiment of the present invention.
Figure 27B:
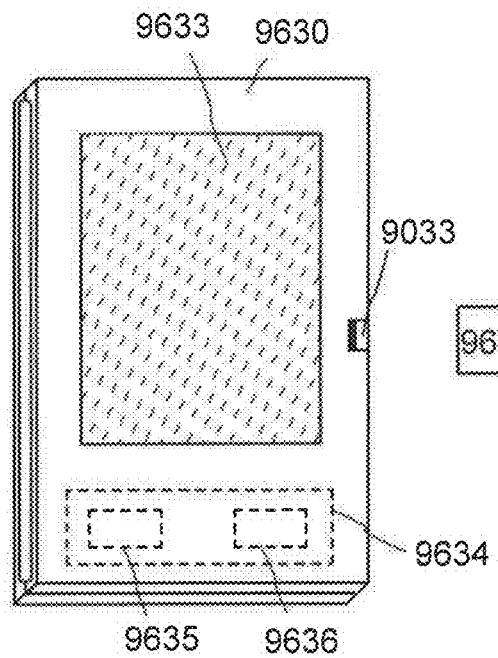

FIGS. 27A and 27B illustrate a foldable tablet terminal. In FIG. 27A, the tablet terminal is opened and includes a housing 9630, a display portion 9631a, a display portion 9631b, a display-mode switching button 9034, a power button 9035, a power-saving-mode switching button 9036, a clip 9033, and an operation button 9038.

Any of the semiconductor devices described in the above embodiments can be used for the display portion 9631a and the display portion 9631b. Thus, the display quality of the tablet terminal can be improved.

Part of the display portion 9631a can be a touch panel region 9632a and data can be input when a displayed operation key 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch screen function. For example, the while area of the display portion 9631a can display keyboard buttons and serve as a touch screen while the display portion 9631b can be used as a display screen.

Like the display portion 9631a, part of the display portion 9631b can be a touch screen region 9632b. When a keyboard display switching button 9639 displayed on the touch panel is touched with a finger, a stylus, or the like, a keyboard can be displayed on the display portion 9631b.

Touch input can be performed concurrently on the touch screen regions 9632a and 9632b.

The display-mode switching button 9034 can switch display orientation (e.g., between landscape mode and portrait mode) and select a display mode (switch between monochrome display and color display), for example. The power-saving-mode switching button 9036 can control display luminance in accordance with the amount of external light in use of the tablet terminal detected by an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 27A, one embodiment of the present invention is not limited to this example. The display portion 9631a and the display portion 9631b may have different areas or different display quality. For example, one of them may be a display panel that can display higher-definition images than the other.

In FIG. 27B, the tablet terminal is folded and includes the housing 9630, a solar cell 9633, and a charge and discharge control circuit 9634. Note that in FIG. 27B, an example in which the charge and discharge control circuit 9634 includes the battery 9635 and the DCDC converter 9636 is illustrated.

Since the tablet can be folded in two, the housing 9630 can be closed when not in use. Thus, the display portions 9631a and 9631b can be protected, thereby providing a tablet with high endurance and high reliability for long-term use.

In addition, the tablet terminal illustrated in FIGS. 27A and 27B can have a function of displaying various kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch screen, a display portion, an image signal processor, and the like. Note that the solar cell 9633 can be provided on one or both surfaces of the housing 9630, so that the battery 9635 can be charged efficiently. The use of a lithium ion battery as the battery 9635 is advantageous in downsizing or the like.

Figure 27C:
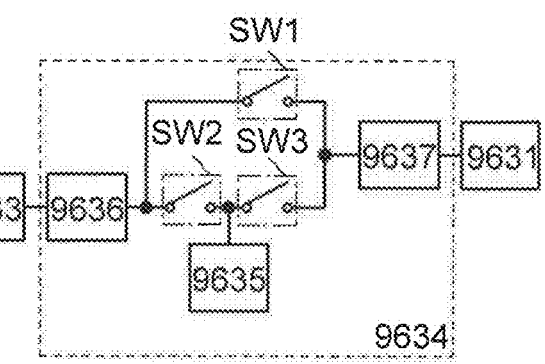

The structure and operation of the charge and discharge control circuit 9634 illustrated in FIG. 27B are described with reference to a block diagram of FIG. 27C. The solar cell 9633, the battery 9635, the DCDC converter 9636, a converter 9637, switches SW1 to SW3, and the display portion 9631 are shown in FIG. 27C, and the battery 9635, the DCDC converter 9636, the converter 9637, and the switches SW1 to SW3 correspond to the charge/discharge control circuit 9634 in FIG. 27B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Note that the structures and the like described in this embodiment can be combined as appropriate with any of the structures and the like described in the other embodiments.

EXAMPLE 1

In this example, measurement results of Vg-Id characteristics and a BT photostress test of a transistor are described.

First of all, a manufacturing process of a transistor included in Sample 1 is described. In this example, the process is described with reference to FIGS. 4A to 4D.

First, as illustrated in FIG. 4A, a glass substrate was used as the substrate 11, and the gate electrode 15 was formed over the substrate 11.

A 100-nm-thick tungsten film was formed by a sputtering method, a mask was formed over the tungsten film by a photolithography process, and part of the tungsten film was etched with the use of the mask, so that the gate electrode 15 was formed.

Next, the gate insulating film 17 was formed over the gate electrode 15.

The gate insulating film 17 was formed by stacking a 50-nm-thick first silicon nitride film, a 300-nm-thick second silicon nitride film, a 50-nm-thick third silicon nitride film, and a 50-nm-thick silicon oxynitride film.

The first silicon nitride film was formed under the following conditions: silane with a flow rate of 200 sccm, nitrogen with a flow rate of 2000 sccm, and ammonia with a flow rate of 100 sccm were supplied to a treatment chamber of a plasma CVD apparatus as the source gas; the pressure in the treatment chamber was controlled to 100 Pa, and the power of 2000 W was supplied with the use of a 27.12 MHz high-frequency power source.

Next, the second silicon nitride film was formed under the conditions which are different from the conditions of the source gas of the first silicon nitride film in that the flow rate of ammonia was 2000 sccm.

Next, the third silicon nitride film was formed under the following conditions: silane with a flow rate of 200 sccm and nitrogen with a flow rate of 5000 sccm were supplied to the treatment chamber of the plasma CVD apparatus as the source gas; the pressure in the treatment chamber was controlled to 100 Pa, and the power of 2000 W was supplied with the use of a 27.12 MHz high-frequency power source.

Next, the silicon oxynitride film was formed under the following conditions: silane with a flow rate of 20 sccm and dinitrogen monoxide with a flow rate of 3000 sccm were supplied to the treatment chamber of the plasma CVD apparatus as the source gas; the pressure in the treatment chamber was controlled to 40 Pa, and the power of 100 W was supplied with the use of a 27.12 MHz high-frequency power source.

In each of the forming processes of the first to third silicon nitride films and the silicon oxynitride film, the substrate temperature was 350° C.

Next, the multilayer film 20 overlapping with the gate electrode 15 with the gate insulating film 17 provided therebetween was formed.

Here, a 35-nm-thick oxide semiconductor film was formed over the gate insulating film 17 by a sputtering method, and then, a 20-nm-thick oxide film containing In or Ga was formed over the oxide semiconductor film. Next, a mask was formed over the oxide film containing In or Ga by a photolithography process, and the oxide semiconductor film and the oxide film containing In or Ga were partly etched using the mask to form the oxide semiconductor film 18 and the oxide film 19 containing In or Ga, and then, heat treatment was performed; thus, the multilayer film 20 was formed.

The oxide semiconductor film was formed under the following conditions: a sputtering target where In:Ga:Zn=1: 1:1 (atomic ratio) was used; argon with a flow rate of 50 sccm and oxygen with a flow rate of 50 sccm were supplied as a sputtering gas into a treatment chamber of a sputtering apparatus; the pressure in the treatment chamber was controlled to 0.6 Pa; and a direct-current power of 5 kW was supplied. Note that the oxide semiconductor film was formed at a substrate temperature of 170° C.

The oxide film containing In or Ga was formed under the following conditions: a sputtering target where In:Ga:Zn=1: 3:2 (atomic ratio) was used; argon with a flow rate of 90 sccm and oxygen with a flow rate of 10 sccm were supplied as a sputtering gas into the treatment chamber of the sputtering apparatus; the pressure in the treatment chamber was controlled to 0.3 Pa; and a direct-current power of 5 kW was supplied. Note that the oxide film containing In or Ga was formed at a substrate temperature of 25° C.

As the heat treatment, heat treatment was performed at 450° C. in a nitrogen atmosphere for one hour, and then, heat treatment was performed at 450° C. in an atmosphere of nitrogen and oxygen for one hour.

FIG. 4B can be referred to for the structure obtained through the steps up to here.

Next, after the gate electrode was exposed by partly etching the gate insulating film 17 (this step is not illustrated), the pair of electrodes 21 and 22 in contact with the multilayer film 20 was formed as illustrated in FIG. 4C.

Here, a conductive film was formed over the gate insulating film 17 and the multilayer film 20. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and part of the conductive film was etched with the use of the mask, whereby the pair of electrodes 21 and 22 was formed.

Next, after the substrate was moved to a treatment chamber under reduced pressure and heated at 220° C., the substrate was moved to a treatment chamber filled with dinitrogen monoxide. Then, the multilayer film 20 was exposed to oxygen plasma which was generated by decomposition of dinitrogen monoxide in such a manner that an upper electrode provided in the treatment chamber was supplied with high-frequency power of 150 W with the use of a 27.12 MHz high-frequency power source.

Next, the protective film 26 was formed over the multilayer film 20 and the pair of electrodes 21 and 22 (see FIG. 4D). Here, as the protective film 26, the oxide insulating film 23, the oxide insulating film 24, and the nitride insulating film 25 were formed.

First, after the above plasma treatment, the oxide insulating film 23 and the oxide insulating film 24 were formed in succession without exposure to the atmosphere. A 50-nm-thick silicon oxynitride film was formed as the oxide insulating film 23, and a 400-nm-thick silicon oxynitride film was formed as the oxide insulating film 24.

The oxide insulating film 23 was formed by a plasma CVD method under the following conditions: silane with a flow rate of 30 sccm and dinitrogen monoxide with a flow rate of 4000 sccm were used as source gases, the pressure in the treatment chamber was 200 Pa, the substrate temperature was 220° C., and the high-frequency power of 150 W was supplied to parallel plate electrodes.

The oxide insulating film 24 was formed by a plasma CVD method under the following conditions: silane with a flow rate of 200 sccm and dinitrogen monoxide with a flow rate of 4000 sccm were used as source gases, the pressure in the treatment chamber was 200 Pa, the substrate temperature was 220° C., and the high-frequency power of 1500 W was supplied to parallel plate electrodes. Under the above conditions, it is possible to form a silicon oxynitride film containing oxygen at a higher proportion than oxygen in the stoichiometric composition and from which part of oxygen is released by heating.

Next, heat treatment was performed, whereby water, nitrogen, hydrogen, and the like were released from the oxide insulating film 23 and the oxide insulating film 24. Here, the heat treatment was performed in an atmosphere of nitrogen and oxygen at 350° C. for one hour.

Next, the substrate was transferred to a treatment chamber under reduced pressure and heated at 350° C., and the nitride insulating film 25 was formed over the oxide insulating film 24. Here, as the nitride insulating film 25, a 100-nm-thick silicon nitride film was formed.

The nitride insulating film 25 was formed by a plasma CVD method under the following conditions: silane with a flow rate of 50 sccm, nitrogen with a flow rate of 5000 sccm, and ammonia with a flow rate of 100 sccm were used as a source gas, the pressure in the treatment chamber was 100 Pa, the substrate temperature was 350° C., and the high-frequency power of 1000 W was supplied to parallel plate electrodes.

Next, although not illustrated, an opening which exposes part of the pair of electrodes 21 and 22 was formed by partly etching the protective film 26.

Next, a planarization film was formed (not illustrated) over the nitride insulating film 25. Here, the nitride insulating film 25 was coated with a composition, and exposure and development were performed, so that a planarization film having an opening through which the pair of electrodes is partly exposed was formed. Note that as the planarization film, a 1.5-μm-thick acrylic resin was formed. Then, heat treatment was performed. The heat treatment was performed at a temperature of 250° C. in an atmosphere containing nitrogen for one hour.

Next, a conductive film connected to part of the pair of electrodes was formed (not illustrated). Here, a 100-nm-thick ITO film containing silicon oxide was formed by a sputtering method. After that, heat treatment was performed at 250° C. in a nitrogen atmosphere for one hour.

Through the above process, the Sample 1 including a transistor was formed.

Further, a sample including a transistor manufactured such that, in the transistor of Sample 1, the third silicon nitride film in the gate insulating film 17 was formed under conditions similar to those of the first silicon nitride film and the oxide semiconductor film 18 and the oxide film 19 containing In or Ga are formed at a substrate temperature of 200° C. was manufactured as Sample 2.

Further, a sample including a transistor which is different from the transistor of the Sample 1 in that the oxide film 19 containing In or Ga is not formed was formed as Sample 3. Note that after the pair of electrodes 21 and 22 was formed, a surface of the oxide semiconductor film 18 was subjected to cleaning treatment using a phosphoric acid solution in which 85% phosphoric acid was diluted by 100 times.

Furthermore, a sample having a transistor without the oxide insulating film 23 in Sample 3 was manufactured as Sample 4.

Next, initial Vg-Id characteristics of the transistors included in Sample 1 to Sample 4 were measured. Here, change in characteristics of current flowing between a source electrode and a drain electrode (hereinafter referred to as the drain current), that is, Vg-Id characteristics were measured under the following conditions: the substrate temperature was 25° C., the potential difference between the source electrode and the drain electrode (hereinafter referred to as the drain voltage) was 1 V or 10 V, and the potential difference between the source electrode and the gate electrode (hereinafter referred to as the gate voltage) were changed from −20 V to +15 V.

FIGS. 28A to 28D show Vg-Id characteristics of the transistors included in the samples. In FIGS. 28A to 28D, the horizontal axis indicates the gate voltage Vg and the vertical axis indicates the drain current Id. Further, the solid lines indicate the Vg-Id characteristics at the drain voltages Vd of 1 V and 10 V, and the dashed line indicates the field-effect mobility with respect to the gate voltages at the drain voltage Vd of 10 V. Note that the field-effect mobility was obtained by operation of each sample in a saturation region.

Note that in each of the transistors, the channel length (L) is 6 μm and the channel width (W) is 50 μm. Further, in each of the samples, 20 transistors having the same structure were formed on the substrate.

Figure 28A:
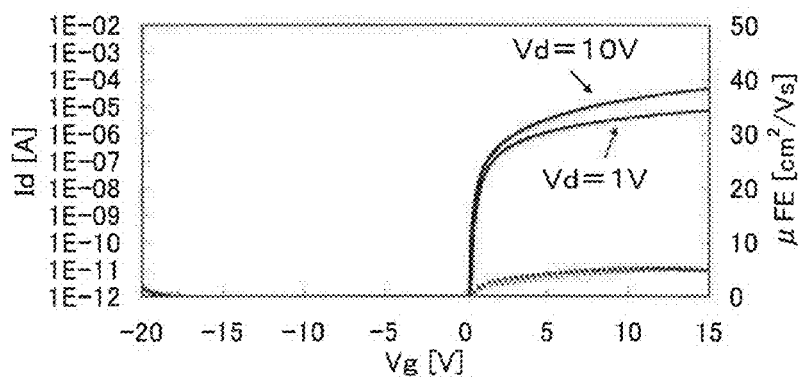
FIGS. 28A to 28D are graphs showing the Vg-Id characteristics of transistors.
Figure 28B:
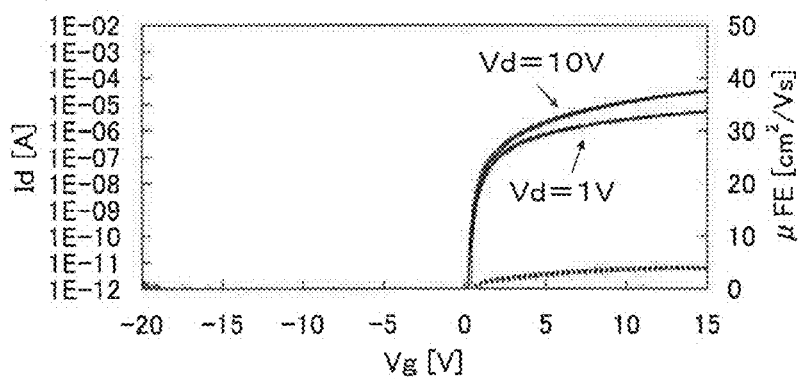
Figure 28C:
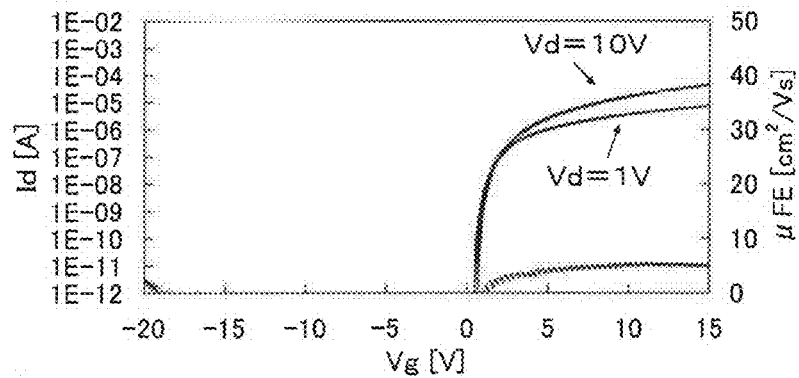
Figure 28D:
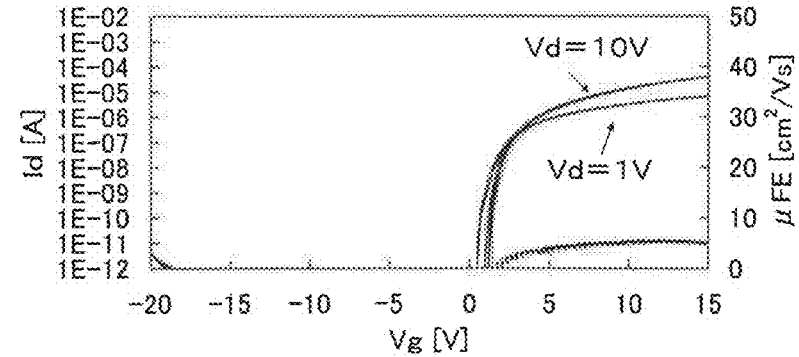

According to FIG. 28D, in the Vg-Id characteristics of the transistors included in Sample 4, gate voltage at which on-state current starts flowing (also referred to as rising gate voltage (Vg)) when a drain voltage Vd is 1 V is different from rising gate voltage of the on-state current when a drain voltage Vd is 10 V. Further, variation in the Vg-Id characteristics of the transistors included in Sample 4 is large. On the other hand, according to FIGS. 28A to 28C, in the Vg-Id characteristics of the transistors included in Sample 1 and Sample 3, the rising gate voltage (Vg) of the on-state current at the drain voltage Vd of 1 V and the rising gate voltage (Vg) of the on-state current at the drain voltage Vd of 10 V are substantially the same. Moreover, variation in the Vg-Id characteristics of the transistors included in Sample 1 to Sample 3 is small. Thus, by providing at least the oxide insulating film 23 between the multilayer film 20 and the oxide insulating film 24, the initial characteristics of the transistor are improved.

Next, a BT stress test and a BT photostress test were performed on each of Sample 1 to Sample 4. Here, the BT stress test in which the predetermined voltage was applied to the gate electrode was performed under the following conditions: the substrate temperature was 80° C., the intensity of an electric field applied to the gate insulating film was 0.66 MV/cm, and the application time was 2000 seconds. Note that the BT stress test was performed in an air atmosphere in which the dew-point temperature is 12° C.

Under conditions similar to those of the above BT stress test, the BT photostress test in which the transistor is irradiated with white LED light with 3000 lx to apply the predetermined voltage to the gate electrode was performed. Note that the BT photostress test was performed in a dry-air atmosphere in which the dew-point temperature is −30° C.

Here, a measurement method of the BT stress test is described. First, as described above, initial Vg-Id characteristics of the transistor were measured.

Next, the substrate temperature was raised to 80° C., and then, the potentials of the source electrode and the drain electrode of the transistor were set to 0 V. Then, voltage was kept being applied to the gate electrode for 2000 seconds so that the intensity of the electric field applied to the gate insulating film was 0.66 MV/cm.

Note that in a negative BT stress test (dark, −GBT), a voltage of −30 V was applied to the gate electrode, and in a positive BT stress test (dark, +GBT), a voltage of 30 V was applied to the gate electrode. In a negative BT photostress test (photo, −GBT), a voltage of −30 V was applied to the gate electrode while the transistor was irradiated with white LED light with 3000 lx. In a positive BT photostress test (photo, +GBT), a voltage of 30 V was applied to the gate electrode while the transistor was irradiated with white LED light with 3000 lx.

Next, the substrate temperature was lowered to 25° C. while voltage was continuously applied to the gate electrode, and the source electrode and the drain electrode. After the substrate temperature reached to 25° C., the application of voltage to the gate electrode, and the source electrode and the drain electrode was stopped.

Figure 29:
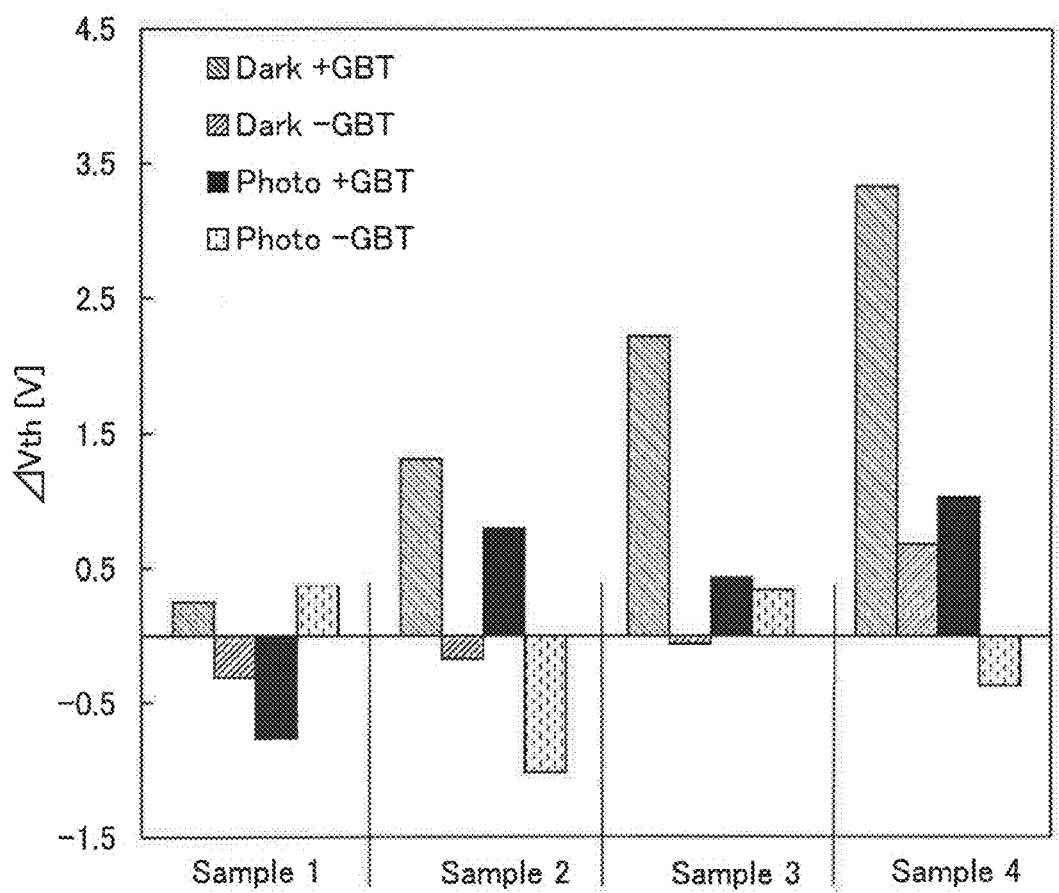
FIG. 29 is a graph showing the amount of change in threshold voltage of transistors after a BT photostress test.

Further, FIG. 29 shows, in Sample 1 to Sample 4, a difference between a threshold voltage in the initial characteristics of the transistors and a threshold voltage after BT stress tests (i.e., the amount of change of the threshold voltage (ΔVth)). FIG. 29 shows the amounts of change of the threshold voltage (ΔVth) in the positive BT stress test (dark, +GBT), the negative BT stress test (dark, −GBT), the positive BT photostress test (photo, +GBT), and the negative BT photostress test (photo, −GBT).

Note that in this specification, threshold voltage is calculated with a drain voltage Vd of 10 V. Further, in this specification, threshold voltage (Vth) refers to an average value of Vth of 20 transistors included in each sample.

Further, according to FIG. 29, it is found that the absolute value of the amount of change in the threshold voltage of the transistors in Sample 1 and Sample 2 decreases compared to the absolute value of the amount of change in the threshold voltage (ΔVth) of the transistors in Sample 3 and Sample 4. In particular, in Sample 1, the amount of change in the threshold voltage (ΔVth) due to the positive BT stress test (dark, +GBT) remarkably decreases. Thus, with at least the oxide film 19 containing In or Ga provided between the oxide semiconductor film 18 and the oxide insulating film 24, the reliability of the transistor can be improved.

In this manner, with the oxide film 19 containing In or Ga and the oxide insulating film 23 provided between the oxide semiconductor film 18 and the oxide insulating film 24, the electrical characteristics of the transistor can be improved. Specifically, both the initial characteristics and the reliability can be improved. Further, the oxide film 19 containing In or Ga and the oxide insulating film 23 can inhibit entry of elements (e.g., silicon and nitrogen) contained in the oxide insulating film 24 into the oxide semiconductor film 18 which is a channel region. Furthermore, the oxide film 19 containing In or Ga and the oxide insulating film 23 can inhibit the oxide semiconductor film 18 which is a channel region from receiving plasma damage at the time of forming the oxide insulating film 24 by a plasma CVD method with relatively high power density.

EXAMPLE 2

In this example, the dependence of the transistors included in Sample 1 of Example 1 on a temperature of the BT stress test is described.

Sample 1 of Example 1 was used, a temperature of the BT stress test performed in Example 1 was set to 60° C. or 80° C., and the length of time for which stress was applied was 3600 seconds.

Specifically, first, after Vg-Id characteristics as the initial characteristics of the transistors were measured in a manner similar to that in Example 1, the substrate temperature was raised to 60° C. or 80° C., and then, the potentials of the source electrodes and the drain electrodes of the transistors were set to 0 V. After that, voltage was kept being applied to the gate electrode for 3600 seconds so that the intensity of the electric field applied to the gate insulating film was 0.66 MV/cm. Note that in a negative BT stress test (dark, −GBT), a voltage of −30 V was applied to the gate electrode, and in a positive BT stress test (dark, +GBT), a voltage of 30 V was applied to the gate electrode.

Next, the substrate temperature was decreased to 25° C. while a voltage was applied to the gate electrode and the source and drain electrodes. After the substrate temperature was reached to 25° C., the application of voltage to the gate electrode, and the source electrode and the drain electrode was stopped.

Figure 30A:
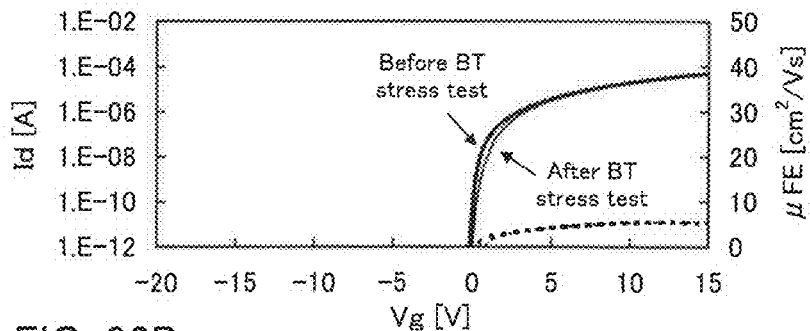
FIGS. 30A to 30D are graphs each showing the Vg-Id characteristics before and after a BT stress test.
Figure 30B:
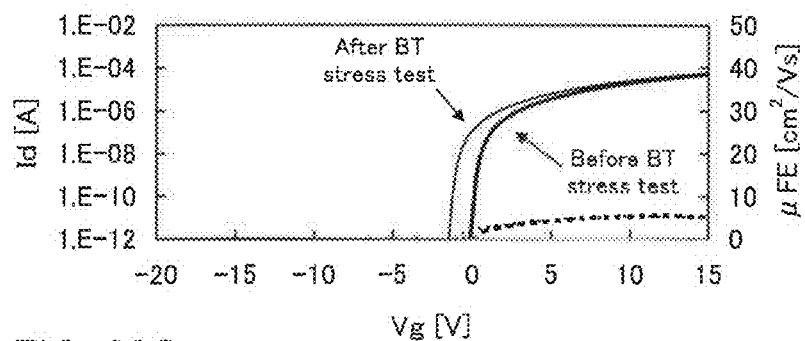
Figure 30C:
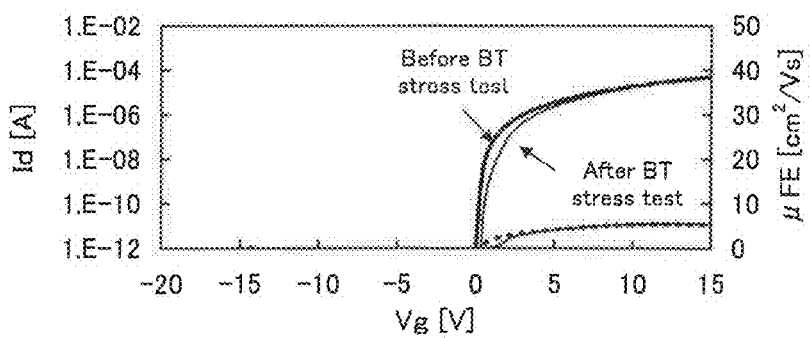
Figure 30D:
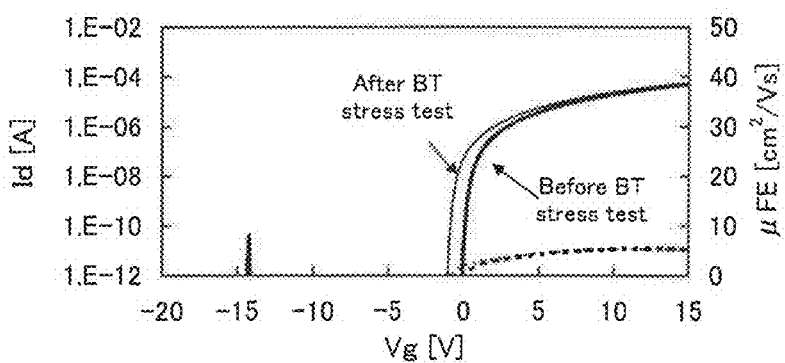

The Vg-Id characteristics of the transistors included in Samples 1 after BT stress tests at the above temperatures are shown in FIGS. 30A to 30D. The results concerning a positive BT stress test at a substrate temperature of 60° C. are shown in FIG. 30A, the results concerning a negative BT stress test at a substrate temperature of 60° C. are shown in FIG. 30B, the results concerning a positive BT stress test at a substrate temperature of 80° C. are shown in FIG. 30C, and the results concerning a negative BT stress test at a substrate temperature of 80° C. are shown in FIG. 30D. In FIGS. 30A to 30D, thick lines in the graphs each represent the Vg-Id characteristics (initial characteristics) before the BT stress test, and thin lines each represent the Vg-Id characteristics after the BT stress test. Further, thick dashed lines each represent field-effect mobility before the BT stress test, and thin dashed lines each represent field-effect mobility after the BT stress test. Note that the Vg-Id characteristics as the initial characteristics and the Vg-Id characteristics after the BT stress test at each temperature were measured with drain voltage set to 10 V.

Figure 31:
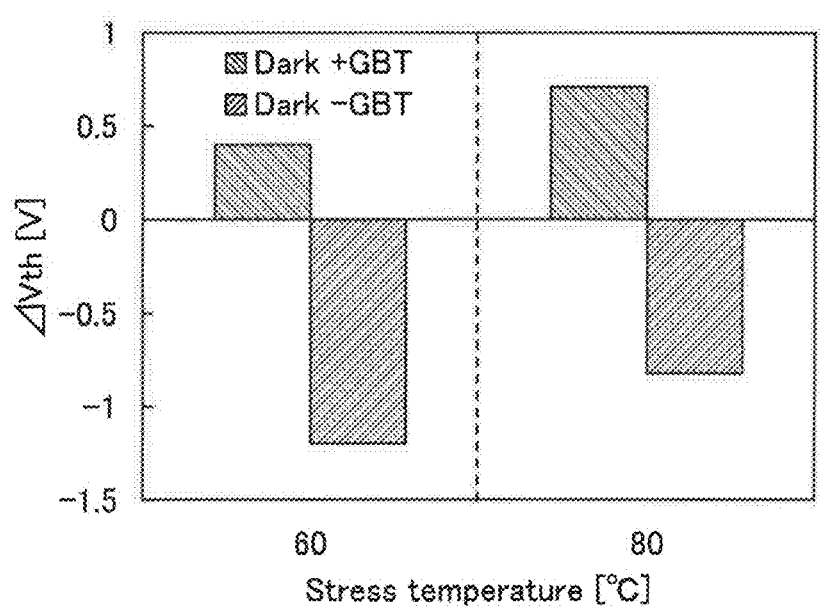
FIG. 31 is a graph showing the amount of change in threshold voltage ($\Delta$Vth).

Further, a difference between a threshold voltage in the initial characteristics of the transistors included in Sample 1 and a threshold voltage after the BT stress tests (i.e., the amount of change in threshold voltage (ΔVth)) is shown in FIG. 31.

It can be determined from FIG. 31 that, at temperatures of 60° C. and 80° C., the amount of change in threshold voltage at least after the positive BT stress test is less than or equal to 1.0 V.

EXAMPLE 3

In this example, change over time of threshold voltage of a transistor which is one embodiment of the present invention is described. Here, a BT stress test was performed on the transistor which is one embodiment of the present invention, and the results of evaluating the amount of change in threshold voltage (ΔVth) with respect to stress test are described.

A sample subjected to a BT stress test is described. The sample subjected to the BT stress test is a sample manufactured such that, in Sample 1 described in Example 1, an In—Ga—Zn oxide film to be processed into the oxide film 19 containing In or Ga of the multilayer film 20 was formed at a substrate temperature of 100° C. This sample is referred to as Sample 5.

Further, as a comparative example of Sample 5, Sample 6 manufactured in a manner similar to that of Sample 3 of Example 1 was used.

In this example, in a method similar to the BT stress test described in Example 1, the substrate temperature was set to 60° C. or the substrate temperature was set to 125° C., and heating was maintained for 3600 seconds. As for Sample 5, the amount of change in threshold voltage after a lapse of 100 seconds, 500 seconds, 1500 seconds, 2000 seconds, and 3600 seconds in time in which heating was maintained was evaluated. As for Sample 6, the amount of change in threshold voltage after a lapse of 100 seconds, 600 seconds, and 3600 seconds in time in which heating was maintained was evaluated.

Figure 32A:
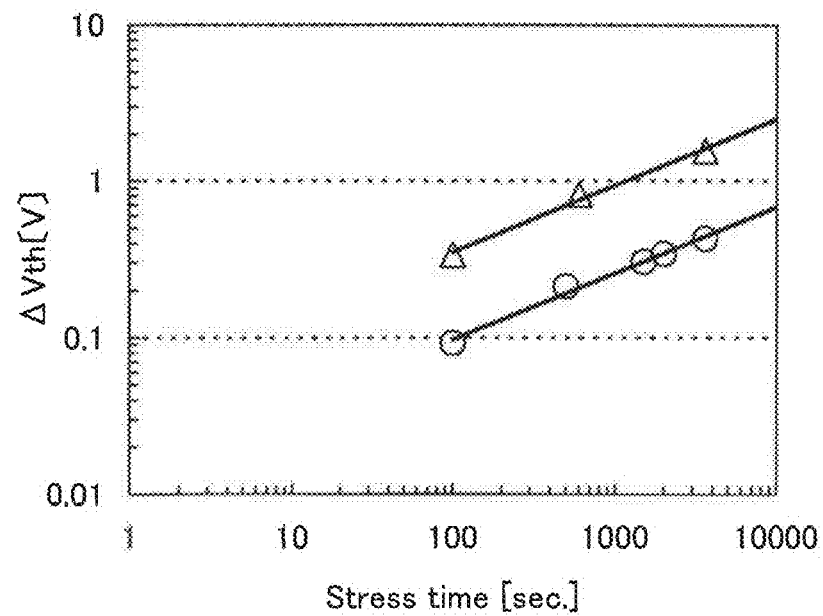
FIGS. 32A and 32B are graphs each showing the amount of change in threshold voltage ($\Delta$Vth).
Figure 32B:
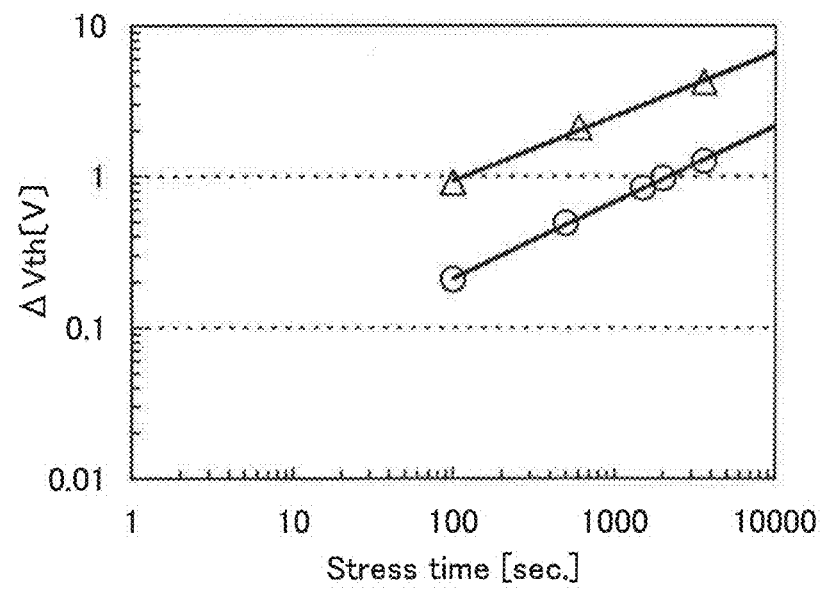

The amounts of change in threshold voltage of Sample 5 and Sample 6 after each elapsed time are shown in FIGS. 32A and 32B. In FIGS. 32A and 32B, circles indicate the measurement results of Sample 5, and triangles indicate the measurement results of Sample 6. Note that the amount of change in threshold voltage when the substrate temperature is set at 60° C. is shown in FIG. 32A, and the amount of change in threshold voltage when the substrate temperature is set at 125° C. is shown in FIG. 32B.

Further, FIGS. 32A and 32B are graphs in each of which an approximate line up to 10,000 seconds was extrapolated on the basis of shift of the amount of change in threshold voltage. In FIG. 32A, the formula of the approximate line of Sample 5 was $y=0.0138x^{0.424}$ and a coefficient value of determination $R^2$ was 0.990. The formula of the approximate line of Sample 6 was $y=0.0492x^{0.427}$ and a coefficient value of determination $R^2$ was 0.992. In FIG. 32B, the formula of the approximate line of Sample 5 was $y=0.0206x^{0.506}$ and a coefficient value of determination $R^2$ was 0.999. The formula of the approximate line of Sample 6 was $y=0.1304x^{0.428}$ and a coefficient value of determination $R^2$ was 0.997.

It can be determined from FIGS. 32A and 32B that, at each of the substrate temperature of 60° C. and the substrate temperature of 125° C., the amount of change in threshold voltage after each elapsed time of the transistor having the multilayer film 20 as in Sample 5 is smaller than that of Sample 6.

It can be determined that, in the case where the substrate temperature is 60° C., the amount of change in threshold voltage of Sample 5 is less than or equal to 1 V even after a lapse of 10000 seconds while the amount of change in threshold voltage of Sample 6 reaches 1 V in approximately 1000 seconds.

Further, it has been determined that, in the case where the substrate temperature is 125° C., time in which the amount of change in threshold voltage of Sample 5 reaches 1 V is 20 or more times (approximately 30 or less times) that of Sample 6.

From the above, with the use of the multilayer film of the oxide semiconductor film and the oxide film containing In or Ga as in the transistor which is one embodiment of the present invention, a transistor with improved reliability can be manufactured.

EXAMPLE 4

In this example, the relation between the formation conditions of the oxide insulating film 23 and the oxide insulating film 24 in any of the above examples, the number of water molecules released from the oxide insulating film 23, the number of oxygen molecules released from the oxide insulating film 24, and the number of defects generated in the oxide semiconductor film when the oxide insulating film 23 or the oxide insulating film 24 is formed is described.

First, a sample was manufactured in which a 400-nm-thick silicon oxynitride film was formed over a silicon wafer by a plasma CVD method as the oxide insulating film 23 or the oxide insulating film 24 under each formation condition, and the sample was evaluated by TDS measurement.

First, the structures of evaluated samples are described. Sample 7 is a sample in which a silicon oxynitride film was formed under the following conditions. In the conditions, as source gases, the flow rate of silane was set to 30 sccm, and the flow rate of dinitrogen monoxide was set to 4000 sccm, the pressure in the treatment chamber was set to 200 Pa, the substrate temperature was set to 220° C., and a high-frequency power of 150 W was supplied to parallel-plate electrodes. Note that Sample 7 is a silicon oxynitride film formed using the formation conditions of the oxide insulating film 23 in Sample 1 of Example 1.

Next, Sample 8 is a sample in which a silicon oxynitride film corresponding to the oxide insulating film 23 in any of the above examples was formed under the following conditions. In the conditions, pressure in the treatment chamber was set to 120 Pa in the conditions of Sample 7.

Sample 9 is a sample in which a silicon oxynitride film corresponding to the oxide insulating film 23 in any of the above examples was formed under the following conditions. In the conditions, pressure in the treatment chamber was set to 40 Pa in the conditions of Sample 7.

Figure 33A:
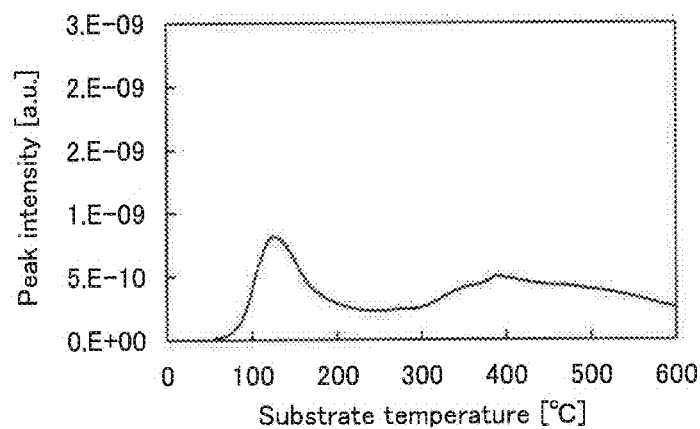
FIGS. 33A to 33C are graphs each showing the result of TDS measurement.
Figure 33B:
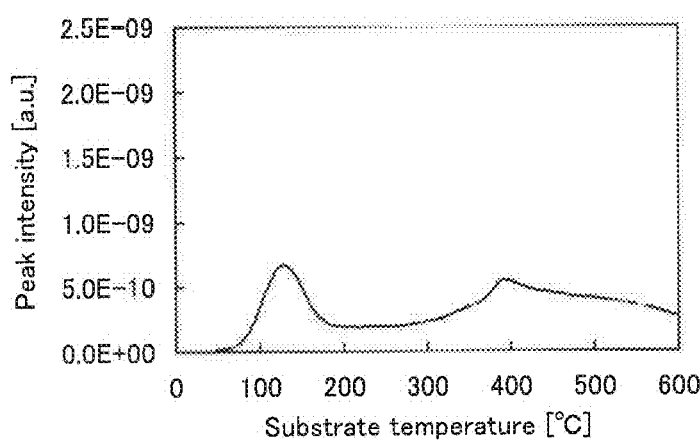
Figure 33C:
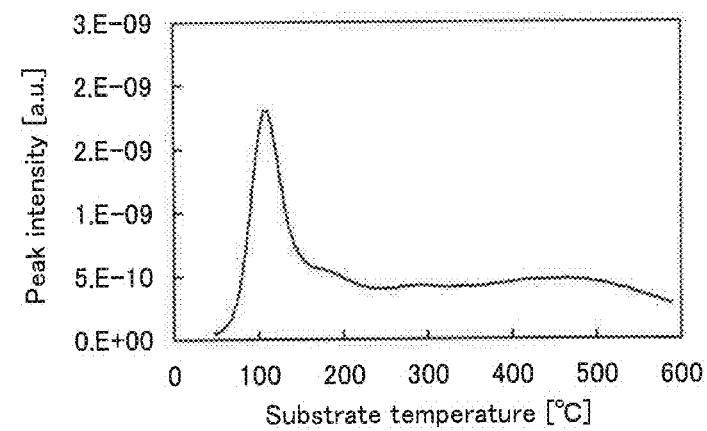

The results of TDS measurements of Sample 7 to Sample 9 are shown in FIGS. 33A to 33C. FIG. 33A shows measurement results indicating the number of water molecules released from Sample 7, FIG. 33B shows measurement results indicating the number of water molecules released from Sample 8, and FIG. 33C shows measurement results indicating the number of water molecules released from Sample 9. From FIGS. 33A to 33C, a peak at a substrate temperature of approximately 120° C. in Sample 9 is higher than peaks in Sample 7 and Sample 8. That is, it can be found that the numbers of released water molecules of Sample 7 and Sample 8 at a substrate temperature lower than or equal to 300° C. are smaller than that of Sample 9.

Note that the total number of water molecules released by heating corresponds to a value of the integral of a curve showing the result of TDS analysis. In Sample 7, the amount released by heating at temperatures ranging from 55° C. to 600° C. was $5.6 \times 10^{16}$ molecules/cm$^2$. In Sample 8, the number released by heating at temperatures ranging from 50° C. to 600° C. was $5.4 \times 10^{16}$ molecules/cm$^2$. In Sample 9, the number released by heating at temperatures ranging from 50° C. to 580° C. was $6.5 \times 10^{16}$ molecules/cm$^2$. Note that the value obtained by converting the number of water molecules released from Sample 7 into that per unit volume was $1.4 \times 10^{21}$ molecules/cm$^3$, the value obtained by converting the number of water molecules released from Sample 8 into that per unit volume was $1.3 \times 10^{21}$ molecules/cm$^3$, and the value obtained by converting the number of water molecules released from Sample 9 into that per unit volume was $1.6 \times 10^{21}$ molecules/cm$^3$.

It can be found that, by increasing the pressure when the silicon oxynitride film which is the oxide insulating film 23 is formed, the number of water molecules released at a substrate temperature lower than or equal to 300° C. can be reduced.

Next, as the oxide insulating film 24 of the transistor described in any of the above examples, a silicon oxynitride film which contains more oxygen than that in the stoichiometric composition and from which part of oxygen is released by heating is described.

In order to confirm that more oxygen than that in the stoichiometric composition is contained and part of oxygen is released by heating, TDS measurement was performed to measure the amount of released oxygen.

First, the structures of samples subjected to the measurement are described. In Reference sample 1, a 400-nm-thick silicon oxynitride film was formed over a silicon wafer under the following conditions. In the conditions, formation was performed by a plasma CVD method in which silane with a flow rate of 160 sccm and dinitrogen monoxide with a flow rate of 4000 sccm were used as source gases, the pressure in a treatment chamber was 200 Pa, the substrate temperature was 220° C., and a high-frequency power of 1500 W was supplied to parallel plate electrodes.

Reference sample 2 is a reference sample in which a 400-nm-thick silicon oxynitride film was formed over a silicon wafer under the following conditions. As the conditions, the flow rate of silane was changed into 200 sccm in the conditions of Reference sample 1, and conditions except that are the same as those of Reference sample 1.

Figure 34A:
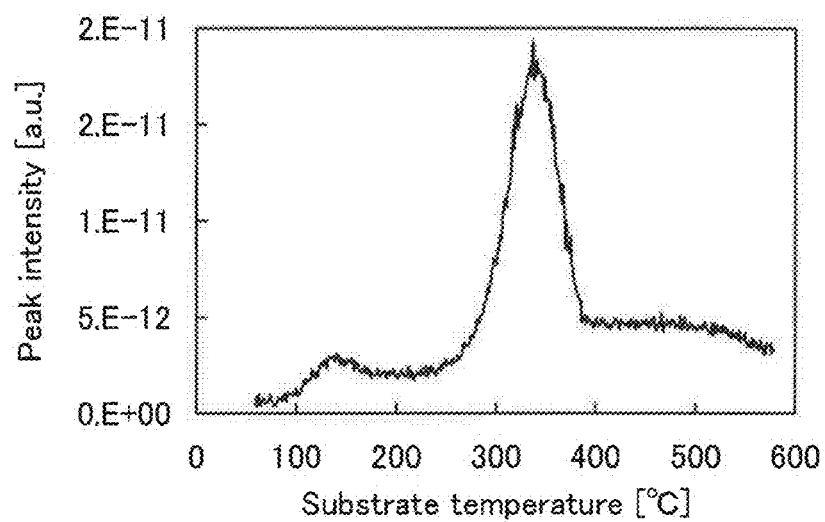
FIGS. 34A and 34B are graphs each showing the result of TDS measurement.
Figure 34B:
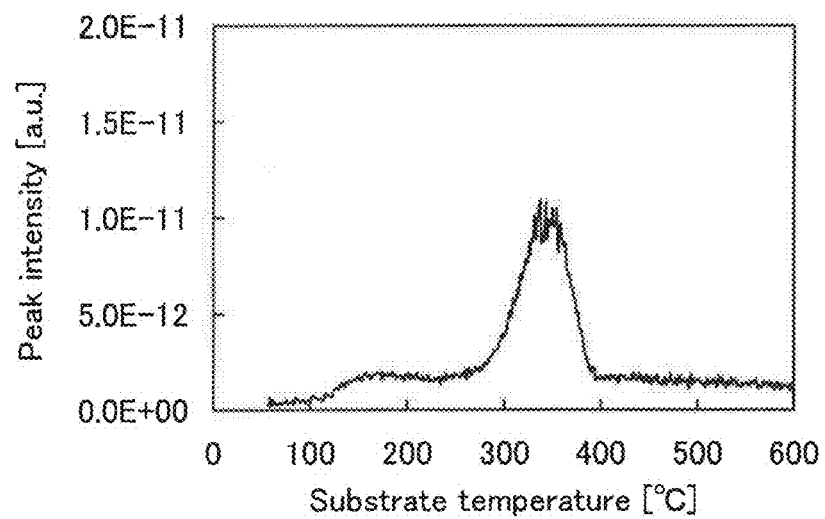

The results of TDS measurements of Reference sample 1 and Reference sample 2 are shown in FIGS. 34A and 34B. In FIGS. 34A and 34B, a peak of M/z=32 corresponding to the mass number of an oxygen molecule was observed from each of Reference sample 1 and Reference sample 2. Thus, as for the silicon oxynitride film in each of Reference sample 1 and Reference sample 2, it can be said that part of oxygen molecules contained in the film is released by heating.

Note that the total number of oxygen molecules released by heating corresponds to a value of the integral of a curve showing the result of TDS analysis. In Reference sample 1, the amount released by heating at temperatures ranging from 60° C. to 575° C. was $3.2 \times 10^{14}$ molecules/cm$^2$. In Reference sample 2, the number released by heating at temperatures ranging from 60° C. to 600° C. was $1.9 \times 10^{14}$ molecules/cm$^2$. Note that the value obtained by converting the amount of oxygen released from Reference sample 1 into oxygen atoms (per unit volume) was $1.6 \times 10^{19}$ atoms/cm$^3$, and the value obtained by converting the amount of oxygen released from Reference sample 2 into oxygen atoms (per unit volume) was $9.5 \times 10^{18}$ atoms/cm$^3$.

From the above, when the flow rate of silane relative to dinitrogen monoxide is increased, defects in a silicon oxynitride film formed can be reduced, whereas the number of released oxygen molecules is reduced. Further, when the flow rate of silane relative to dinitrogen monoxide is reduced, the number of released oxygen molecules is found to be increased.

Next, defects generated in an oxide semiconductor film when the oxide insulating film 23 used in Sample 7 to Sample 9 or the oxide insulating film 24 used in Reference sample 1 and Reference sample 2 is formed over the oxide semiconductor film are described. In this example, the number of defects in the oxide semiconductor film is described using the results of electron spin resonance (ESR) measurement.

First, the structures of evaluated samples are described.

Sample 10 to Sample 12 and Reference sample 3 and Reference sample 4 each include a 100-nm-thick oxide semiconductor film formed over a quartz substrate and a 400-nm-thick oxide insulating film formed over the oxide semiconductor film.

The oxide semiconductor film was formed in such a manner that a sputtering target where In:Ga:Zn=1:1:1 (atomic ratio) was used, argon with a flow rate of 50 sccm and oxygen with a flow rate of 50 sccm were supplied as sputtering gases into a treatment chamber of a sputtering apparatus, the pressure in the treatment chamber was adjusted to 0.6 Pa, and a direct-current power of 5 kW was supplied. Note that the oxide semiconductor film was formed at a substrate temperature of 170° C.

A sample including the oxide insulating film formed over the oxide semiconductor film under conditions similar to those of the silicon oxynitride film in Sample 7 is referred to as Sample 10.

A sample including the oxide insulating film formed over the oxide semiconductor film under conditions similar to those of the silicon oxynitride film in Sample 8 is referred to as Sample 11.

A sample including the oxide insulating film formed over the oxide semiconductor film under conditions similar to those of the silicon oxynitride film in Sample 9 is referred to as Sample 12.

A sample including the oxide insulating film formed over the oxide semiconductor film under conditions similar to those of the silicon oxynitride film in Reference sample 1 is referred to as Reference sample 3.

A sample including the oxide insulating film formed over the oxide semiconductor film under conditions similar to those of the silicon oxynitride film in Reference sample 2 is referred to as Reference sample 4.

That is, in each of Samples 10 to Sample 12, a silicon oxynitride film corresponding to the oxide insulating film 23 was formed. In addition, in Reference sample 3 and Reference sample 4, a silicon oxynitride film corresponding to the oxide insulating film 24 was formed.

Next, ESR measurement was performed on Sample 10 to Sample 12 and Reference sample 3 and Reference sample 4. In the ESR measurement performed at a predetermined temperature, a value of a magnetic field ($H_0$) where a microwave is absorbed is used for an equation $g=h\nu/\beta H_0$, so that a parameter of a g-factor can be obtained. Note that $\nu$ represents the frequency of the microwave. Note that h and $\beta$ represent the Planck constant and the Bohr magneton, respectively, and are both constants.

Here, the ESR measurement was performed under the following conditions. The measurement temperature was room temperature (25° C.), the high-frequency power (power of microwaves) of 9.06 GHz was 20 mW, and the direction of a magnetic field was parallel to a film surface of each sample.

Figure 35:
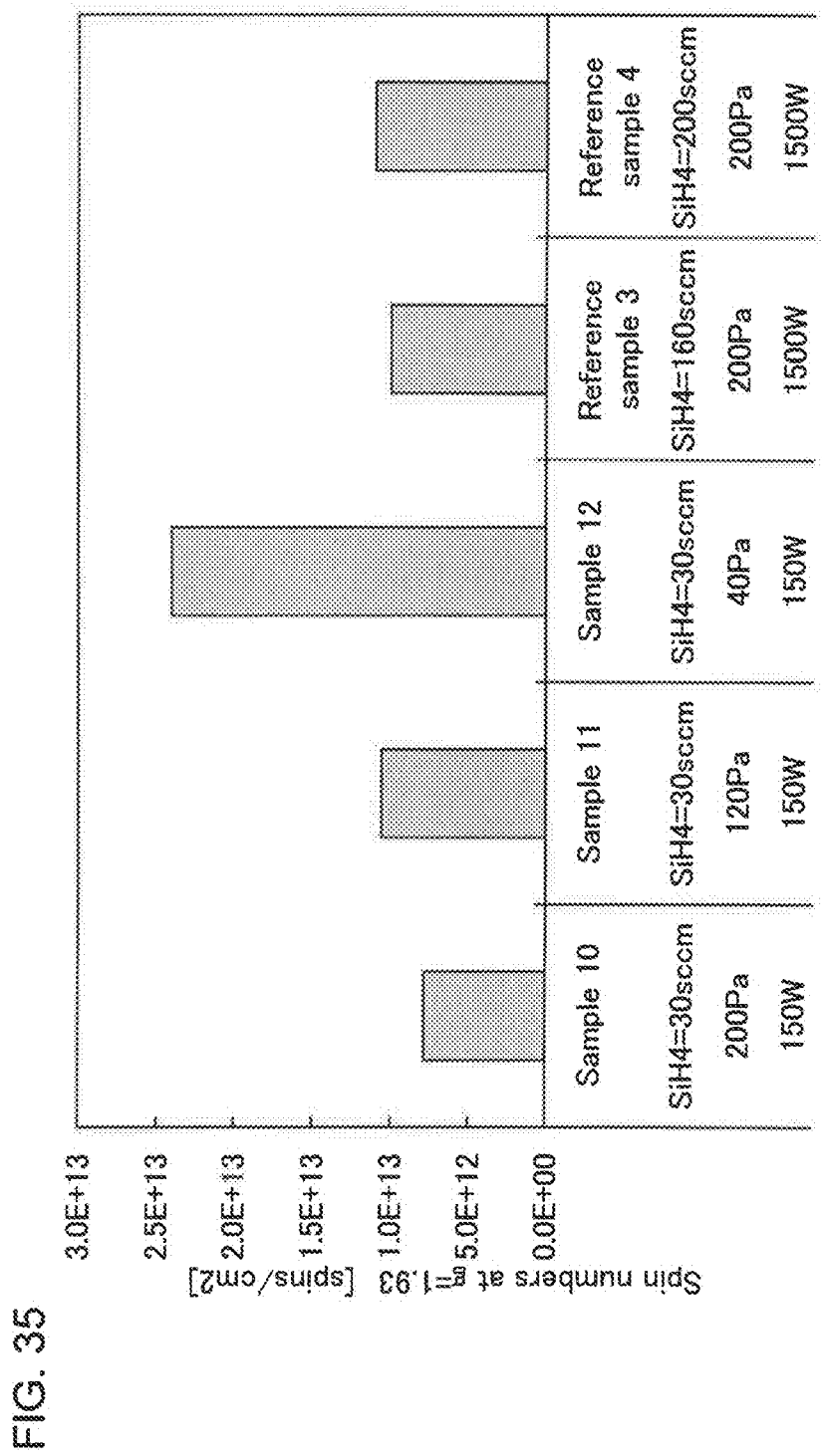
FIG. 35 is a graph illustrating the results of ESR measurement.

The number of spins of signals that appear at g (g-factor)=1.93 is shown in FIG. 35.

It can be found that the numbers of spins in Sample 10 and Sample 11 are smaller than that in Sample 12. That is, it can be found that damage to the oxide semiconductor film is relieved when the pressure is higher than or equal to 100 Pa and lower than or equal to 250 Pa in the film formation conditions of the oxide insulating film 23.

In FIGS. 34A and 34B, in the film formation conditions of the oxide insulating film 24 which contains more oxygen than that in the stoichiometric composition and from which part of oxygen is released by heating, when the flow rate of silane relative to dinitrogen monoxide is increased as that of Reference sample 2, the number of released oxygen molecules is reduced, though defects in the oxide insulating film 24 can be reduced. However, in the film formation conditions of the oxide insulating film 23, when the pressure is set to be higher than or equal to 100 Pa and lower than or equal to 250 Pa as set for Sample 10 and Sample 11, damage to the oxide semiconductor film is relieved; thus, defects in the oxide semiconductor film can be sufficiently reduced even when the amount of excess oxygen moved from the oxide insulating film 24 from which part of oxygen is released by heating is small.

The results of TDS and ESR measurements in this example indicate that, when the pressure is set to be higher than or equal to 100 Pa and lower than or equal to 250 Pa in the film formation conditions of the oxide insulating film 23 formed over the transistor, the number of water molecules released from the oxide insulating film 23 can be reduced and damage to the oxide semiconductor film can be reduced, so that the number of oxygen vacancies can be reduced. Thus, movement of water from the oxide insulating film 23 to the oxide semiconductor film can be reduced. Further, even when the number of oxygen molecules released from the oxide insulating film which contains more oxygen than that in the stoichiometric composition and from which part of oxygen is released by heating is small, the oxygen vacancies in the oxide semiconductor film can be sufficiently reduced. Therefore, when the pressure is set to be higher than or equal to 100 Pa and lower than or equal to 250 Pa in the film formation conditions of the oxide insulating film 23, the electrical characteristics of the transistor can be improved.

EXAMPLE 5

In this example, the defect density of the oxide insulating film 24 used in Reference sample 1 and Reference sample 2 in Example 4 is described. In this example, the number of defects in the oxide insulating film 24 is described using the results of ESR (electron spin resonance) measurement.

First, the structures of evaluated samples are described.

Reference sample 5 and Reference sample 6 each include a 100-nm-thick oxide semiconductor film formed over a quartz substrate and a 400-nm-thick oxide insulating film formed over the oxide semiconductor film.

As in Reference sample 3 and Reference sample 4, the oxide semiconductor film was formed in such a manner that a sputtering target where In:Ga:Zn=1:1:1 (atomic ratio) was used, argon with a flow rate of 50 sccm and oxygen with a flow rate of 50 sccm were supplied as sputtering gases into a treatment chamber of a sputtering apparatus, the pressure in the treatment chamber was adjusted to 0.6 Pa, and a direct-current power of 5 kW was supplied. Note that the oxide semiconductor film was formed at a substrate temperature of 170° C.

Next, after heat treatment was performed at 450° C. under a nitrogen atmosphere for one hour, heat treatment was performed at 450° C. in an atmosphere of nitrogen and oxygen for one hour.

Next, an oxide insulating film was formed over the oxide semiconductor film. A sample including the oxide insulating film under conditions similar to those of the silicon oxynitride film in Reference sample 1 is referred to as Reference sample 5.

A sample including the oxide insulating film formed over the oxide semiconductor film under conditions similar to those of the silicon oxynitride film in Reference sample 2 is referred to as Reference sample 6.

Next, Reference sample 5 and Reference sample 6 were measured by ESR. Here, the ESR measurement was performed under the following conditions. The measurement temperature was −170° C., the high-frequency power (power of microwaves) of 9.1 GHz was 1 mW, and the direction of a magnetic field was parallel to a surface of each sample.

Figure 36:
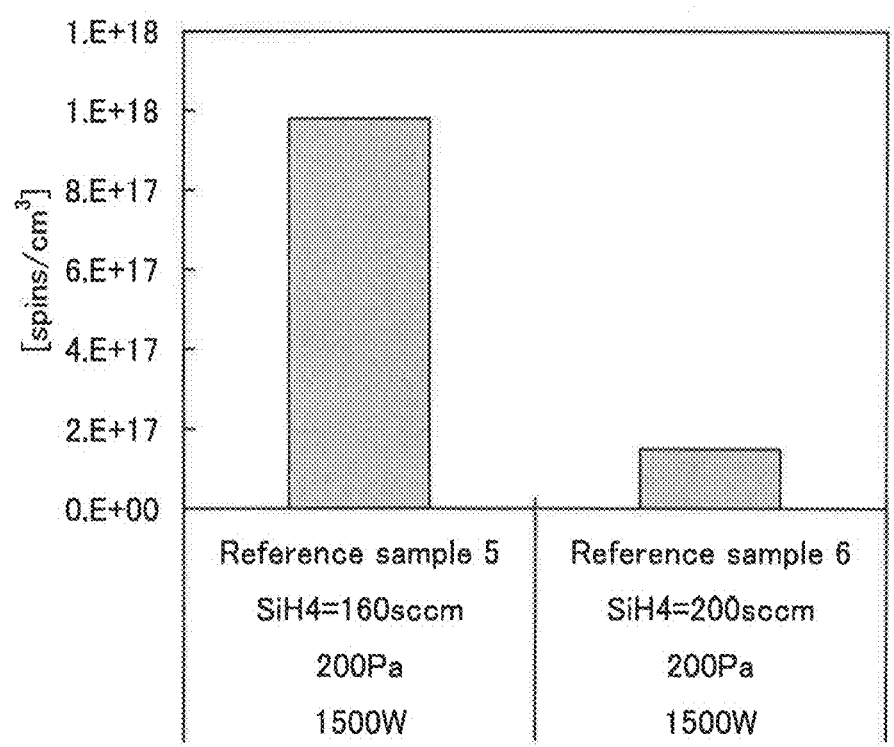
FIG. 36 is a graph illustrating the results of ESR measurement.

The number of spins of signals which appear at g (g-factor)=2.001 due to dangling bonds of silicon is shown in FIG. 36.

It can be found that the number of spins in Reference sample 6 is smaller than that in Reference sample 5. That is, in the film formation conditions of the oxide insulating film 24, when the flow rate of silane is 200 sccm and the flow rate of dinitrogen monoxide is 4000 sccm, it is possible to form a silicon oxynitride film with fewer defects, typically, a silicon oxynitride film in which the spin density of a signal which appears at g=2.001, is lower than $6\times10^{17}$ spins/cm$^3$, preferably lower than or equal to $3\times10^{17}$ spins/cm$^3$, more preferably lower than or equal to $1.5\times\square10^{17}$ spins/cm$^3$ by ESR measurement.

EXAMPLE 6

In this example, a localized state of a multilayer film included in a transistor which is one embodiment of the present invention is described. Here, the results of evaluating the multilayer film by CPM measurement are described.

First, samples subjected to CPM measurement are described.

A 30-nm-thick first oxide film containing In or Ga was formed over a glass substrate, a 100-nm-thick oxide semiconductor film was formed over the first oxide film containing In or Ga, and a 30-nm-thick second oxide film containing In or Ga was formed over the oxide semiconductor film; thus, the multilayer film was formed.

In this example, the first oxide film containing In or Ga and the second oxide film containing In or Ga are oxide films each formed by a sputtering method using an In—Ga—Zn oxide (In:Ga:Zn=1:3:2 [atomic ratio]) target. Note that the films were formed in such a manner that an argon gas of 30 sccm and an oxygen gas of 15 sccm were used as a film formation gas, the pressure was set to be 0.4 Pa, the substrate temperature was set to be 200° C., and a DC power of 0.5 kW was applied.

Further, the oxide semiconductor film is an oxide semiconductor film formed by a sputtering method using an In—Ga—Zn oxide (In:Ga:Zn=1:1:1 [atomic ratio]) target. Note that the film was formed in such a manner that an argon gas of 30 sccm and an oxygen gas of 15 sccm were used as a deposition gas, the pressure was set to be 0.4 Pa, the substrate temperature was set to be 200° C., and a DC power of 0.5 kW was applied.

A sample manufactured in the above-described manner is referred to as Sample 13.

Next, CPM measurement was performed on Sample 13. Specifically, the amount of light with which a surface of Sample 13 between terminals is irradiated is adjusted so that a photocurrent value is kept constant in the state where voltage is applied between a first electrode and a second electrode provided in contact with the multilayer film of the sample, and then an absorption coefficient is derived from the amount of the irradiation light in an intended wavelength range.

Figure 37A:
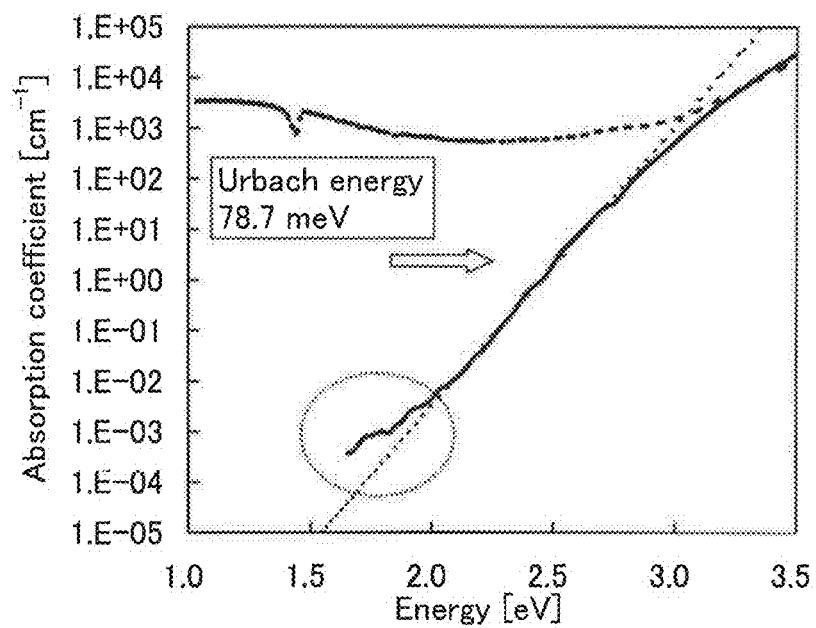
FIGS. 37A and 37B are graphs showing the results of CPM measurement of a multilayer film included in a transistor.
Figure 37B:
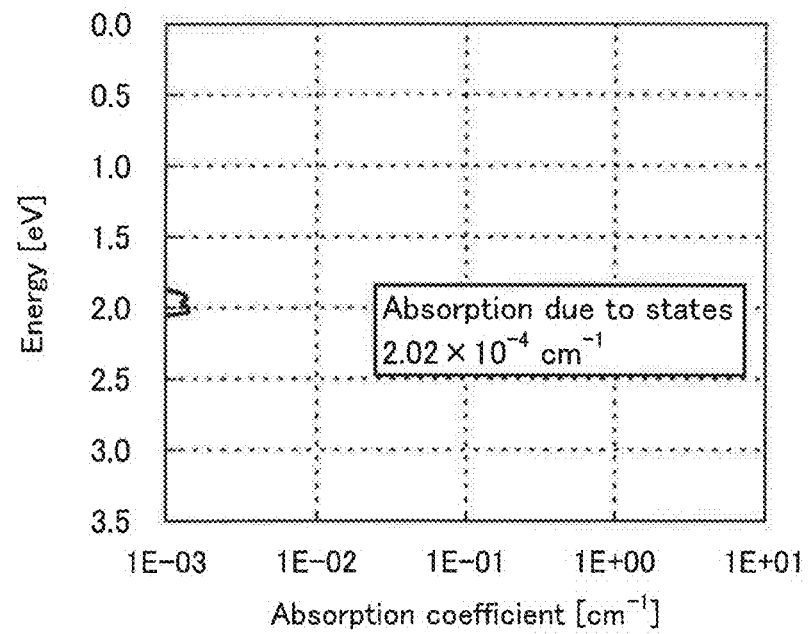

FIGS. 37A and 37B shows results of fitting the absorption coefficient (thick dotted line) measured using a spectrophotometer and the absorption coefficient (thick solid line) measured by CPM in the range of energy higher than or equal to the energy gap of each layer included in the multilayer film. Note that in a curve of the absorption coefficient obtained by CPM measurement, the Urbach energy which is a slope of an Urbach tail (thin dotted line) was 78.7 meV. The integral value of the absorption coefficient in the energy range was derived in such a manner that the absorption coefficient (thin dotted line) of the Urbach tail was subtracted from the absorption coefficient derived from CPM measurement in the energy range shown with a dashed-line circle in FIG. 37A (see FIG. 37B). As a result, the absorption coefficient of this sample was found to be $2.02\times10^{-4}$ cm$^{-1}$.

From the above, it can be considered that the localized state of the multilayer film of Sample 13 is due to an impurity or a defect. Thus, the multilayer film was found to have extremely low density of states due to an impurity or a defect. That is, it can be found that the transistor including the multilayer film has stable electrical characteristics.

EXAMPLE 7

In this example, the concentration of silicon in a multilayer film included in a transistor which is one embodiment of the present invention is described. Here, the results of evaluating the multilayer film by SIMS measurement are described.

First, samples which were measured by SIMS are described.

A 10-nm-thick oxide film 81 containing In or Ga was formed over a silicon wafer Si, a 10-nm-thick oxide semiconductor film 82 was formed over the oxide film 81 containing In or Ga, and a 10-nm-thick oxide film 83 containing In or Ga was formed over the oxide semiconductor film 82; thus, the multilayer film was formed.

In this example, the oxide film 81 containing In or Ga is an oxide film formed by a sputtering method using an In—Ga—Zn oxide (In:Ga:Zn=1:3:2 [atomic ratio]) target. Note that the film was formed in such a manner that an argon gas of 30 sccm and an oxygen gas of 15 sccm were used as a film formation gas, the pressure was set to be 0.4 Pa, the substrate temperature was set to be 200° C., and a DC power of 0.5 kW was applied.

The oxide semiconductor film 82 is an oxide semiconductor film formed by a sputtering method using an In—Ga—Zn oxide (In:Ga:Zn=1:1:1 [atomic ratio]) target. Note that the film was formed in such a manner that an argon gas of 30 sccm and an oxygen gas of 15 sccm were used as a film formation gas, the pressure was set to be 0.4 Pa, the substrate temperature was set to be 300° C., and a DC power of 0.5 kW was applied.

The oxide film 83 containing In or Ga is an oxide film formed by a sputtering method using an In—Ga—Zn oxide (In:Ga:Zn=1:3:2 [atomic ratio]) target. Note that the film was formed in such a manner that an argon gas of 30 sccm and an oxygen gas of 15 sccm were used as a film formation gas, the pressure was set to be 0.4 Pa, the substrate temperature was set to be 200° C., and a DC power of 0.5 kW was applied.

A sample which was not subjected to heat treatment after the multilayer film was formed and a sample which was subjected to heat treatment at 450° C. for 2 hours were prepared. The sample which was not subjected to heat treatment is referred to as Sample 14, and the sample which was subjected to heat treatment is referred to as Sample 15.

Figure 38A:
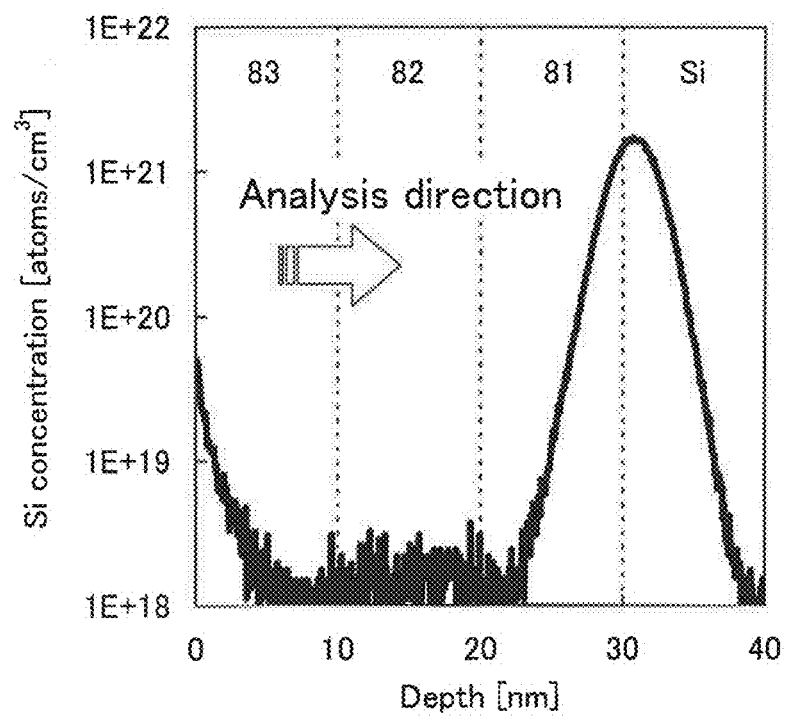
FIGS. 38A and 38B are graphs each showing the result of ToF-SIMS of a multilayer film included in a transistor.

As for Sample 14 and Sample 15, the Si concentration [atoms/cm$^3$] in a depth direction was measured using a time-of-flight secondary ion mass spectrometry (ToF-SIMS). In FIG. 38A, the Si concentration [atoms/cm$^3$] which is converted from the secondary ion intensity of SiO$_3$ in a depth direction of the multilayer film in Sample 14 is shown, and in FIG. 38B, the Si concentration [atoms/cm$^3$] which is converted from the secondary ion intensity of SiO$_3$ in a depth direction of the multilayer film in Sample 15 is shown.

Figure 38B:
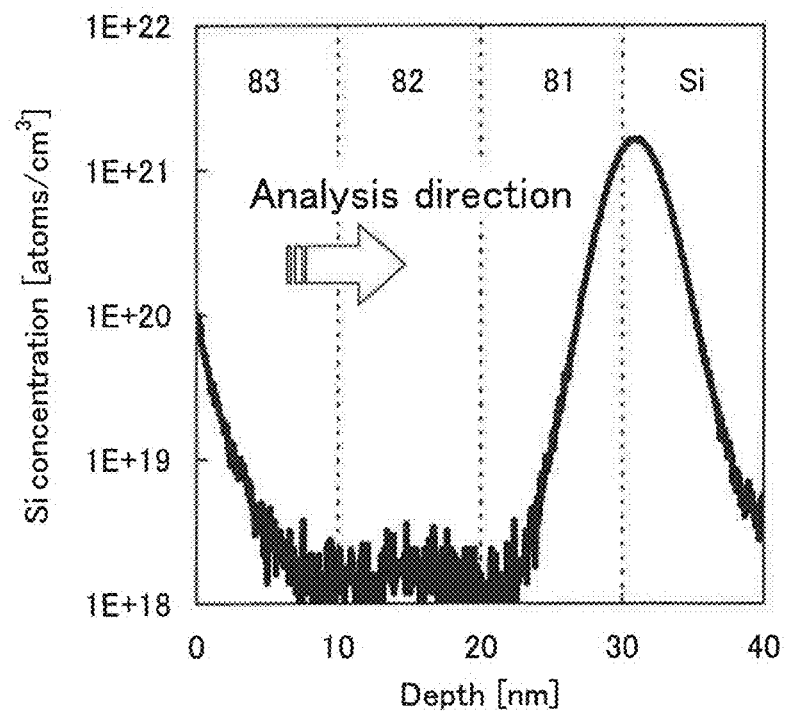

From FIGS. 38A and 38B, it was found that the Si concentration is high at the interface between the silicon wafer and the oxide film 81 containing In or Ga and on the top surface of the oxide film 83 containing In or Ga. Moreover, it was found that the Si concentration of the oxide semiconductor film 82 is about 1×10$^{18}$ atoms/cm$^3$, the lower limit of detection in Tof-SIMS. This is probably because, by providing the oxide film 81 containing In or Ga and the oxide film 83 containing In or Ga, the oxide semiconductor film 82 is not affected by silicon which is due to the silicon wafer, surface contamination, or the like.

Further, from the results shown in FIGS. 38A and 38B, it can be seen that silicon is less likely to be diffused by the heat treatment, though entry of silicon mainly occurs at the time of film formation.

Thus, with the use of a multilayer film as described in this example, a transistor having stable electrical characteristics can be manufactured.

REFERENCE EXAMPLE

Here, the energy barrier between a source and a drain of a transistor including an oxide semiconductor is described.

In the case where an intrinsic or substantially intrinsic oxide semiconductor film is used as an oxide semiconductor film which is to be a channel region, a barrier which is about half the energy gap of the oxide semiconductor film might be formed between the oxide semiconductor film and the pair of electrodes serving as a source electrode and a drain electrode in a transistor including the oxide semiconductor film. However, in practice, drain current starts flowing at a gate voltage of about 0 V in the Vg-Id characteristics of the transistor including the oxide semiconductor film, which suggests that there is a problem in the aforementioned idea.

Figure 39A:
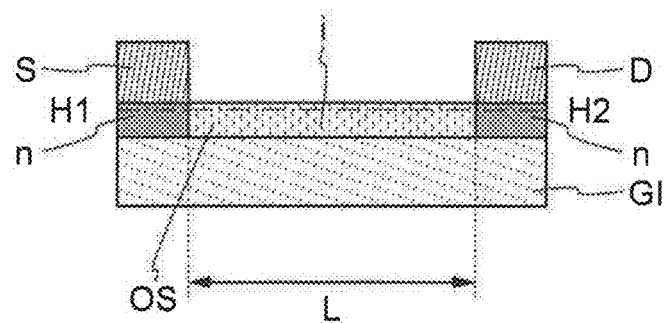
FIGS. 39A and 39B are diagrams each illustrating the structure used in calculation of band structures.

Thus, as shown in FIG. 39A, a transistor with a structure including a gate insulating film GI, an oxide semiconductor film OS over the gate insulating film GI, and a source electrode S and a drain electrode D provided over the oxide semiconductor film OS was assumed, and the band structure of the transistor along dashed-dotted line H1-H2, in which the channel length (L) was varied, was derived from calculation. Note that in FIG. 39A, n-type low-resistance regions n are provided in regions of the oxide semiconductor film OS in contact with the source electrode S and the drain electrode D. That is, the oxide semiconductor film OS includes the low-resistance regions n and an intrinsic or substantially intrinsic region i. Note that in the calculation, the oxide semiconductor film OS was assumed to have a thickness of 35 nm and the gate insulating film GI was assumed to have a thickness of 400 nm to perform the calculation.

The width of band bending was estimated by solving Poisson's equation, whereby the width of band bending was found to be a length characterized by a Debye shielding length $\lambda_D$. Note that in the following equation, $k_B$ represents a Boltzmann constant.

$$\lambda_D = \sqrt{\frac{\varepsilon\varepsilon_0 k_B T}{e^2 ni}} \qquad \text{[Formula 2]}$$

In the above equation, when the intrinsic carrier density ni of the oxide semiconductor film OS was 6.6×10$^{-9}$ cm$^{-3}$, the relative permittivity s of the oxide semiconductor film OS was 15, and the temperature was 300 K, the Debye shielding length $\lambda_D$ w was determined to be 5.7×10$^{10}$ μm, which was an extremely large value. Thus, it can be found that the energy barrier between the low-resistance region n and the intrinsic or substantially intrinsic region i is half the energy gap of the oxide semiconductor film OS in the case where the channel length is longer than 1.14×10$^{11}$ μm which is twice the Debye shielding length $\lambda_D$.

Figure 40:
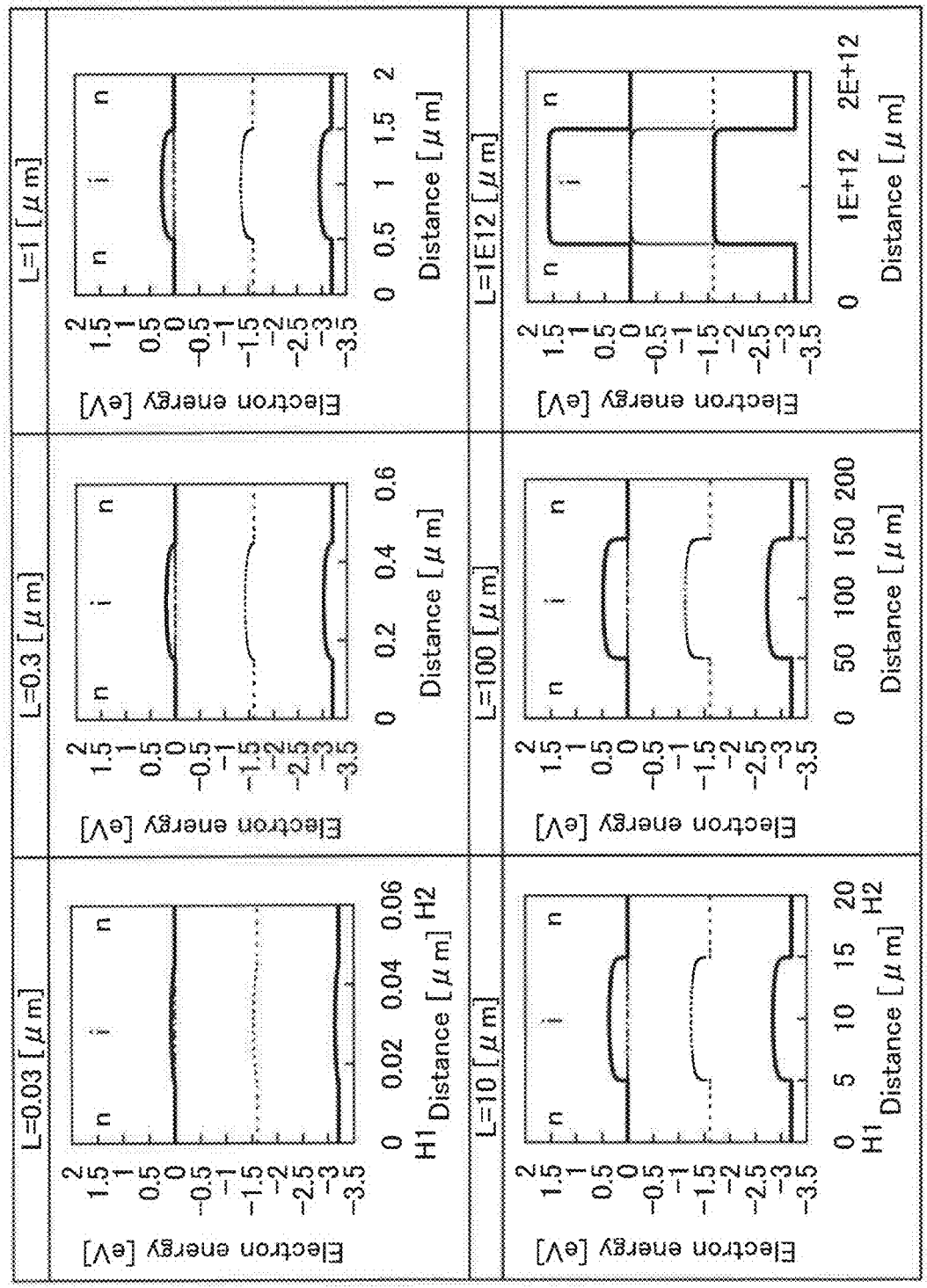
FIG. 40 is a diagram illustrating the results of calculation of band structures.

FIG. 40 shows the results of calculation of band structures where the channel lengths are 0.03 μm, 0.3 μm, 1 μm, 10 μm, 100 μm, and 1×10$^{12}$ μm. Note that the potentials of the source electrode and the drain electrode are fixed to GND (0 V). Note that in FIG. 40, "n" represents the low-resistance region, "i" represents the intrinsic or substantially intrinsic region interposed between the low-resistance regions, a dashed-dotted line represents Fermi energy of the oxide semiconductor film, and a dashed line represents midgap of the oxide semiconductor film.

It was found from FIG. 40 that, in the case where the channel length is 1×10$^{12}$ μm which is long enough, the difference in electron energy between the low-resistance region and the intrinsic or substantially intrinsic region is half the energy gap of the oxide semiconductor film. However, it was found that, as the channel length is reduced, the difference in electron energy between the low-resistance region and the intrinsic or substantially intrinsic region gradually becomes smaller and there is essentially no energy barrier when the channel length is shorter than or equal to 1 µm. Note that the electron energy of the low-resistance region is fixed by the pair of electrodes serving as a source electrode and a drain electrode.

As described above, it can be determined that the energy barrier between the low-resistance region and the intrinsic or substantially intrinsic region is sufficiently low when the channel length is short.

Here, the reason why the energy barrier between the low-resistance region and the intrinsic or substantially intrinsic region is sufficiently low when the channel length is short is considered.

Figure 41A:
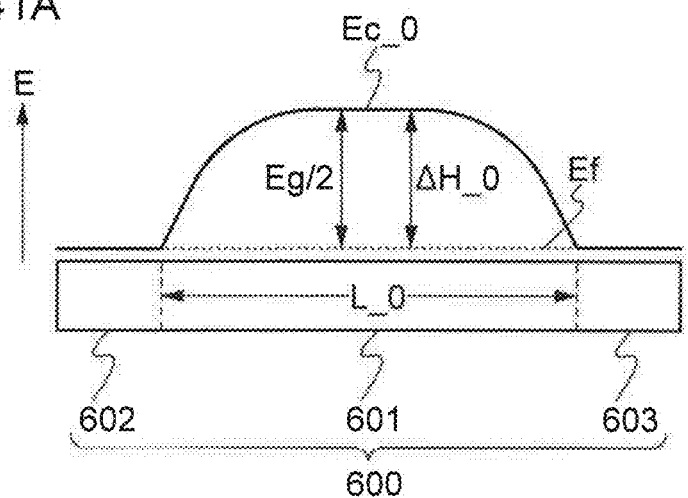
FIGS. 41A to 41C are schematic views of oxide semiconductor films and diagrams illustrating the band structures in the oxide semiconductor films.
Figure 41B:
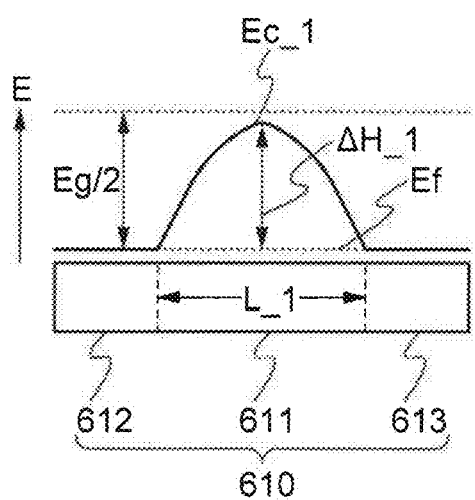
Figure 41C:
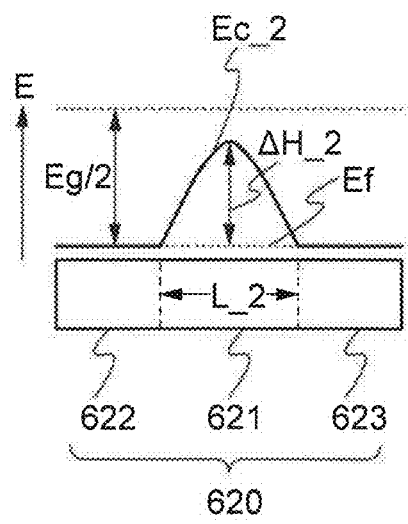

Description is made on the schematic views of an oxide semiconductor film and the band structures of the oxide semiconductor film with reference to FIGS. 41A to 41C. In FIG. 41A, the conduction band bottom Ec_0 of an oxide semiconductor film 600 including an intrinsic or substantially intrinsic region 601 and low-resistance regions 602 and 603 is shown. Further, the channel length of the oxide semiconductor film 600 is denoted by L_0. In FIG. 41A, $L\_0 > 2\lambda_D$ is satisfied.

FIG. 41B shows an oxide semiconductor film whose channel length is shorter than that in FIG. 41A, and the band structure thereof. In FIG. 41B, the conduction band bottom Ec_1 of an oxide semiconductor film 610 including an intrinsic or substantially intrinsic region 611 and low-resistance regions 612 and 613 is shown. Further, the channel length of the oxide semiconductor film 610 is denoted by L_1. In FIG. 41B, the channel length of $L\_1 < L\_0$ and $L\_1 < 2\lambda_D$ is satisfied.

FIG. 41C shows an oxide semiconductor film whose channel length is shorter than the oxide semiconductor films shown in FIGS. 41A and 41B, and the band structure thereof. In FIG. 41C, the conduction band bottom Ec_2 of an oxide semiconductor film 620 including an intrinsic or substantially intrinsic region 621 and low-resistance regions 622 and 623 is shown. Further, the channel length of the oxide semiconductor film 620 is denoted by L_2. The channel length of $L\_2 < L\_1$ and $L\_2 \ll 2\lambda_D$ is satisfied.

The energy difference between the Fermi level Ef and the conduction band bottom Ec_0 is denoted by ΔH_0 in FIG. 41A, the energy gap between the Fermi level Ef and the conduction band bottom Ec_1 is denoted by ΔH_1 in FIG. 41B, and the energy gap between the Fermi level Ef and the conduction band bottom Ec_2 is denoted by ΔH_2 in FIG. 41C.

In the oxide semiconductor film, regions in contact with the pair of electrodes serve as the low-resistance regions. Thus, the closer the junction regions between the intrinsic or substantially intrinsic region and the low-resistance regions are, the more lowered in energy and more bent the conduction band bottom is. In the case where the channel length L_0 is long enough as shown in FIG. 41A, the energy barrier ΔH_0 corresponds to Eg(bandgap)/2.

On the other hand, when the channel length is reduced as shown in each of FIGS. 41B and 41C, the bent portions of the conduction band bottom (Ec_1, Ec_2) overlap with each other; thus, it is probable that the energy barriers ΔH_1 and ΔH_2 are lower than Eg/2. The phenomenon in which the conduction band bottom in the intrinsic or substantially intrinsic region is thus lowered by the reduction of the channel length is referred to as a conduction band lowering (CBL) effect in this specification.

Figure 39B:
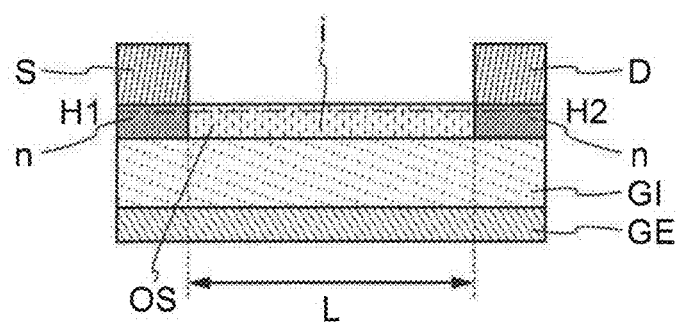

Next, a bottom-gate transistor including a gate electrode GE provided under the gate insulating film GI in the structure shown in FIG. 39A was assumed, and the band structure of the transistor along dashed-dotted line H1-H2, in which the channel length (L) was varied, was derived from calculation. The structure of the transistor used in the calculation is shown in FIG. 39B. Note that in the calculation, the oxide semiconductor film OS was assumed to have a thickness of 35 nm and the gate insulating film GI was assumed to have a thickness of 400 nm to perform the calculation.

Figure 42:
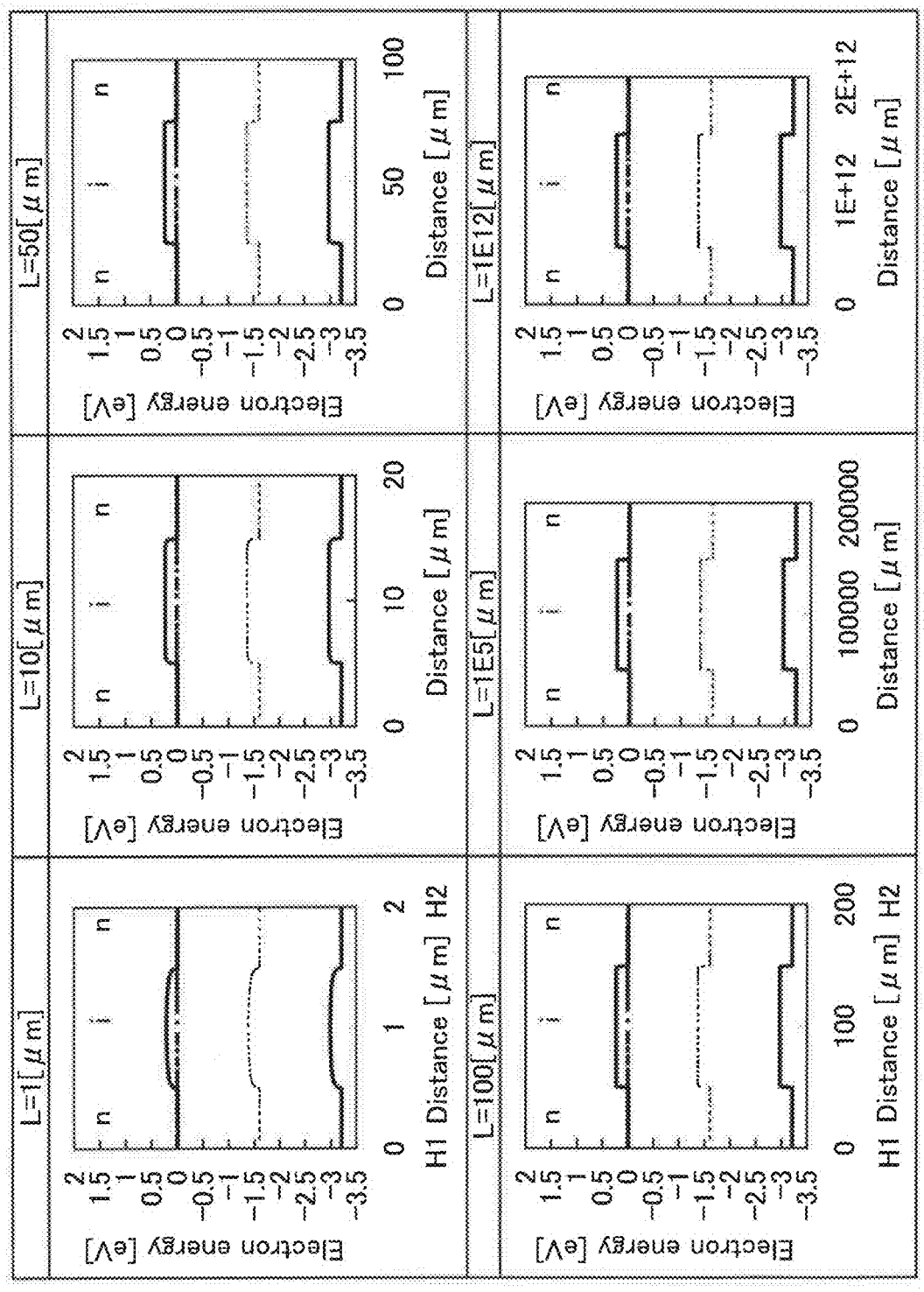
FIG. 42 is a diagram illustrating the results of calculation of band structures.

FIG. 42 shows the results of calculation of band structures where the channel lengths are 1 µm, 10 µm, 50 µm, 100 µm, $1 \times 10^5$ µm, and $1 \times 10^{12}$ µm. Note that the potentials of the source electrode, the drain electrode and the gate electrode are fixed to GND (0 V). Note that in FIG. 42, "n" represents the low-resistance region, "i" represents the intrinsic or substantially intrinsic region interposed between the low-resistance regions, a dashed-dotted line represents Fermi energy of the oxide semiconductor film, and a dashed line represents midgap of the oxide semiconductor film.

The band structures shown in FIG. 42 are the results obtained by performing calculation in a manner similar to that in the structure shown in FIG. 39A. However, it can be found that, in the case where the gate electrode is provided as in the structure of FIG. 39B, the value of the energy barrier between the low-resistance region and the intrinsic or substantially intrinsic region does not depend on the channel length (L) and is substantially constant even when the channel length (L) is longer than 1 µm.

Figure 43:
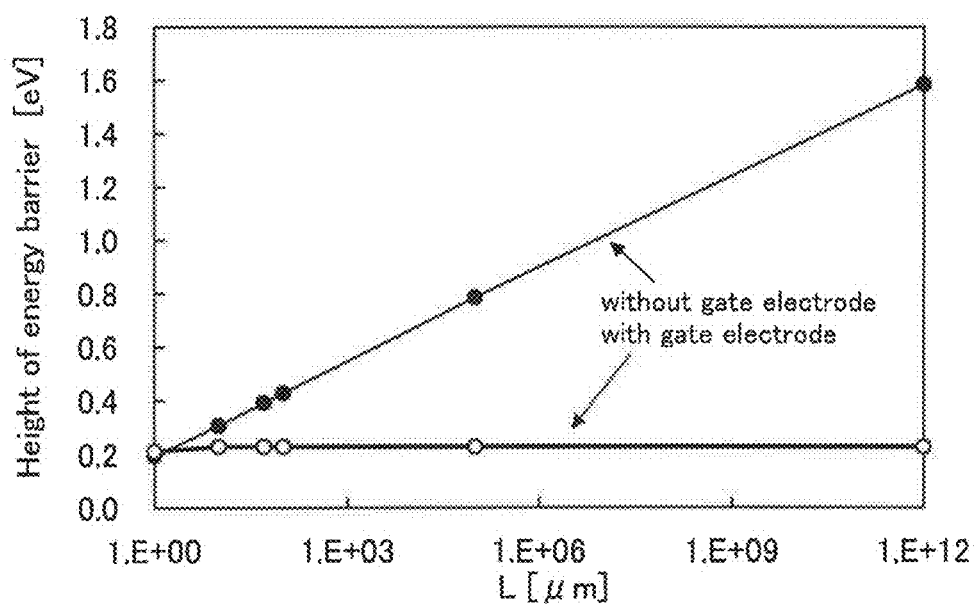
FIG. 43 is a graph showing change of an energy barrier with respect to a channel length.

In FIG. 43, the height of the energy barrier with respect to the channel length (L) in each of the structures of FIG. 39A and FIG. 39B is shown.

From FIG. 43, it can be seen that the height of the energy barrier in the structure of FIG. 39A without a gate electrode monotonically increases as the channel length increases and becomes half the energy gap of the oxide semiconductor film (i.e., 1.6 eV) when the channel length is $1 \times 10^{12}$ µm. On the other hand, it can be seen that the height of the energy barrier of the structure of FIG. 39B with the gate electrode does not depend on the channel length even when the channel length is longer than 1 µm.

From the above, since the energy barrier is lower than the value which is half the energy gap of the oxide semiconductor film by the CBL effect in the transistor including the intrinsic or substantially intrinsic oxide semiconductor film, it can be considered that drain current starts flowing at a gate voltage of about 0 V in the Vg-Id characteristics. Further, since the value of the energy barrier of the transistor whose channel length is longer than a certain length (1 µm) is constant without depending on the channel length, it can be considered that drain current starts flowing at a gate voltage of about 0 V in the Vg-Id characteristics in the transistor including the intrinsic or substantially intrinsic oxide semiconductor film.

The multilayer film included in the transistor of one embodiment of the present invention includes the intrinsic or substantially intrinsic oxide semiconductor film. Thus, it can be considered that, in the transistor including the multilayer film, drain current starts flowing at a gate voltage of about 0 V in the Vg-Id characteristics.

EXAMPLE 8

In this example, the results of manufacturing and evaluating display devices each including an organic EL element and a transistor for driving the organic EL element are described.

The display devices manufactured in this example are Samples a (four types: Sample 16, Sample 17, Sample 18, and Sample 19) in each of which a transistor which is one embodiment of the present invention is used as the transistor for driving the organic EL element, and Comparison samples b (four types: Comparison sample 1, Comparison sample 2, Comparison sample 3, and Comparison sample 4) which are comparative examples.

First of all, a process for manufacturing Sample a is described. In this example, the process is described with reference to FIGS. 4A to 4D.

First, as shown in FIG. 4A, a glass substrate was used as the substrate 11, and the gate electrode 15 was formed over the substrate 11.

A 200-nm-thick tungsten film was formed by a sputtering method, a mask was formed over the tungsten film by a photolithography process, and part of the tungsten film was etched with the use of the mask, so that the gate electrode 15 was formed.

Next, the gate insulating film 17 was formed over the gate electrode 15. The structure and the manufacturing method of the gate insulating film 17 are similar to those in Example 1; thus, they are omitted here.

Next, the multilayer film 20 was formed to overlap with the gate electrode 15 with the gate insulating film 17 interposed therebetween. The structure and the manufacturing method of the multilayer film 20 are similar to those in Example 1 except that the substrate temperature at the time of forming the oxide film containing In or Ga is set to 100° C.; thus, they are omitted here. The structure obtained through the steps up to here is illustrated in FIG. 4B. Note that, in the transistor for driving the organic EL element, a channel length was 11 μm and a channel width was 4 μm.

Next, after the gate electrode was exposed by partly etching the gate insulating film 17 (this step is not illustrated), the pair of electrodes 21 and 22 in contact with the multilayer film 20 was formed as illustrated in FIG. 4C. The structure and the manufacturing method of the pair of electrodes 21 and 22 are similar to those in Example 1; thus, they are omitted here.

Next, a surface of the multilayer film 20 was subjected to cleaning treatment using a phosphoric acid solution in which 85% phosphoric acid was diluted by 100 times.

Next, the protective film 26 was formed over the multilayer film 20 and the pair of electrodes 21 and 22 (see FIG. 4D). The structure and the manufacturing method of the protective film 26 are similar to those in Example 1; thus, they are omitted here.

Next, although not illustrated, an opening which exposes part of the pair of electrodes 21 and 22 was formed by partly etching the protective film 26.

Next, a planarization film was formed (this and subsequent components are not shown) over the protective film 26. Here, the protective film 26 was coated with a composition, and exposure and development were performed, so that a planarization film having an opening through which the pair of electrodes is partly exposed was formed. Note that as the planarization film, a 2.0-μm-thick acrylic resin was formed. Then, heat treatment was performed. The heat treatment was performed at a temperature of 250° C. in an atmosphere containing nitrogen for one hour.

Next, a conductive film connected to part of the pair of electrodes was formed. Here, for the lower electrode of the light-emitting element, a 50-nm-thick titanium film, a 200-nm-thick aluminum film, and an 8-nm-thick titanium film were formed by a sputtering method, and furthermore, an indium tin oxide containing silicon oxide (ITSO) film was formed as a microcavity structure. The thickness of the ITSO films of light-emitting elements in a red pixel, a green pixel, and a blue pixel were 82 nm, 45 nm, and 5 nm, respectively.

Then, a partition wall was formed to cover an end portion of the conductive film. Here, a 1.0-μm-thick polyimide resin was formed as the partition wall. Then, heat treatment was performed. The heat treatment was performed at a temperature of 250° C. in an atmosphere containing nitrogen for one hour.

Next, a spacer with an inverse tapered shape was formed on the partition wall. Here, a 1.0-μm-thick spacer was formed with the use of a negative photosensitive resin. Then, heat treatment was performed. The heat treatment was performed at a temperature of 250° C. in an atmosphere containing nitrogen for one hour.

Further, heat treatment was performed at 230° C. in an atmosphere containing nitrogen for one hour.

Next, an EL layer and an upper electrode were formed over the conductive film. All the light-emitting elements in different color pixels have the same structures of the EL layer and the upper electrode. The light-emitting element of this example is a tandem light-emitting element in which the EL layer includes a fluorescence-emitting unit including a blue light-emitting layer and a phosphorescence-emitting unit including a green light-emitting layer and a red light-emitting layer. As the upper electrode, a 15-nm-thick film was formed by co-evaporation of magnesium and silver.

Here, in each of Sample 16, Sample 17, and Sample 18, a glass substrate having a color filter and a black matrix was used as a counter substrate. Further, in Sample 19, a glass substrate having a drying agent containing calcium oxide in its recessed portion was used as a counter substrate.

Then, an ultraviolet curable resin (XNR5516Z manufactured by Nagase ChemteX Co., Ltd.) was applied, as a sealant, to the counter substrate.

Next, the substrate 11 and the counter substrate were bonded with pressure applied.

Then, the sealant was cured by irradiation with ultraviolet light. Further, heat treatment was performed at 80° C. for one hour in a clean oven.

Through the above process, Sample a was manufactured.

Further, a sample in which the oxide film 19 containing In or Ga in Sample a was not formed was manufactured as Comparison sample b. Note that, in each of Comparison sample 1, Comparison sample 2, and Comparison sample 3, a glass substrate having a color filter and a black matrix was used as a counter substrate. In Comparison sample 4, a glass substrate having a drying agent containing calcium oxide in its recessed portion was used as a counter substrate.

Figure 44:
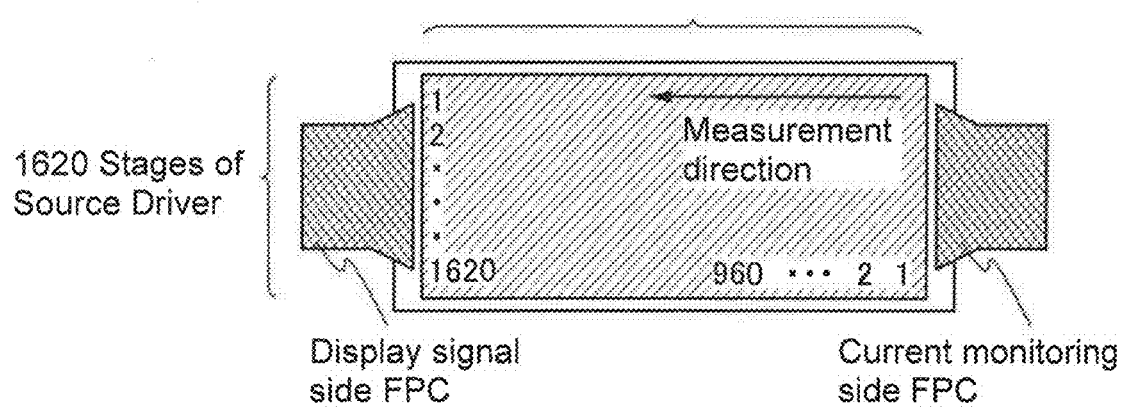
FIG. 44 is a schematic view of a display device.

In each of Sample a and Comparison sample b which were manufactured in this example, the number of stages of a gate driver is 960 and the number of stages of a source driver is 1620 (RGB×540) as shown in FIG. 44.

As for Sample a and Comparison sample b, current flowing in the driving transistor in each pixel when white light was emitted from an entire area was measured. As shown in FIG. 44, current was measured from the current monitoring side to the display signal side in a specific stage of the source driver.

In conditions of the measurement, an anode was set at 10 V and a cathode was set at −4 V. Further, data voltage was set so that luminance was equivalent to 300 cd/m², equivalent to 150 cd/m², or equivalent to 90 cd/m² in Sample 16 and Sample 17 and Comparison sample 1 and Comparison sample 2 and so that luminance was equivalent to 300 cd/m² or equivalent to 50 cd/m² in Sample 18 and Comparison sample 3. Data voltage of Sample 19 and Comparison sample 4 was set so that luminance was equivalent to 300 cd/m$^2$ or equivalent to 50 cd/m$^2$ in the case where the counter substrate is similar to those of other samples. Specifically, first, in each of other samples of which data voltage was set so that luminance was equivalent to 300 cd/m$^2$ or equivalent to 50 cd/m$^2$, current flowing in the light-emitting element was measured. Then, in each of Sample 19 and Comparison sample 4, data voltage was set so that current flowing in the light-emitting element had a similar value.

Specifically, three values of 3.99 V, 2.85 V, and 2.41 V were used for Sample 16; three values of 3.57 V, 2.68 V, and 2.03 V, for Sample 17; two values of 3.78 V and 1.91 V, for Sample 18; and two values of 3.78 V and 1.98 V, for Sample 19. Further, three values of 3.67 V, 2.74 V, and 2.20 V were used for Comparison sample 1; three values of 3.46 V, 2.57 V, and 2.10 V, for Comparison sample 2; two values of 3.78 V and 1.98 V, for Comparison sample 3; and two values of 3.99 V and 2.41 V, for Comparison sample 4.

Figure 45:
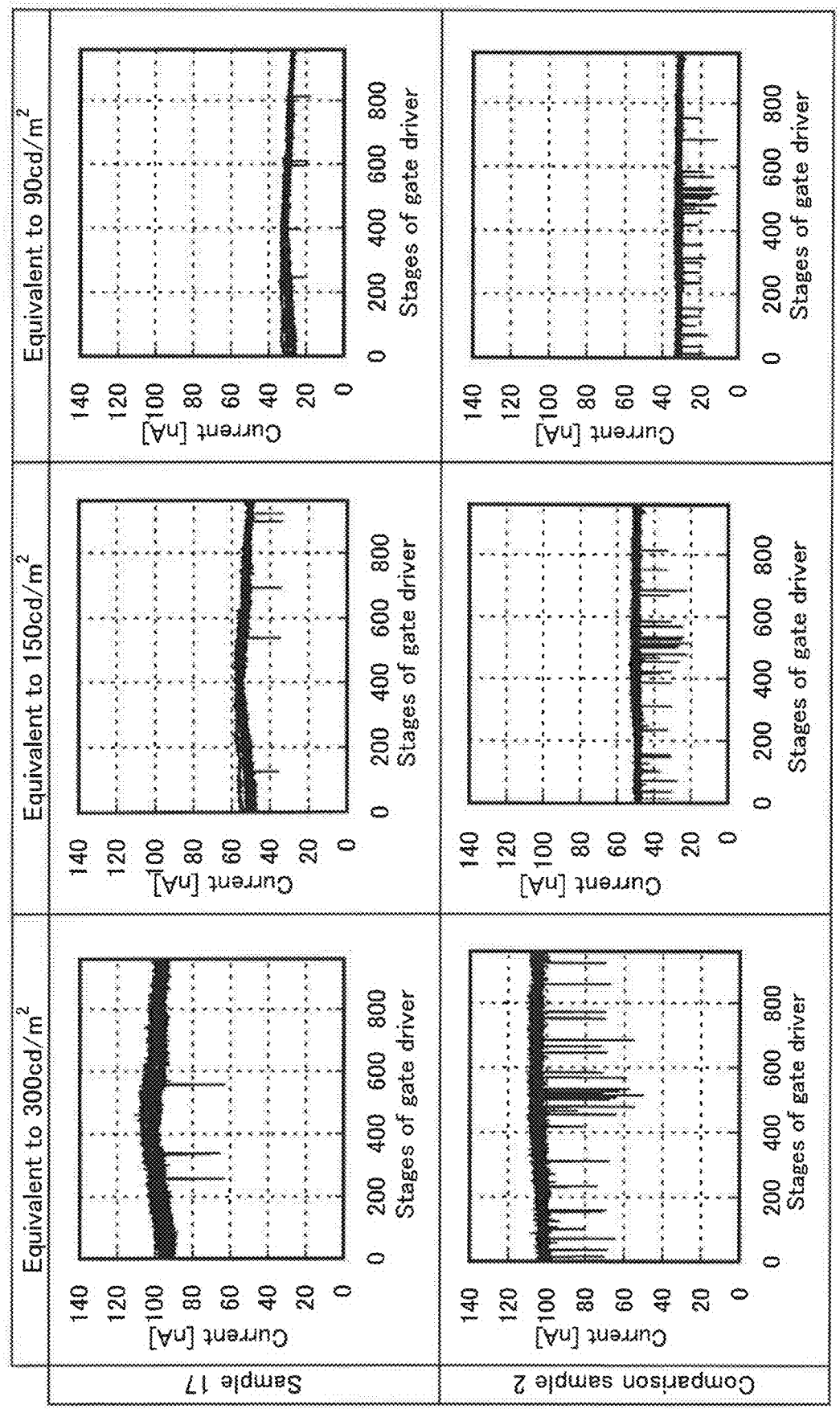
FIG. 45 is a diagram showing the results of measuring current flowing in transistors.

In FIG. 45, the results of measuring currents of Sample 17 and Comparison sample 2 are shown. The horizontal axis indicates the number of stages of the gate driver and the vertical axis indicates current in FIG. 45. Here, the results of measuring current of the driving transistor in each pixel in a 1st stage, a 270th stage, a 540th stage, an 810th stage, an 811th stage, a 1080th stage, a 1350th stage, and a 1620th stage of the source driver are shown together in one graph.

Figure 46:
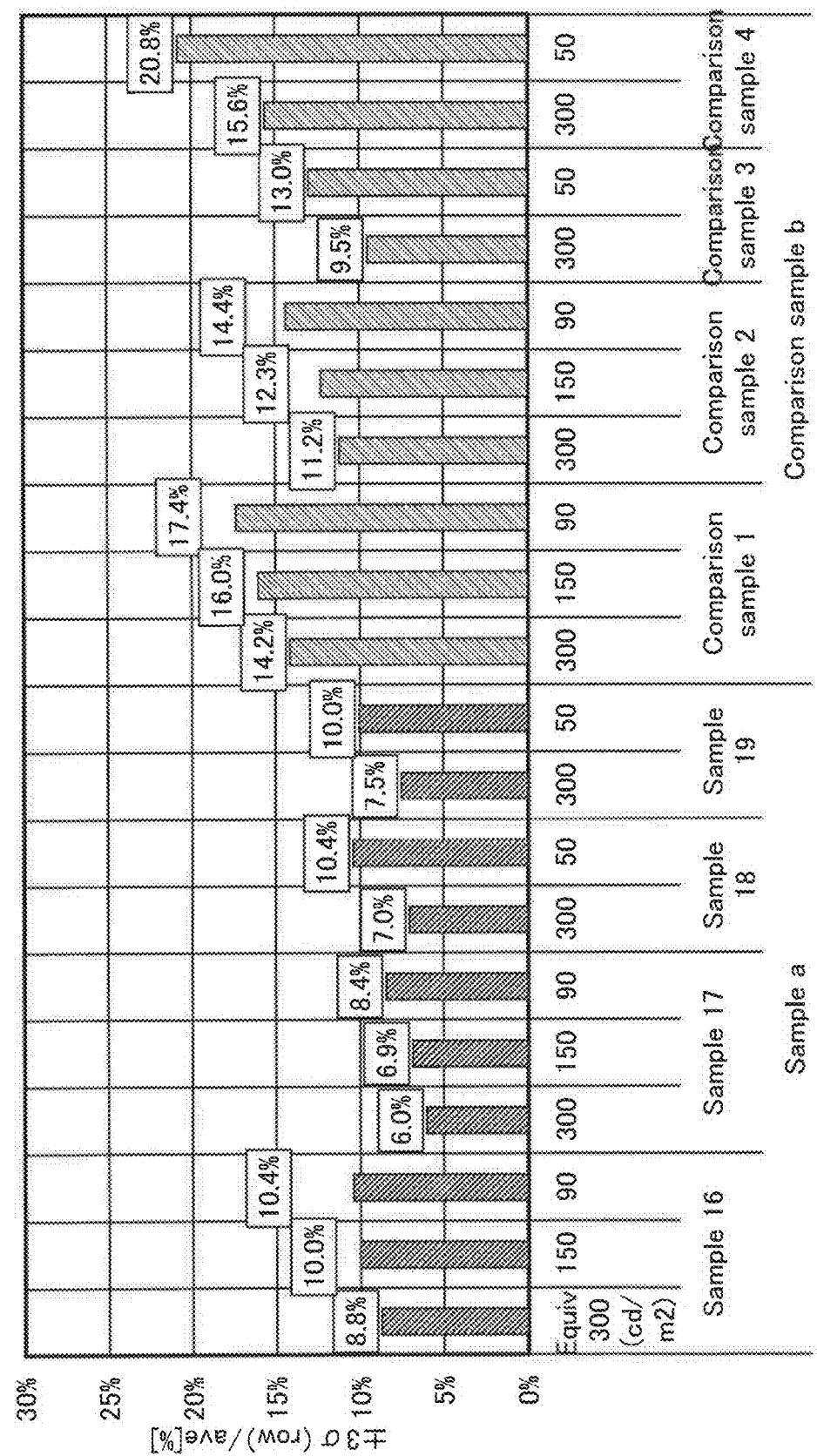
FIG. 46 is a graph showing the results of measuring current flowing in transistors.

Further, in FIG. 46, variation in the difference of current between adjacent pixels in each sample is shown. The vertical axis indicates ±3σ(row)/ave in FIG. 46. Here, σ(row) represents the standard deviation of the difference of current between adjacent pixels in a gate driver (row) direction, and ave represents the overall average value of a pixel current.

From FIGS. 45 and 46, it can be seen that Sample a and Comparison sample b each have small variation in current among pixels. In particular, Sample a including a transistor which is one embodiment of the present invention has smaller variation in current among pixels than Comparison sample b. From the above, it has been shown that the electrical characteristics of the transistor can be improved in accordance with one embodiment of the present invention. Further, it has been shown that the initial display quality of the display device can be improved in accordance with one embodiment of the present invention.

Further, an image of a checkered pattern of black and white was displayed on the entire area of each of Sample 19 and Comparison sample 4 for 72 hours. Data voltage at this time was set by a method similar to that described above so that luminance was equivalent to 300 cd/m$^2$.

Figure 47:
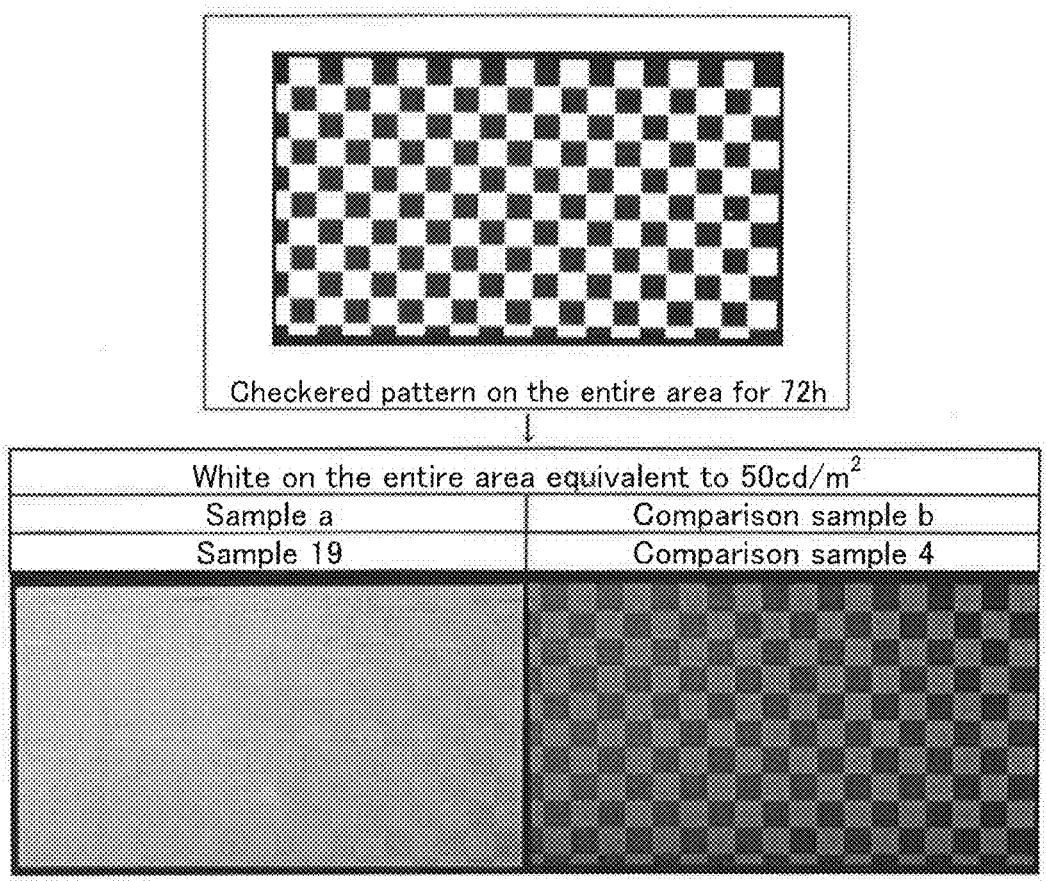
FIG. 47 is a photograph showing the results of display on display devices.

Then, current flowing in the driving transistor in each pixel when a white image was displayed on the entire area of each of Sample 19 and Comparison sample 4 was measured. In FIG. 47, the results of the display on Sample 19 and Comparison sample 4 are shown. In FIGS. 48 to 51, the results of measuring currents of Sample 19 and Comparison sample 4 are shown.

Figure 48:
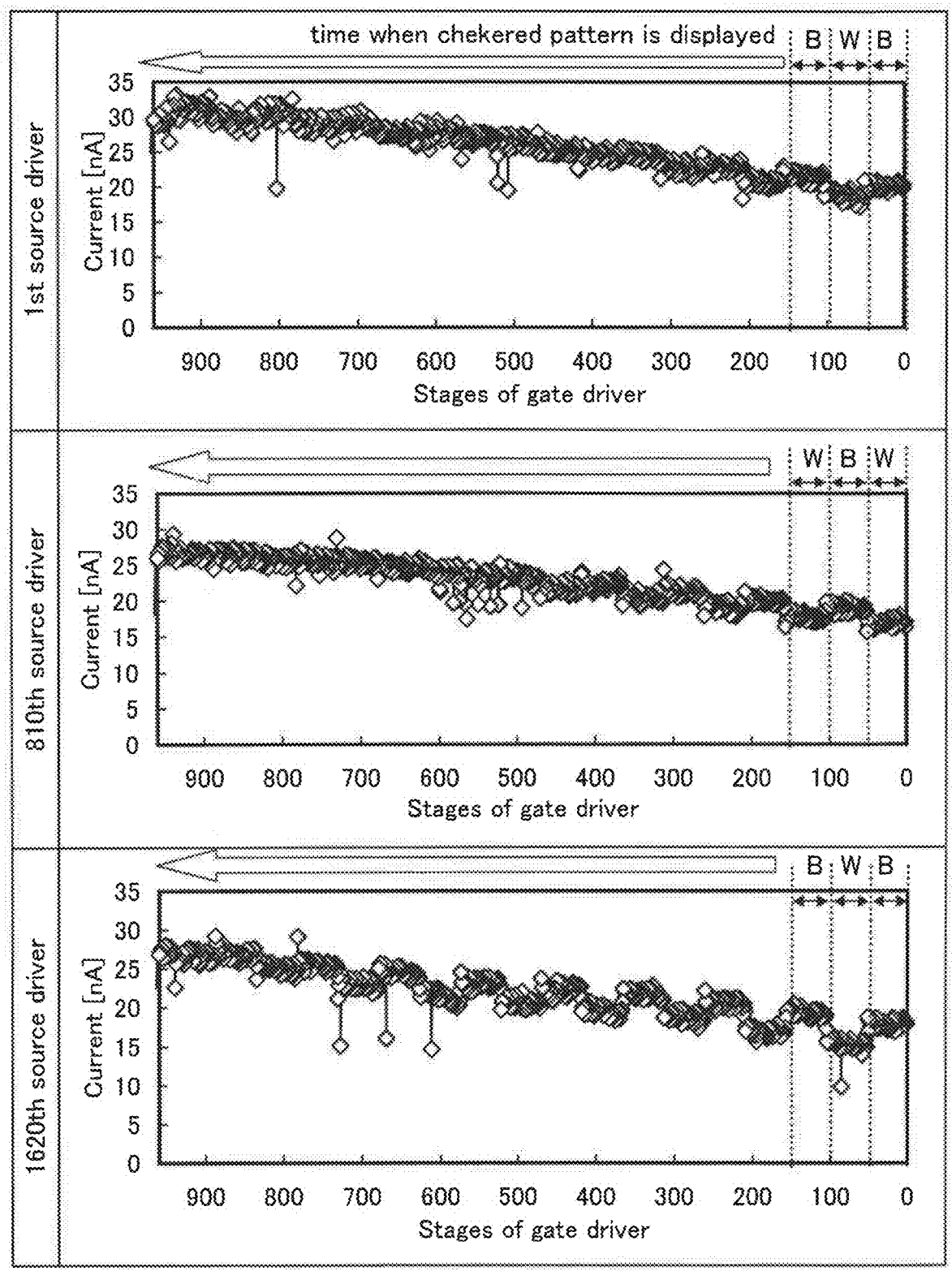
FIG. 48 is a diagram showing the results of measuring current flowing in transistors.
Figure 49:
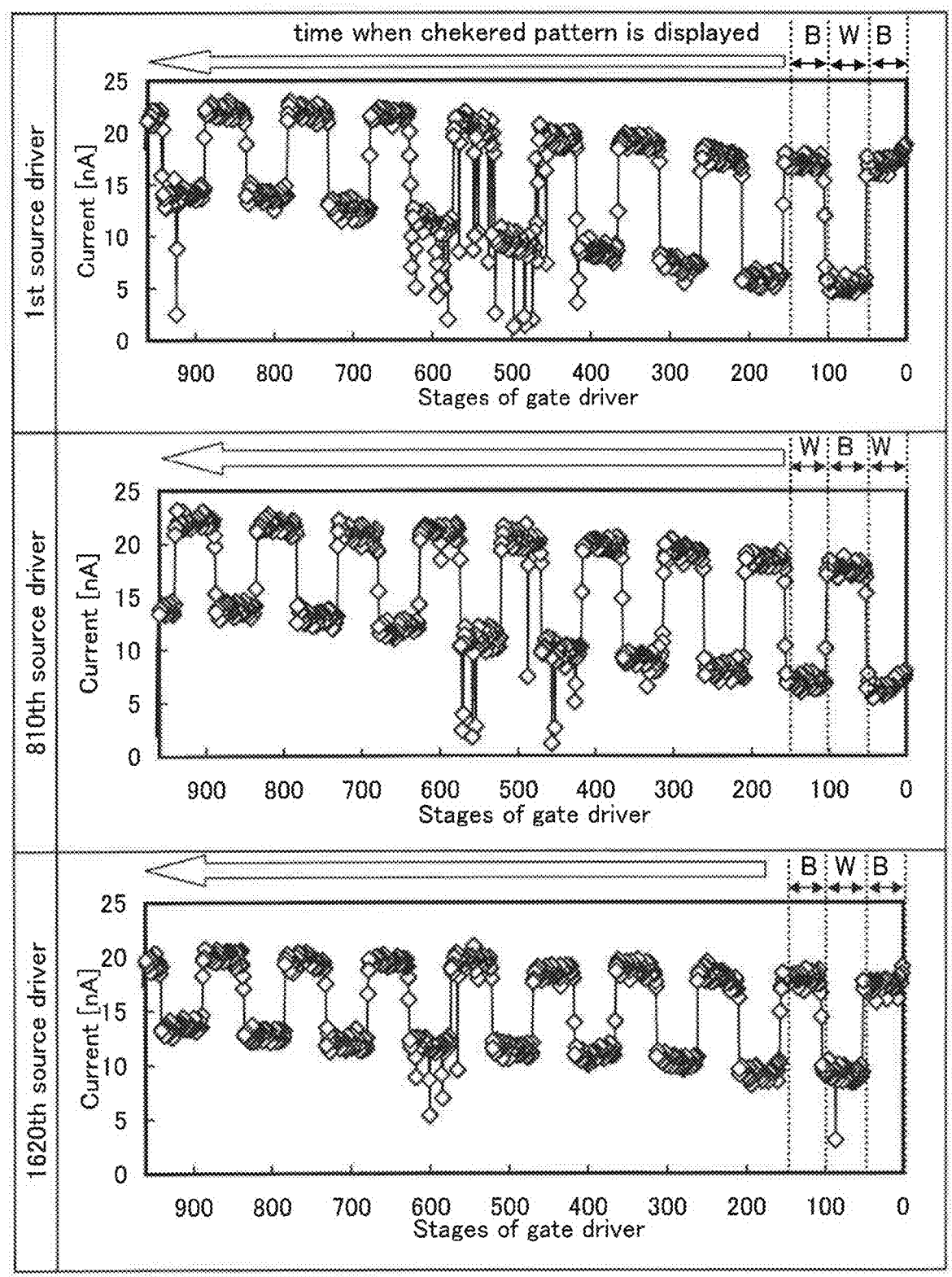
FIG. 49 is a diagram showing the results of measuring current flowing in transistors.
Figure 50:
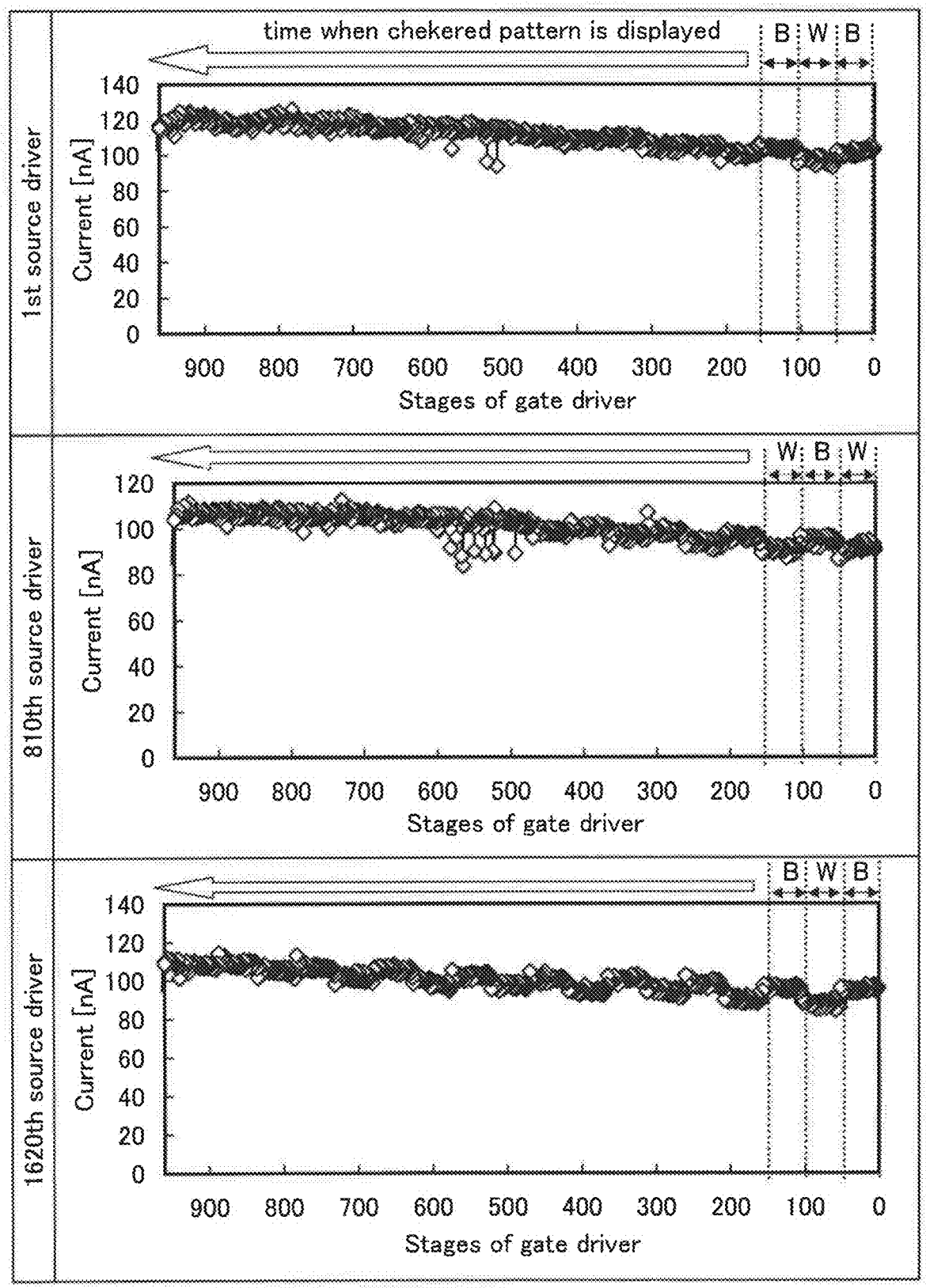
FIG. 50 is a diagram showing the results of measuring current flowing in transistors.
Figure 51:
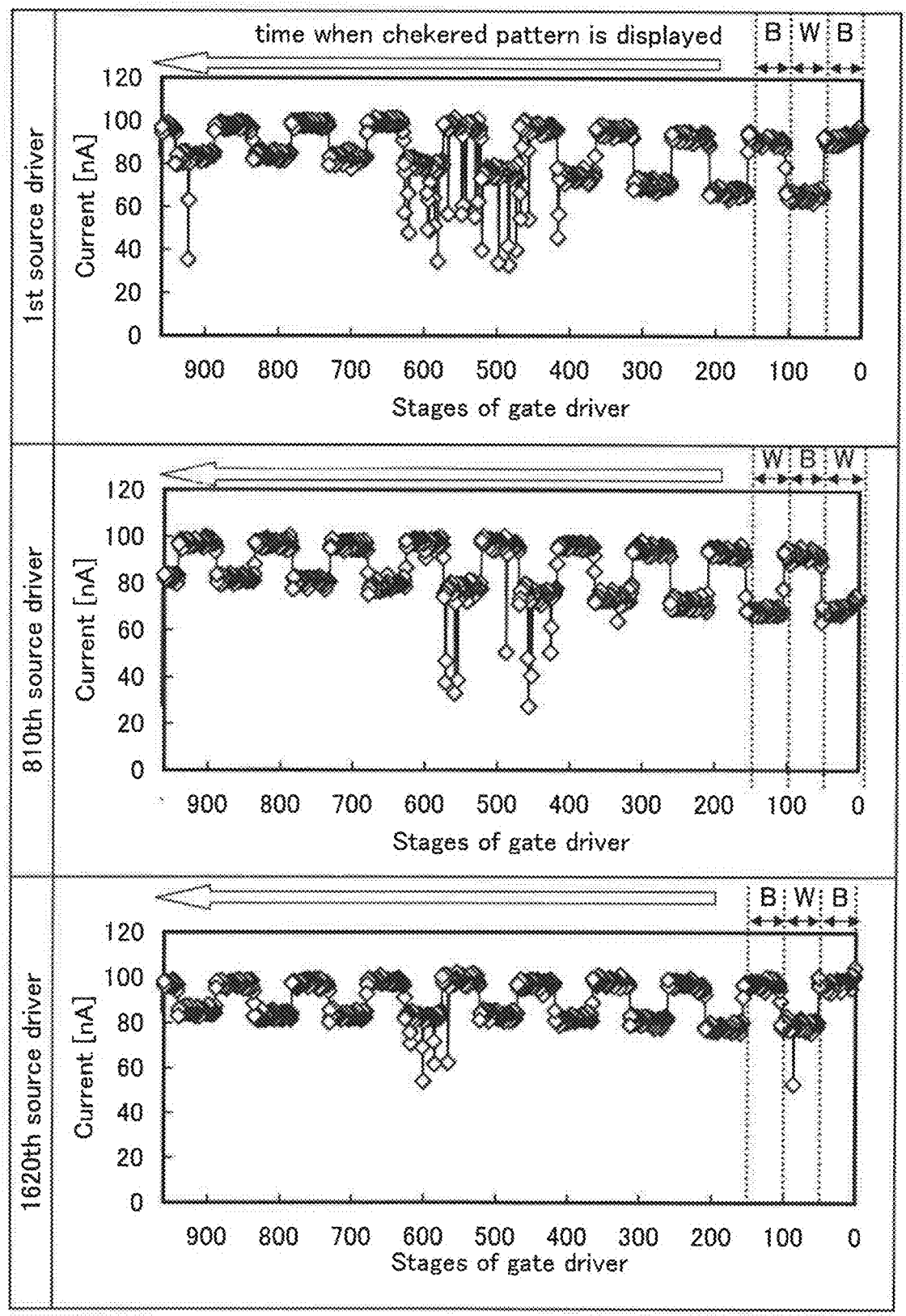
FIG. 51 is a diagram showing the results of measuring current flowing in transistors.

Data voltage at this time was set by a method similar to that described above so that luminance was equivalent to 50 cd/m$^2$ or equivalent to 300 cd/m$^2$. The results of measuring current of Sample 19 in the case where luminance was equivalent to 50 cd/m$^2$ are shown in FIG. 48, and the results of measuring current of Comparison sample 4 in that case are shown in FIG. 49. The results of measuring current of Sample 19 in the case where luminance was equivalent to 300 cd/m$^2$ are shown in FIG. 50, and the results of measuring current of Comparison sample 4 in that case are shown in FIG. 51.

In FIGS. 48 to 51, the horizontal axis indicates the number of stages of the gate driver and the vertical axis indicates current. Here, the results of measuring current of the driving transistor in each pixel in a 1st stage, an 810th stage, and a 1620th stage of the source driver are shown.

In each of Sample 19 and Comparison sample 4, an image like the one obtained by reversing the image of the previously displayed checkered pattern of black and white was observed at the time of displaying the white image on the entire area. This is probably because the characteristics of the driving transistor in a pixel located in a white portion of the checkered pattern were shifted in the positive direction while the image of the checkered pattern was displayed, and current was reduced, leading to a decrease in luminance. Therefore, when white light was emitted from the entire area after that, the pixel which had been located in the white portion of the checkered pattern probably decreased in luminance as compared to the pixel which had been located in a black portion of the checkered pattern, and thus, burning-in (or image retention) of the image of the checkered pattern seemed to occur.

The above-described burn-in (decrease of current) in Sample 19 including a transistor which is one embodiment of the present invention was reduced as compared to that in Comparison sample 4. From the above, it was shown that the electrical characteristics of the transistor can be improved in accordance with one embodiment of the present invention.

A constant-current stress test was performed on a transistor (hereinafter, referred to as Transistor a) which is one embodiment of the present invention and was used for Sample a and a transistor (hereinafter, referred to as Transistor b) which was used for Comparison sample b. The constant-current stress test was performed under an air atmosphere in a dark state (dark).

Note that the measurement of Vg-Id characteristics was performed by measuring drain current when drain voltage was set to 0.1 V or 10 V and gate voltage was swept in the range of −15 V to 15 V.

In the constant-current stress test, first, a substrate temperature was set to room temperature (20° C. to 25° C.) to perform a first measurement of Vg-Id characteristics. Then, as for Transistor a, the substrate temperature was set to 60° C., a source potential was set to a ground potential (GND), a drain potential was set to 10 V, and a gate potential was set to 6.11 V, and the state was maintained for 11 hours. As for Transistor b, the substrate temperature was set to 60° C., the source potential was set to the ground potential (GND), the drain potential was set to 10 V, and the gate potential was set to 5.63 V, and the state was maintained for 13 hours. Note that the stress application was stopped after a lapse of 100 seconds, a lapse of 300 seconds, a lapse of 600 seconds, a lapse of 1000 seconds, a lapse of 1800 seconds, a lapse of 3600 seconds, a lapse of 7200 seconds, a lapse of 10000 seconds, a lapse of 18000 seconds, a lapse of 21600 seconds, a lapse of 25200 seconds, a lapse of 28800 seconds, a lapse of 32400 seconds, a lapse of 36000 seconds, and a lapse of 39600 seconds (as for Transistor a, also after a lapse of 43200 seconds and a lapse of 46800 seconds) from the start of the constant-current stress test, and the Vg-Id characteristics after each stress time were measured at room temperature.

Figure 52:
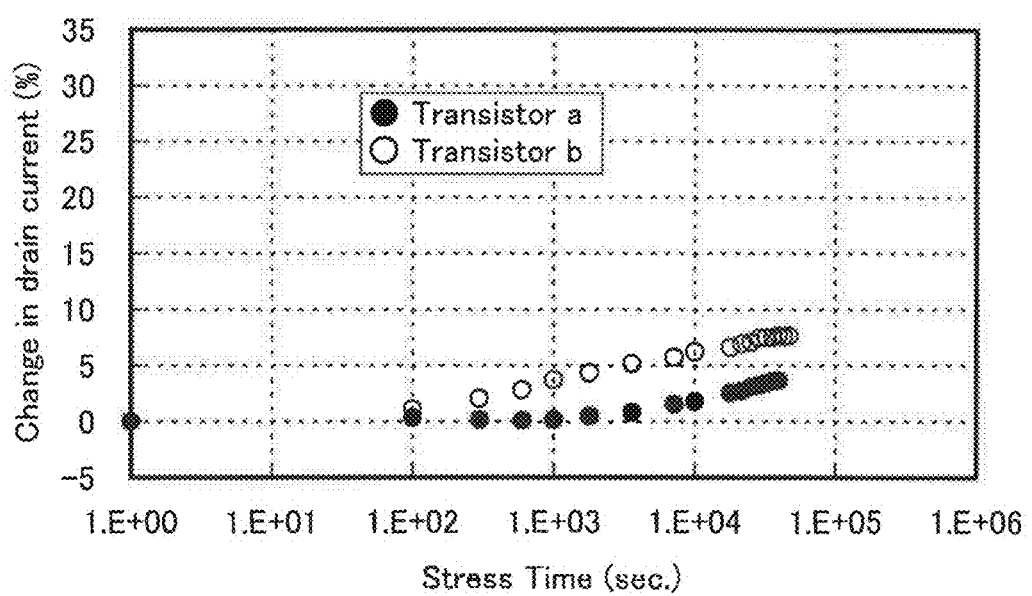
FIG. 52 is a graph showing the results of current stress tests of transistors.

In FIG. 52, the results of the constant-current stress test of Transistor a and Transistor b are shown. The vertical axis indicates the percentage of change in drain current and the horizontal axis indicates stress time in FIG. 52. From FIG. 52, it can be seen that the change in drain current of Transistor a is smaller than that of Transistor b. Also from the above, it has been shown that the electrical characteristics of a transistor can be improved in accordance with one embodiment of the present invention.

EXAMPLE 9

In this example, the results of measuring the concentration of an impurity in the oxide insulating film formed over the oxide semiconductor film are described.

First of all, a manufacturing process of a transistor included in each of Sample 20 to Sample 22 is described. In this example, the process is described with reference to FIGS. 4A to 4D.

First, a glass substrate was used as the substrate 11, and the gate electrode 15 was formed over the substrate 11.

A 100-nm-thick tungsten film was formed by a sputtering method, a mask was formed over the tungsten film by a photolithography process, and part of the tungsten film was etched with the use of the mask, so that the gate electrode 15 was formed.

Next, the gate insulating film 17 was formed over the gate electrode 15.

A 50-nm-thick silicon nitride film and a 200-nm-thick silicon oxynitride film were stacked as the gate insulating film 17.

The silicon nitride film was formed under the following conditions: silane with a flow rate of 50 sccm and nitrogen with a flow rate of 5000 sccm were supplied as source gases to a treatment chamber of a plasma CVD apparatus, the pressure in the treatment chamber was controlled to 60 Pa, and the power of 150 W was supplied with the use of a 27.12 MHz high-frequency power source.

The silicon oxynitride film was formed under the following conditions: silane with a flow rate of 20 sccm and dinitrogen monoxide with a flow rate of 3000 sccm were supplied as source gases to a treatment chamber of the plasma CVD apparatus, the pressure in the treatment chamber was controlled to 40 Pa, and the power of 100 W was supplied with the use of a 27.12 MHz high-frequency power source.

Note that each of the silicon nitride film and the silicon oxynitride film was formed at a substrate temperature of 350° C.

Next, the oxide semiconductor film was formed to overlap with the gate electrode 15 with the gate insulating film 17 provided therebetween. Note that in this example, the oxide semiconductor film 18 of a single layer was formed instead of the multilayer film 20 shown in FIG. 4B.

Here, an IGZO film which was a CAAC-OS film was formed over the gate insulating film 17 by a sputtering method, a mask is formed over the IGZO film by a photolithography process, and the IGZO film was partly etched using the mask. Then, the etched IGZO film was subjected to heat treatment, so that the oxide semiconductor film 18 was formed. Note that the IGZO film formed in this example had a thickness of 35 nm.

The IGZO film was formed under the following conditions: a sputtering target where In:Ga:Zn=1:1:1 (atomic ratio) was used, argon with a flow rate of 50 sccm and oxygen with a flow rate of 50 sccm were supplied as sputtering gases to a treatment chamber of a sputtering apparatus, the pressure in the treatment chamber was controlled to be 0.6 Pa, and the direct current power of 5 kW was supplied. Note that the IGZO film was formed at a substrate temperature of 170° C.

As the heat treatment, heat treatment was performed at 450° C. under a nitrogen atmosphere for one hour, and then, heat treatment was performed at 450° C. under an atmosphere of nitrogen and oxygen for one hour.

Next, after the gate electrode was exposed by partly etching the gate insulating film 17 (not illustrated), the pair of electrodes 21 and 22 in contact with the oxide semiconductor film 18 was formed as illustrated in FIG. 4C.

Here, a conductive film was formed over the gate insulating film 17 and the oxide semiconductor film 18, a mask was formed over the conductive film by a photolithography process, and the conductive film was partly etched using the mask, so that the pair of electrodes 21 and 22 was formed. Note that as the conductive film, a 400-nm-thick aluminum film was formed over a 50-nm-thick tungsten film, and a 100-nm-thick titanium film was formed over the aluminum film.

Next, the oxide insulating film 23 was formed over the oxide semiconductor film 18 and the pair of electrodes 21 and 22.

As the oxide insulating film 23, a silicon oxynitride film was formed by a plasma CVD method under the following conditions: silane with a flow rate of 30 sccm and dinitrogen monoxide with a flow rate of 4000 sccm were used as source gases, the pressure in a treatment chamber was 40 Pa, the substrate temperature was 220° C., and a high-frequency power of 150 W was supplied to an upper electrode of parallel plate electrodes.

Next, the oxide insulating film 24 was successively formed over the oxide insulating film 23. Here, "successively" means that, after the oxide insulating film 23 was formed, the oxide insulating film 24 was formed in the same plasma CVD apparatus without exposure to the air.

As the oxide insulating film 24, a 400-nm-thick silicon oxynitride film was formed by a plasma CVD method under the following conditions: silane with a flow rate of 160 sccm and dinitrogen monoxide with a flow rate of 4000 sccm were used as source gases, the pressure in a treatment chamber was 200 Pa, the substrate temperature was 220° C., and a high-frequency power of 1500 W was supplied to an upper electrode of parallel plate electrodes. Under the above conditions, it is possible to form a silicon oxynitride film containing more oxygen than that in the stoichiometric composition. In other words, a silicon oxynitride film from which part of oxygen is released by heating can be formed.

Next, heat treatment was performed. The heat treatment was performed at 350° C. in an atmosphere containing oxygen and nitrogen for one hour.

Through the above process, Sample 20 including a transistor was formed.

Note that Sample 21 was manufactured under conditions where the oxide insulating film 23 was not formed in the manufacturing process of Sample 20.

Further, a sample in which the film formation temperature of the oxide insulating film 24 was set to 350° C. and the oxide insulating film 23 and the oxide insulating film 24 were formed in different plasma CVD apparatuses in the manufacturing process of Sample 20 is referred to as Sample 22. That is, Sample 22 was exposed to the air after the oxide insulating film 23 was formed.

Figure 53A:
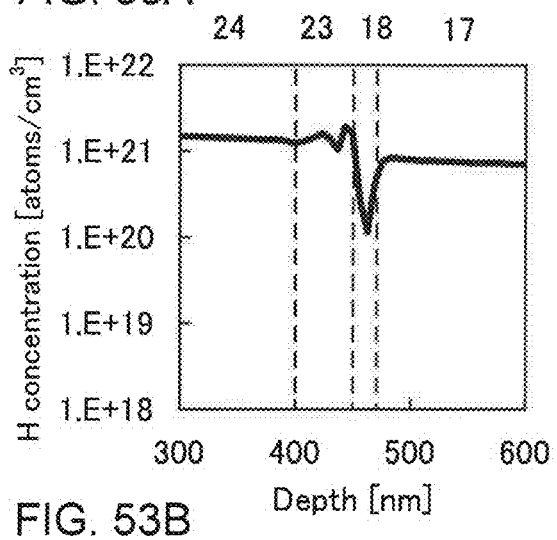
FIGS. 53A to 53F are graphs showing the results of SIMS measurement in samples.
Figure 53D:
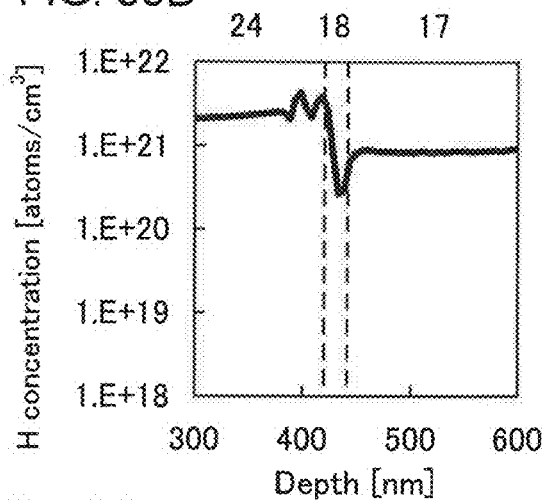
Figure 53B:
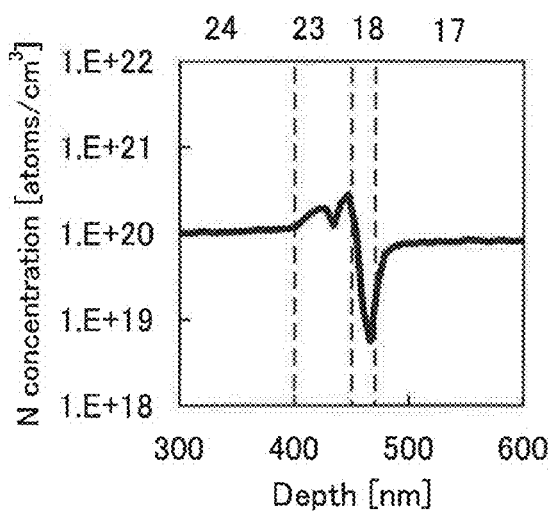
Figure 53E:
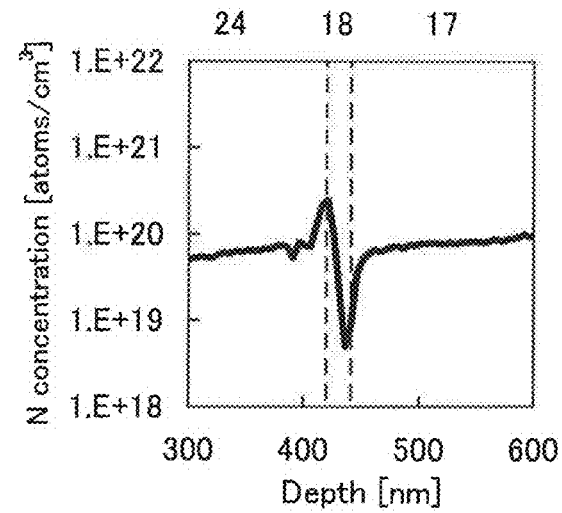
Figure 53C:
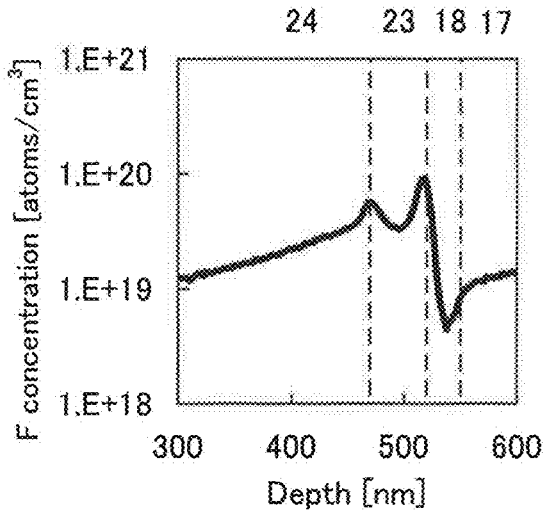
Figure 53F:
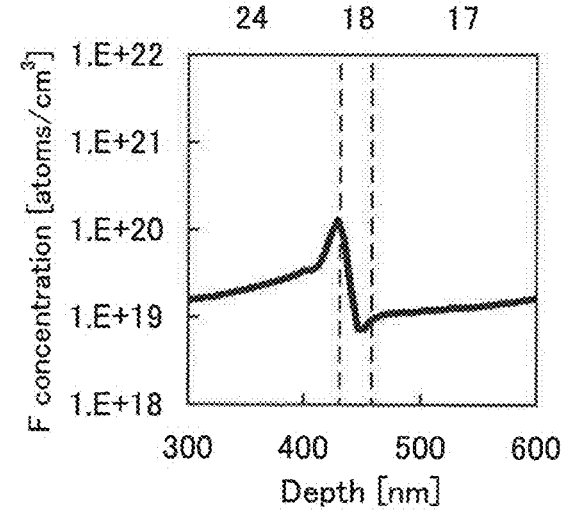
Figure 54A:
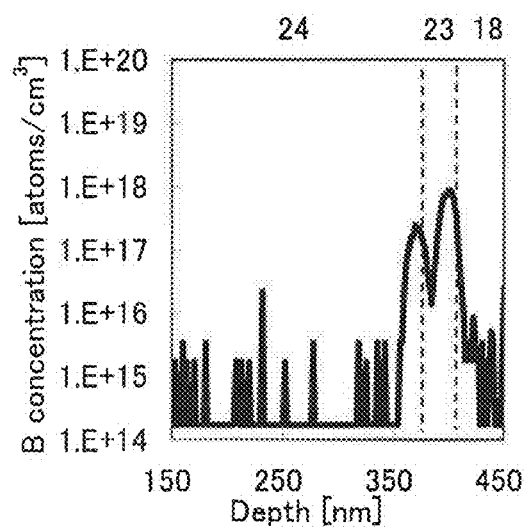
FIGS. 54A and 54B are graphs showing the results of SIMS measurement in samples.
Figure 54B:
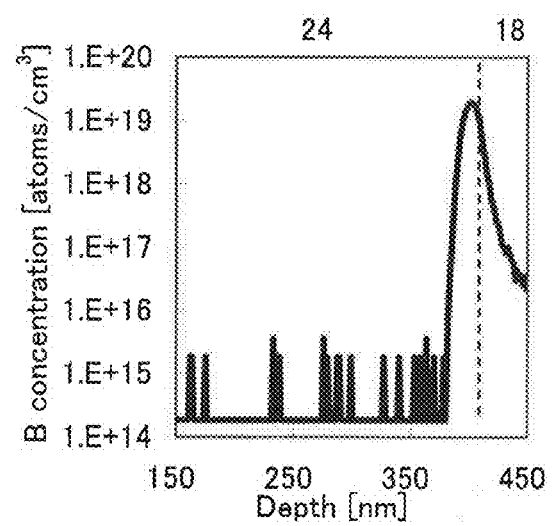

Next, Sample 20 to Sample 22 were measured by SIMS. FIG. 53A, FIG. 53B, and FIG. 53C show the concentration of hydrogen, the concentration of nitrogen, and the concentration of fluorine, respectively, in the oxide insulating film 23 and the oxide insulating film 24 in Sample 20. Further, FIG. 53D, FIG. 53E, and FIG. 53F show the concentration of hydrogen, the concentration of nitrogen, and the concentration of fluorine, respectively, in the oxide insulating film 24 in Sample 21. Furthermore, FIG. 54A shows the concentration of boron in the oxide insulating film 23 and the oxide insulating film 24 in Sample 22, and FIG. 54B shows the concentration of boron in the oxide insulating film 24 in Sample 21. In each of FIGS. 53A to 53F and FIGS. 54A and 54B, the horizontal axis indicates the depth from the surface of each sample and the vertical axis indicates the concentration of each element.

In Sample 20, the concentration of hydrogen and the concentration of nitrogen are not changed at the interface between the oxide insulating film 23 and the oxide insulating film 24. On the other hand, the concentration of fluorine has a peak at the interface between the oxide insulating film 23 and the oxide insulating film 24. From the following description, the concentration of fluorine has a peak at the above interface. After the oxide insulating film 23 was formed, the power of a plasma CVD apparatus was cut. Next, after the flow rate of a source gas introduced into a treatment chamber and the pressure in the treatment chamber were changed, power was resupplied to the plasma CVD apparatus to form the oxide insulating film 24. After the oxide insulating film 23 was formed, the surface of the oxide insulating film 23 was exposed to the atmosphere in the treatment chamber until the oxide insulating film 24 was formed.

On the inner wall of the treatment chamber, fluorine or $NF_3$ which was used in cleaning of the treatment chamber was attached, and the fluorine or $NF_3$ released from the inner wall of the treatment chamber was attached to the surface of the oxide insulating film 23 while the oxide insulating film 24 was formed just after the oxide insulating film 23 was formed. Therefore, the concentration of fluorine is increased at the interface between the oxide insulating film 23 and the oxide insulating film 24 and thus has a peak.

Note that since only a single layer of the oxide insulating film 24 is provided over the oxide semiconductor film 18 in Sample 21, the concentration of fluorine in the oxide insulating film 24 does not have a peak as shown in FIG. 53F.

Further, as shown in FIGS. 54A and 54B, the concentration of boron has a peak at the interface between the oxide semiconductor film 18 and the oxide insulating film 23 and at the interface between the oxide insulating film 23 and the oxide insulating film 24 in Sample 22. On the other hand, the concentration of boron has a peak at the interface between the oxide semiconductor film 18 and the oxide insulating film 24 in Sample 21. It is probable that boron released from a HEPA filter in an air conditioning apparatus is adsorbed to the sample when the sample is exposed to an air atmosphere, resulting in the concentration having such a peak. Thus, it can be determined that a plurality of insulating films is stacked in different treatment chambers when a plurality of peaks in the concentration of boron is shown in the oxide semiconductor film and the oxide insulating films.

From the above, a state of stacking of oxide insulating films can be examined by measuring an impurity concentration in the oxide insulating films over the oxide semiconductor film by SIMS.

This application is based on Japanese Patent Application serial No. 2012-234602 filed with Japan Patent Office on Oct. 24, 2012, Japanese Patent Application serial No. 2012-234606 filed with Japan Patent Office on Oct. 24, 2012, Japanese Patent Application serial No. 2012-286826 filed with Japan Patent Office on Dec. 28, 2012, and Japanese Patent Application serial No. 2013-051659 filed with Japan Patent Office on Mar. 14, 2013, the entire contents of which are hereby incorporated by reference.

What is claimed is:

1. A semiconductor device comprising a transistor, the transistor comprising:
   a gate electrode over a substrate;
   a gate insulating film over the gate electrode;
   an oxide semiconductor film over the gate insulating film;
   an oxide film over and in contact with the oxide semiconductor film;
   a pair of electrodes over and in contact with the oxide film;
   a first oxide insulating film over the pair of electrodes; and
   a second oxide insulating film over the first oxide insulating film,
   wherein each of the oxide semiconductor film and the oxide film comprise In, Ga and Zn,
   wherein the oxide semiconductor film has an atomic ratio of In:Ga:Zn=$x_2$:$y_2$:$z_2$,
   wherein the oxide film has an atomic ratio of In:Ga:Zn=$x_1$:$y_1$:$z_1$,
   wherein $y_1/x_1$ is higher than $y_2/x_2$, and
   wherein a threshold voltage of the transistor changes in a negative direction or a positive direction, and an amount of change is less than or equal to 1.0 V.

2. The semiconductor device according to claim 1, wherein the first oxide insulating film is an oxide insulating film through which oxygen is permeated.

3. The semiconductor device according to claim 1, wherein the second oxide insulating film is an oxide insulating film containing more oxygen than that in a stoichiometric composition.

4. The semiconductor device according to claim 1, wherein $y_1/x_1$ is three or more times as high as $y_2/x_2$.

5. The semiconductor device according to claim 1, wherein a conduction band bottom of the oxide film is closer to a vacuum level than a conduction band bottom of the oxide semiconductor film is.

6. The semiconductor device according to claim 5, wherein an energy difference between the conduction band bottom of the oxide film and the conduction band bottom of the oxide semiconductor film is greater than or equal to 0.05 eV and less than or equal to 2 eV.

7. The semiconductor device according to claim 1, wherein a concentration of silicon between the oxide semiconductor film and the oxide film is lower than $2\times10^{18}$ atoms/cm$^3$.

8. A semiconductor device comprising a transistor, the transistor comprising:
   a gate electrode over a substrate;
   a gate insulating film over the gate electrode;
   an oxide semiconductor film over the gate insulating film;
   an oxide film over and in contact with the oxide semiconductor film;
   a pair of electrodes over and in contact with the oxide film;
   a first oxide insulating film over the pair of electrodes; and
   a second oxide insulating film over the first oxide insulating film,
   wherein each of the oxide semiconductor film and the oxide film comprise In, Ga and Zn,
   wherein the oxide semiconductor film has an atomic ratio of In:Ga:Zn=$x_2$:$y_2$:$z_2$, wherein the oxide film has an atomic ratio of In:Ga:Zn=$x_1$:$y_1$:$z_1$, and wherein $y_1/x_1$ is higher than $y_2/x_2$.

9. The semiconductor device according to claim 8, wherein the first oxide insulating film is an oxide insulating film through which oxygen is permeated.

10. The semiconductor device according to claim 8, wherein the second oxide insulating film is an oxide insulating film containing more oxygen than that in a stoichiometric composition.

11. The semiconductor device according to claim 8, wherein $y_1/x_1$ is three or more times as high as $y_2/x_2$.

12. The semiconductor device according to claim 8, wherein a conduction band bottom of the oxide film is closer to a vacuum level than a conduction band bottom of the oxide semiconductor film is.

13. The semiconductor device according to claim 12, wherein an energy difference between the conduction band bottom of the oxide film and the conduction band bottom of the oxide semiconductor film is greater than or equal to 0.05 eV and less than or equal to 2 eV.

14. The semiconductor device according to claim 8, wherein a concentration of silicon between the oxide semiconductor film and the oxide film is lower than $2 \times 10^{18}$ atoms/cm$^3$.

* * * * *